United States Patent
Choi et al.

(10) Patent No.: US 11,557,731 B2
(45) Date of Patent: Jan. 17, 2023

(54) ORGANIC LIGHT EMITTING DIODE HAVING N-TYPE HOST WITH NARROW BAND GAP AND ORGANIC LIGHT EMITTING DISPLAY DEVICE INCLUDING THE SAME

(71) Applicants: LG Display Co., Ltd., Seoul (KR); Soulbrain Co., Ltd., Seongnam-si (KR)

(72) Inventors: Hyong-Jong Choi, Paju-si (KR); Tae-Ryang Hong, Paju-si (KR); Jun-Yun Kim, Paju-si (KR); Jin Hee Kim, Paju-si (KR); Ah-Rang Lee, Paju-si (KR)

(73) Assignees: LG DISPLAY CO., LTD., Seoul (KR); SOULBRAIN CO., LTD., Seongnam-si (KR)

(*) Notice: Subject to any disclaimer, the term of this patent is extended or adjusted under 35 U.S.C. 154(b) by 422 days.

(21) Appl. No.: 16/728,273

(22) Filed: Dec. 27, 2019

(65) Prior Publication Data
US 2020/0212309 A1 Jul. 2, 2020

(30) Foreign Application Priority Data
Dec. 27, 2018 (KR) .......... 10-2018-0170830

(51) Int. Cl.
*H01L 51/00* (2006.01)
*C09K 11/06* (2006.01)
(Continued)

(52) U.S. Cl.
CPC .......... *H01L 51/0067* (2013.01); *C09K 11/06* (2013.01); *H01L 51/0072* (2013.01);
(Continued)

(58) Field of Classification Search
CPC ............ H01L 51/0067; H01L 51/0072; H01L 51/0085; C09K 11/06
See application file for complete search history.

(56) References Cited

U.S. PATENT DOCUMENTS

2014/0070196 A1* 3/2014 Kim .................. H01L 51/504
257/40
2018/0130953 A1 5/2018 Song et al.
(Continued)

FOREIGN PATENT DOCUMENTS

CN 102655222 A 9/2012
CN 102881833 A 1/2013
(Continued)

OTHER PUBLICATIONS

Zhang, Dongdong, et al. "Simultaneous enhancement of efficiency and stability of phosphorescent OLEDs based on efficient Forster energy transfer from interface exciplex." ACS Applied Materials & Interfaces 8.6 (2016): 3825-3832. (Year: 2016).*
(Continued)

*Primary Examiner* — Michael Jung
(74) *Attorney, Agent, or Firm* — Birch, Stewart, Kolasch & Birch, LLP

(57) ABSTRACT

The present disclosure provides an organic light emitting diode comprising a first electrode; a second electrode facing the first electrode; and an emitting material layer. The emitting material layer includes a p-type host, a n-type host and a phosphorescent dopant and positioned between the first electrode and the second electrode, wherein a first energy level of a HOMO of the p-type host is equal to or lower than a second energy level of a HOMO of the n-type host, and a difference between an energy level of a singlet
(Continued)

state of the n-type host and an energy level of a triplet state of the n-type host is greater than 0.3 eV and smaller than 0.5 eV.

18 Claims, 7 Drawing Sheets

(51) Int. Cl.
  *H01L 27/32* (2006.01)
  *H01L 51/50* (2006.01)

(52) U.S. Cl.
  CPC .. *H01L 51/0085* (2013.01); *C09K 2211/1029* (2013.01); *C09K 2211/185* (2013.01); *H01L 27/3244* (2013.01); *H01L 51/5004* (2013.01); *H01L 51/5016* (2013.01); *H01L 2251/552* (2013.01)

(56) References Cited

U.S. PATENT DOCUMENTS

| | | | |
|---|---|---|---|
| 2018/0375053 A1* | 12/2018 | Duan | H01L 51/5016 |
| 2019/0019971 A1* | 1/2019 | Xie | C09K 11/06 |
| 2020/0006687 A1* | 1/2020 | Inoue | H01L 51/5004 |

FOREIGN PATENT DOCUMENTS

| | | |
|---|---|---|
| CN | 105001229 A | 10/2015 |
| CN | 106328816 A | 1/2017 |
| JP | 2009-267255 A | 11/2009 |
| KR | 10-2016-0022724 A | 3/2016 |

OTHER PUBLICATIONS

Zhang et al., "Simultaneous Enhancement of Efficiency and Stability of Phosphorescent OLEDs Based on Efficient Forster Energy Transfer from Interface Exciplex." ACS Appl, Mater. Interfaces, 2016, vol. 8. No. 6, pp. 3825-3832.

* cited by examiner

ORGANIC LIGHT EMITTING DIODE HAVING N-TYPE HOST WITH NARROW BAND GAP AND ORGANIC LIGHT EMITTING DISPLAY DEVICE INCLUDING THE SAME

CROSS-REFERENCE TO RELATED APPLICATIONS

The present application claims the benefit of Korean Patent Application No. 10-2018-0170830 filed in the Republic of Korea on Dec. 27, 2018, which is hereby incorporated by reference in its entirety.

BACKGROUND

Field of Technology

The present disclosure relates to an organic light emitting diode, and more particularly, to an organic light emitting diode (OLED) having high emitting efficiency and long lifespan, and an organic light emitting display device including the OLED.

Discussion of the Related Art

Recently, a need for flat panel display devices having small occupied area has increased. Among the flat panel display devices, a technology of an organic light emitting display device, which includes an OLED, is being rapidly developed.

The OLED emits light by injecting electrons from a cathode as an electron injection electrode and holes from an anode as a hole injection electrode into an organic emitting layer, combining the electrons with the holes, generating an exciton, and transforming the exciton from an excited state to a ground state. A flexible transparent substrate, for example, a plastic substrate, can be used as a base substrate where elements are formed. In addition, the OLED can be operated at a voltage (e.g., 10V or below) lower than a voltage required to operate other display devices and has low power consumption. Moreover, the light from the OLED has excellent color purity.

The OLED includes a first electrode as an anode, a second electrode as a cathode facing the first electrode, and an organic emitting layer between the first and second electrodes.

An emitting material layer in the organic emitting layer includes a host and a dopant. In addition, to increase a charge balance of a hole and an electron in the emitting material layer and an emitting efficiency of the OLED, an emitting system using a p-type host, an n-type host and a phosphorescent dopant is introduced. However, the lifespan of the OLED including the above emitting system is significantly decreased.

SUMMARY

The present invention is directed an OLED and an organic light emitting display device that substantially obviate one or more of the problems associated with the limitations and disadvantages of the related art.

Additional features and advantages of the invention are set forth in the description which follows, and will be apparent from the description, or evident by practice of the invention. The objectives and other advantages of the invention are realized and attained by the features described herein as well as in the appended drawings.

To achieve these and other advantages in accordance with the purpose of the embodiments of the invention, as described herein, an aspect of the present disclosure is an organic light emitting diode comprising a first electrode; a second electrode facing the first electrode; and an emitting material layer including a p-type host, a n-type host and a phosphorescent dopant and positioned between the first electrode and the second electrode, wherein a first energy level of a highest occupied molecular orbital (HOMO) of the p-type host is equal to or lower than a second energy level of the HOMO of the n-type host, and a difference between an energy level of a singlet state of the n-type host and an energy level of a triplet state of the n-type host is greater than 0.3 eV and smaller than 0.5 eV.

Another aspect of the present disclosure is an organic light emitting display device comprising a substrate; and an organic light emitting diode on the substrate and including a first electrode, a second electrode facing the first electrode, and an emitting material layer including a p-type host, a n-type host and a phosphorescent dopant and positioned between the first electrode and the second electrode, wherein a first energy level of a HOMO of the p-type host is equal to or lower than a second energy level of the HOMO of the n-type host, and a difference between an energy level of a singlet state of the n-type host and an energy level of a triplet state of the n-type host is greater than 0.3 eV and smaller than 0.5 eV.

It is to be understood that both the foregoing general description and the following detailed description are exemplary and explanatory and are intended to further explain the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to some of the examples and preferred embodiments, which are illustrated in the accompanying drawings.

Figure 1:
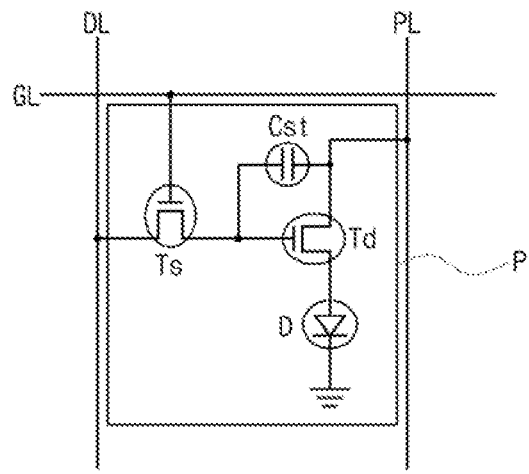
FIG. 1 is a schematic circuit diagram of an organic light emitting display device according to one or more embodiments of the present disclosure.

FIG. 1 is a schematic circuit diagram of an organic light emitting display device according to one or more embodiments of the present disclosure.

As shown in FIG. 1, the organic light emitting display device includes a gate line GL, a data line DL, a power line PL, a switching thin film transistor TFT Ts, a driving TFT Td, a storage capacitor Cst, and an OLED D. The gate line GL and the data line DL cross each other to define a pixel region P. The pixel region P may include a red pixel region, a green pixel region and a blue pixel region.

The switching TFT Ts is connected to the gate line GL and the data line DL, and the driving TFT Td and the storage capacitor Cst are connected to the switching TFT Ts and the power line PL. The OLED D is connected to the driving TFT Td.

In the organic light emitting display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the OLED D from the power line PL. As a result, the OLED D emits light. In this case, when the driving TFT Td is turned on, a level of an electric current applied from the power line PL to the OLED D is determined such that the OLED D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the OLED D is maintained to next frame.

As a result, the organic light emitting display device displays a desired image.

Figure 2:
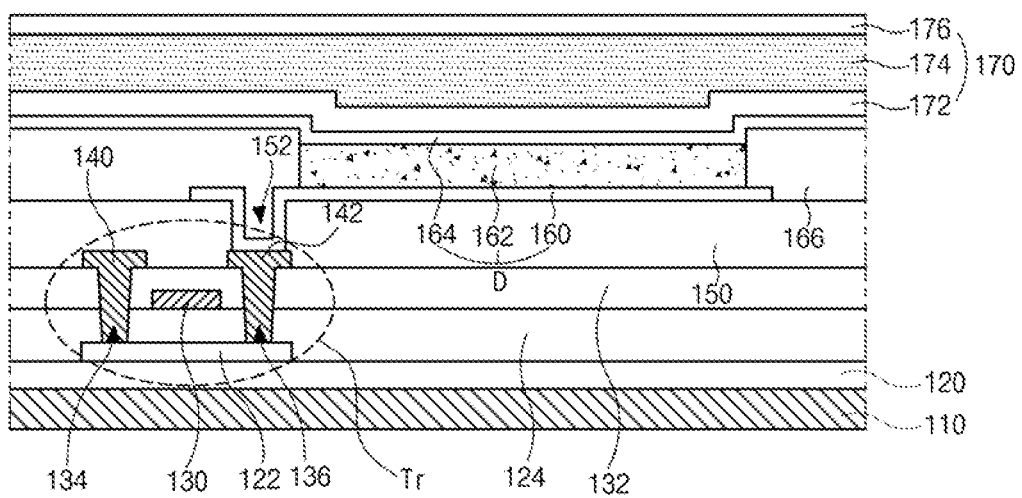
FIG. 2 is a schematic cross-sectional view of an organic light emitting display device according to an embodiment of the present disclosure.

FIG. 2 is a schematic cross-sectional view of an organic light emitting display device 100 of the present disclosure. The device 100 can be the same as the organic light emitting display device of FIG. 1.

As shown in FIG. 2, the organic light emitting display device 100 includes a substrate 110, a TFT Tr and an OLED D connected to the TFT Tr.

The substrate 110 may be a glass substrate or a plastic substrate. For example, the substrate 110 may be a polyimide substrate.

A buffer layer 120 is formed on the substrate, and the TFT Tr is formed on the buffer layer 120. The buffer layer 120 may be omitted.

A semiconductor layer 122 is formed on the buffer layer 120. The semiconductor layer 122 may include an oxide semiconductor material or polycrystalline silicon.

When the semiconductor layer 122 includes the oxide semiconductor material, a light-shielding pattern may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 122.

In FIG. 2, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 140 and a drain electrode 142, which are formed of a conductive material, e.g., metal, are formed on the interlayer insulating layer 132.

The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr. The TFT Tr serves as a driving element.

In the TFT Tr, the gate electrode 130, the source electrode 140, and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel region, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel region. The first electrode 160 may be an anode and may be formed of a conductive material having a relatively high work function. For example, the first electrode 160 may be formed of a transparent conductive material such as indium-tin-oxide (ITO) or indium-zinc-oxide (IZO).

When the organic light emitting display device 100 is operated in a top-emission type, a reflection electrode or a reflection layer may be formed under the first electrode 160. For example, the reflection electrode or the reflection layer may be formed of aluminum-palladium-copper (APC) alloy.

A bank layer 166 is formed on the passivation layer 150 to cover an edge of the first electrode 160. Namely, the bank layer 166 is positioned at a boundary of the pixel region and exposes a center of the first electrode 160 in the pixel region.

An organic emitting layer 162 is formed on the first electrode 160. The organic emitting layer 162 may have a single-layered structure of an emitting material layer including an emitting material. To increase an emitting efficiency of the organic light emitting display device, the organic emitting layer 162 may have a multi-layered structure.

The organic emitting layer 162 is positioned in a red pixel region, a green pixel region and a blue pixel region. As described below, the organic emitting layer 162 in the green pixel region includes a p-type host, an n-type host as a delayed fluorescent compound and a phosphorescent dopant. As a result, the emitting efficiency and the lifespan of the OLED D in the green pixel region are improved.

A second electrode 164 is formed over the substrate 110 where the organic emitting layer 162 is formed. The second electrode 164 covers an entire surface of the display area and may be formed of a conductive material having a relatively low work function to serve as a cathode. For example, the second electrode 164 may be formed of aluminum (Al), magnesium (Mg) or Al—Mg alloy.

The first electrode 160, the organic emitting layer 162 and the second electrode 164 constitute the OLED D.

An encapsulation film 170 is formed on the second electrode 164 to prevent penetration of moisture into the OLED D. The encapsulation film 170 includes a first inorganic insulating layer 172, an organic insulating layer 174 and a second inorganic insulating layer 176 sequentially stacked, but it is not limited thereto. The encapsulation film 170 may be omitted.

A polarization plate for reducing an ambient light reflection may be disposed over the top-emission type OLED D. For example, the polarization plate may be a circular polarization plate.

In addition, a cover window may be attached to the encapsulation film 170 or the polarization plate. In this instance, the substrate 110 and the cover window have a flexible property such that a flexible organic light emitting display device may be provided.

Figure 3:
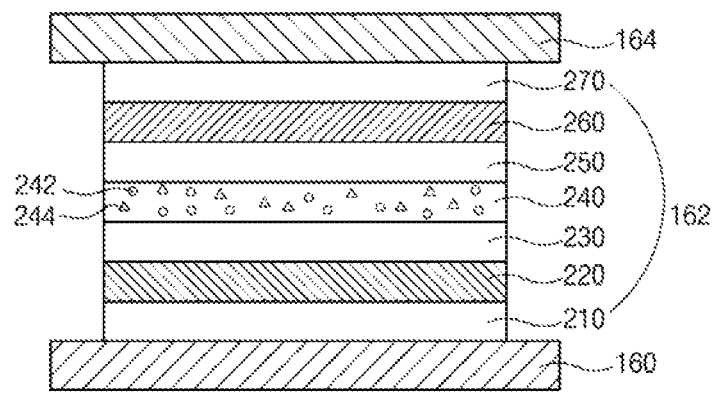
FIG. 3 is a schematic cross-sectional view of an OLED according to an example of the present disclosure.

FIG. 3 is a schematic cross-sectional view of an OLED of the present disclosure. The OLED of FIG. 3 can be the OLED shown in FIG. 1 and/or 2.

As shown in FIG. 3, the OLED D includes the first and second substrates 160 and 164, which face each other, and the organic emitting layer 162 therebetween. The organic emitting layer 162 includes an emitting material layer (EML) 240 between the first and second electrodes 160 and 164, a hole transporting layer (HTL) 220 between the first electrode 160 and the EML 240 and an electron transporting layer (ETL) 260 between the second electrode 164 and the EML 240.

The first electrode 160 includes a conductive material having a relatively high work function to serve as an anode.

The second electrode 164 includes a conductive material having a relatively low work function to serve as a cathode.

In addition, the organic emitting layer 162 may further include a hole injection layer (HIL) 210 between the first electrode 160 and the HTL 220 and an electron injection layer (EIL) 270 between the second electrode 164 and the ETL 260.

Moreover, the organic emitting layer 162 may further include an electron blocking layer (EBL) 230 between the HTL 220 and the EML 240 and a hole blocking layer (HBL) 250 between the EML 240 and the ETL 260.

The organic emitting layer 162, preferably the EML 240 includes a p-type host 242, an n-type host 244 and a phosphorescent dopant and emits green light.

The p-type host 242 has a first highest occupied molecular orbital (HOMO) level (HOMO$_{PH}$), and the n-type host 244 has a second HOMO level (HOMO$_{NTH}$) being equal to or smaller than the first HOMO level. The p-type host 242 has a first lowest unoccupied molecular orbital (LUMO) level (LUMO$_{PH}$), and the n-type host 244 has a second LUMO level (LUMO$_{NTH}$) being greater than the first LUMO level. (|HOMO$_{PH}$|≥|HOMO$_{NTH}$|, |LUMO$_{NTH}$|>|LUMO$_{PH}$|)

Namely, the first HOMO level of the p-type host 242 is equal to or lower than the second HOMO level of the n-type host 244. The first LUMO level of the p-type host 242 is higher than the second LUMO level of the n-type host 244. For example, the first HOMO level of the p-type host 242 may be lower than the second HOMO level of the n-type host 244, and the first LUMO level of the p-type host 242 may be higher than the second LUMO level of the n-type host 244.

The phosphorescent dopant has a third HOMO level (HOMO$_{PD}$) being equal to or smaller than the second HOMO level and a third LUMO level (LUMO$_{PD}$) being greater than the first LUMO level and being smaller than the third LUMO level. (|HOMO$_{PH}$|≥|HOMO$_{NTH}$|≥|HOMO$_{PD}$|, |LUMO$_{NTH}$|>|LUMO$_{PD}$|>|LUMO$_{PH}$|)

Namely, the third LUMO level of the phosphorescent dopant is lower than the first LUMO level and higher than the second LUMO level, and the third HOMO level of the phosphorescent dopant is equal to or higher than the second HOMO level.

Figure 4:
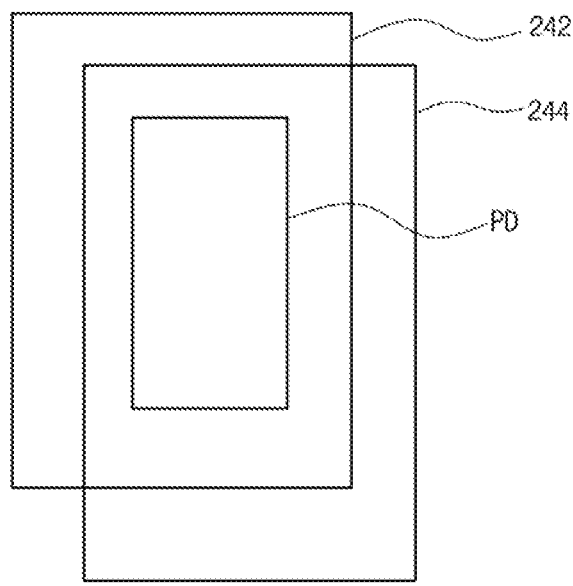
FIG. 4 is a schematic view illustrating an energy band diagram in an emitting material layer of a related art OLED.

Referring to FIG. 4, which is a schematic view illustrating an energy band diagram in an emitting material layer of the related art OLED, the n-type host 244 has wide energy band gap. Namely, the HOMO level is lower than the HOMO level of the p-type host 242 such that the hole is transferred to the phosphorescent dopant PD through the n-type host 244. As a result, the triplet excitons are over-presented in the phosphorescent dopant PD such that a quenching problem between the triplet exciton and the polaron is generated.

Figure 5:
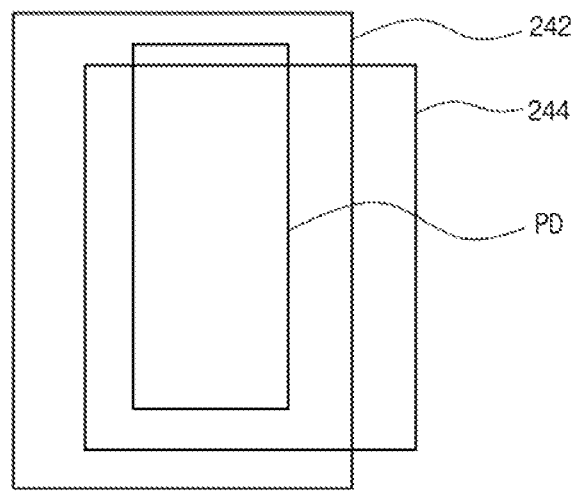
FIG. 5 is a schematic view illustrating an energy band diagram in an emitting material layer of an OLED according to an example of the present disclosure.

However, referring to FIG. 5, which is a schematic view illustrating an energy band diagram in an emitting material layer of an OLED of the present disclosure, the n-type host 244 has narrow energy band gap, and the HOMO level of the n-type host 244 is higher than the that of the p-type host 242. As a result, the above problem is prevented or effectively addressed.

In addition, in the present disclosure, a difference ($\Delta E_{ST}$) between the energy level of the singlet state of the n-type host 244 and the energy level of the triplet state of the n-type host 244 is larger than 0.3 eV and smaller than 0.5 eV. ($0.3 < \Delta E_{ST} < 0.5$) The n-type host 244 has a delayed fluorescent property and satisfies the above condition between the energy level of the singlet state and the energy level of the triplet state, i.e., $0.3<\Delta E_{ST}<0.5$, the emitting efficiency and the lifespan of the OLED D are further improved.

For example, the p-type host 242 may be represented by Formula 1-1 or Formula 1-2.

[Formula 1-1]

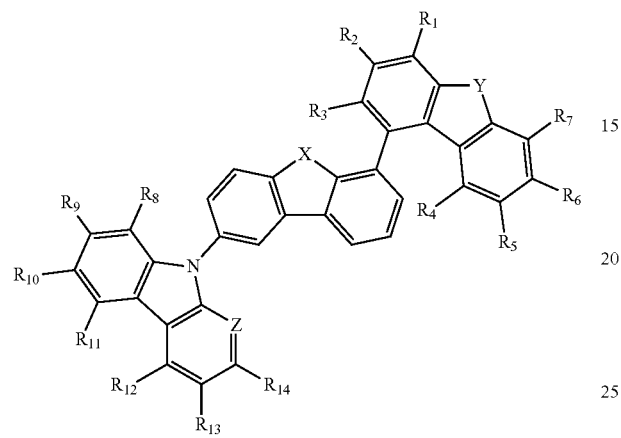

[Formula 1-2]

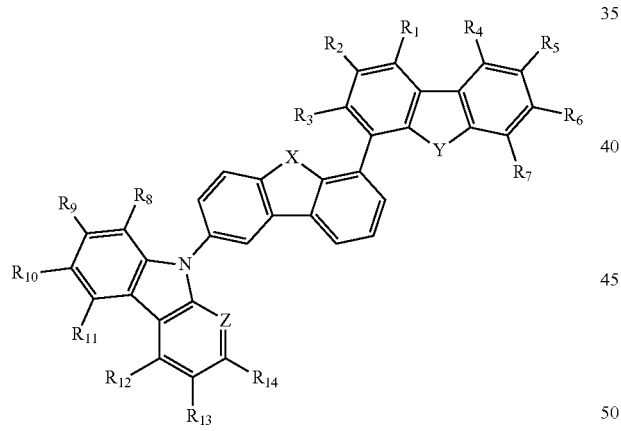

For example, the p-type host 242 may be one of Formula 2.

[Formula 2]

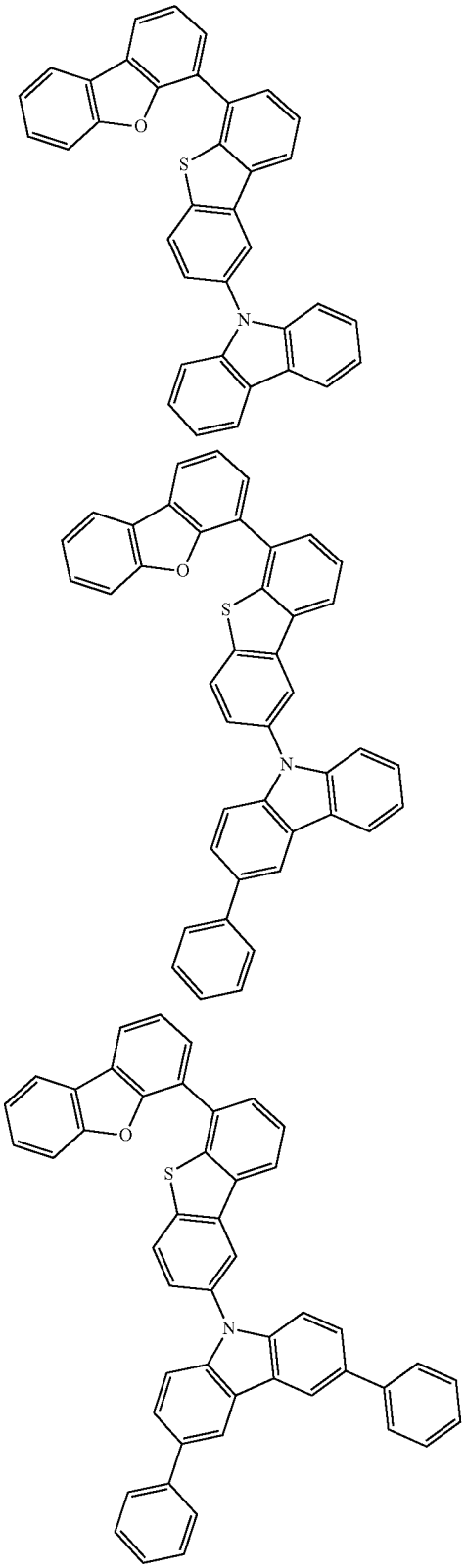

In Formulas 1-1 and 1-2, each of X and Y is independently selected from the group consisting of oxygen and sulfur, and Z is N or $CR_{15}$. Each of $R_1$ to $R_{15}$ is independently selected from the group consisting of hydrogen (protium), deuterium, alkylsilyl, arylsilyl, C1 to C10 alkyl, C1 to C10 alkoxy, C6 to C30 aryl, C5 to C30 heteroaryl, alkylamine, heteroarylamine and arylamine. Adjacent two of $R_1$ to $R_{15}$ may form a fused ring.

As shown in Formulas 1-1 and 1-2, a 1st-position of a heteroaryl moiety including X is combined (or bonded) to a 1st-position or a 4th-position of a heteroaryl moiety including Y such that a triplet energy level of the p-type host 242 is increased. Accordingly, the emitting efficiency and the lifespan of the OLED D are improved.

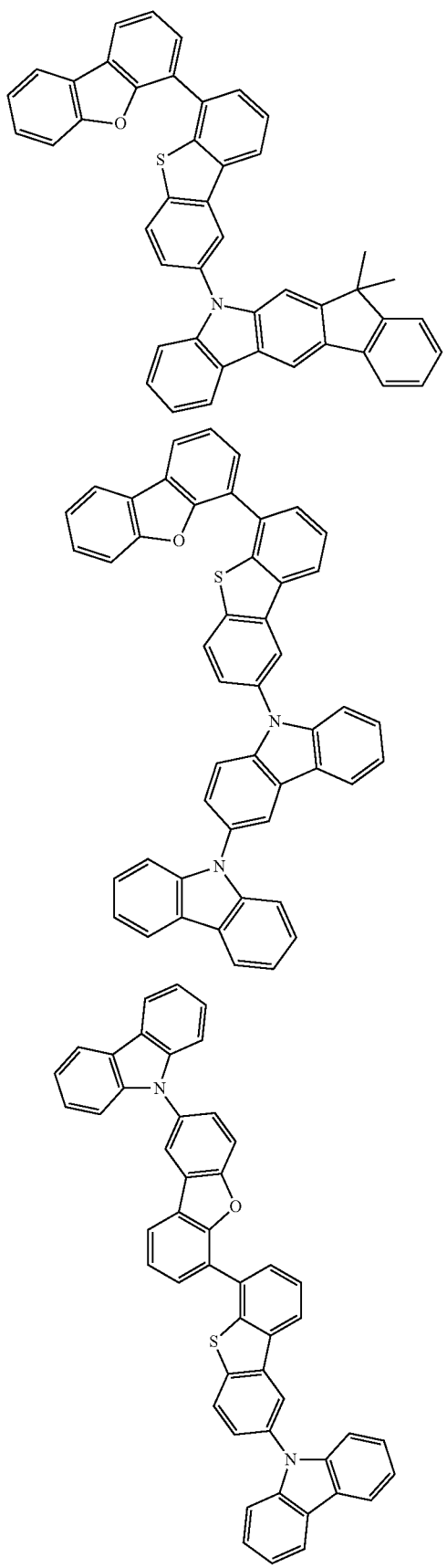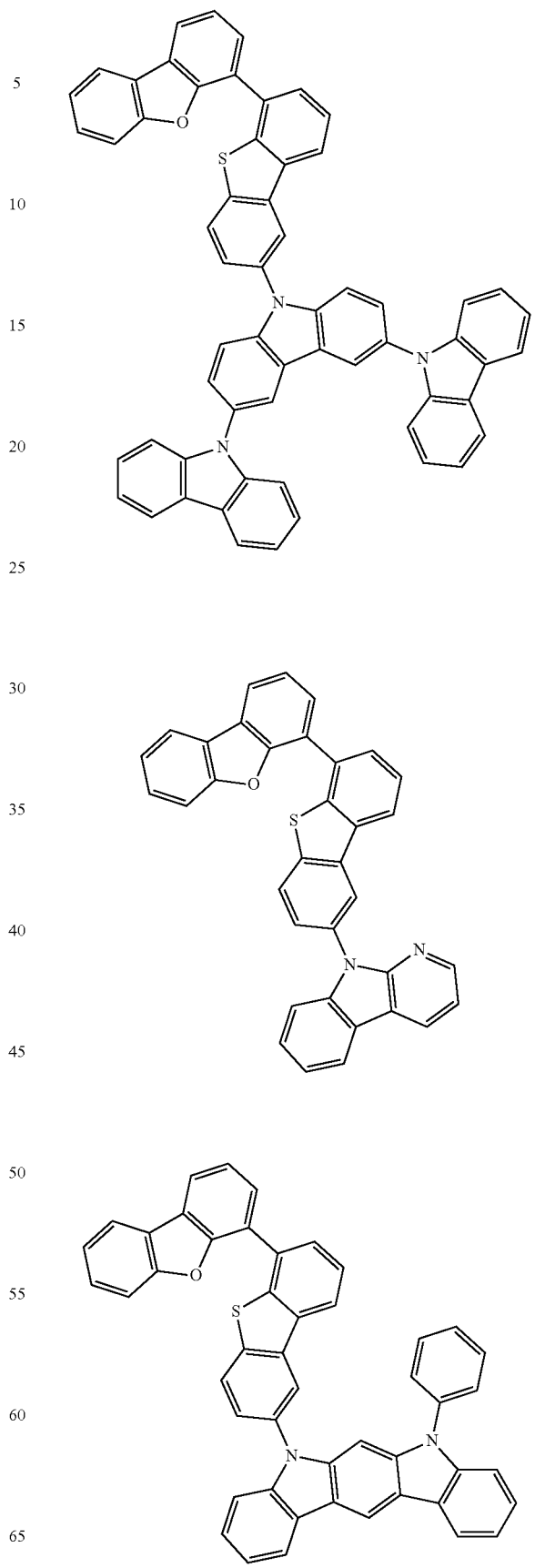

11
-continued
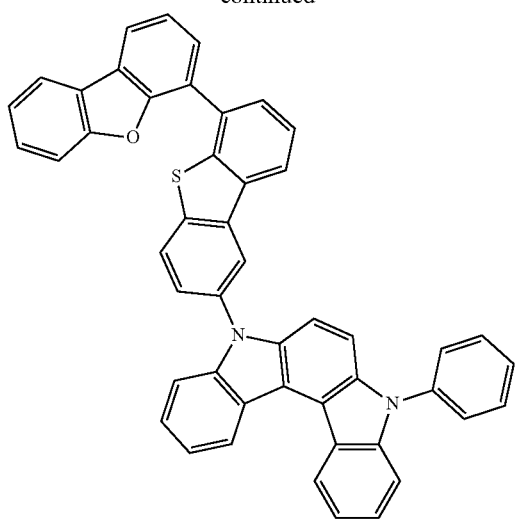
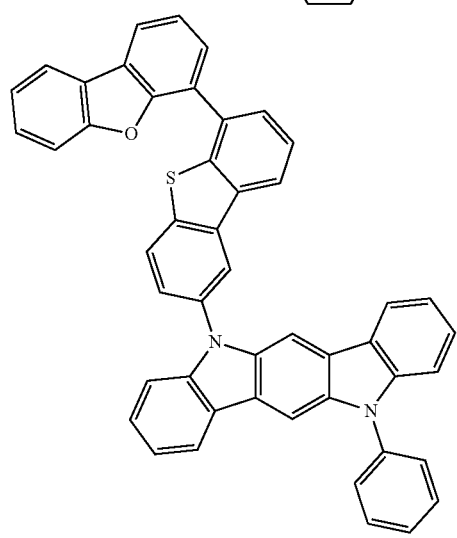
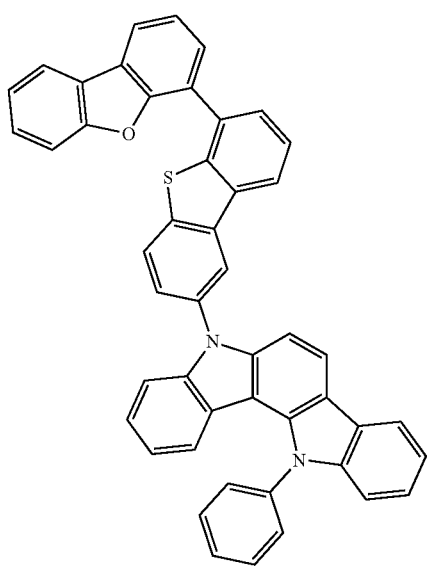
12
-continued
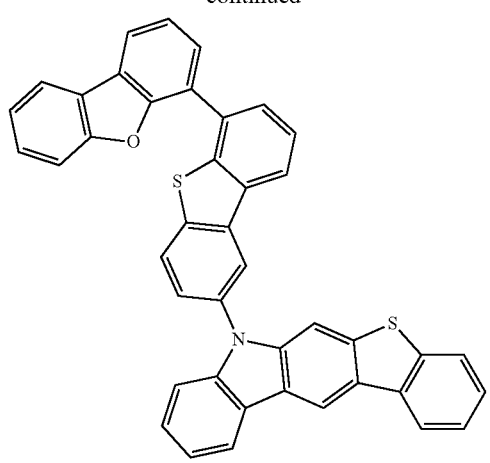
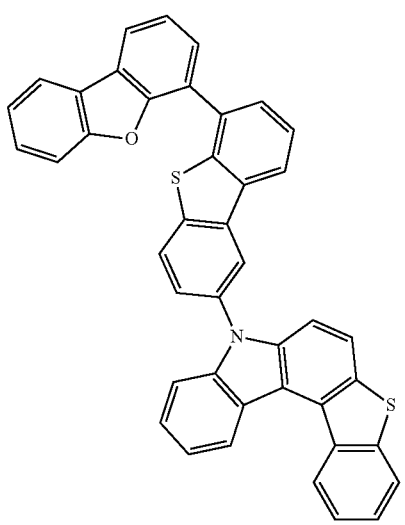
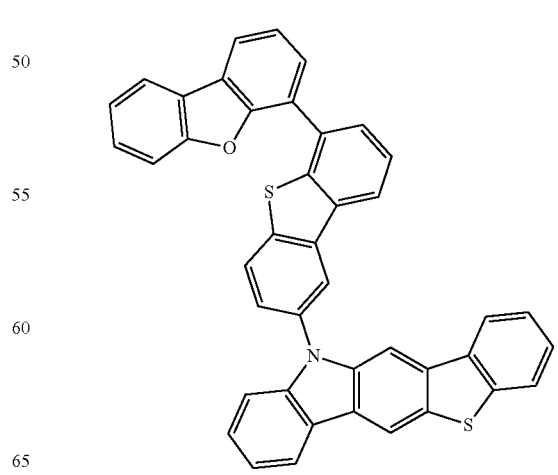

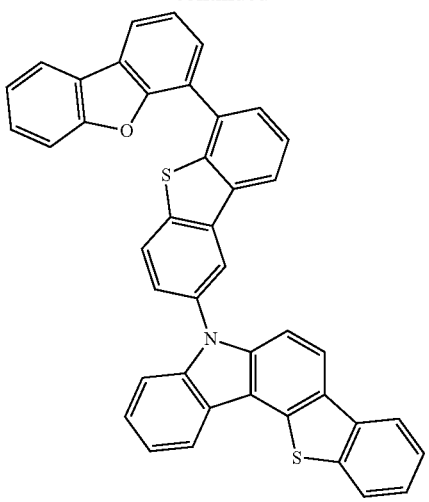
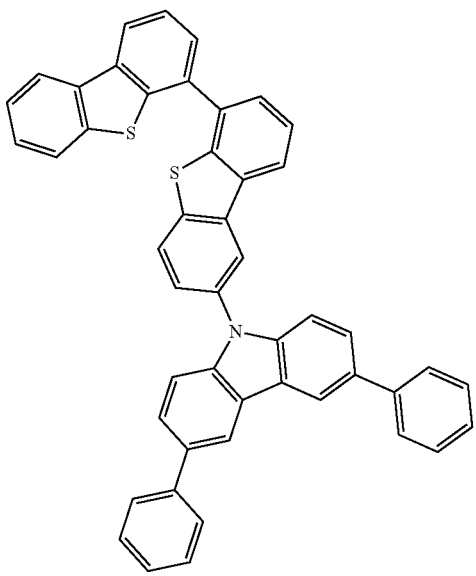
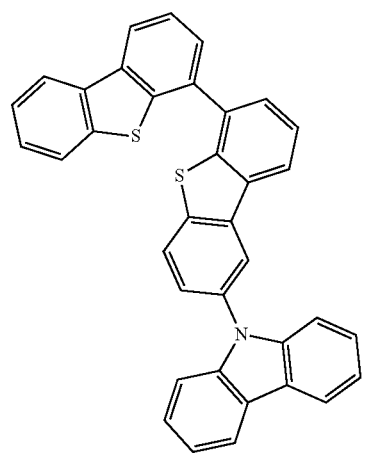
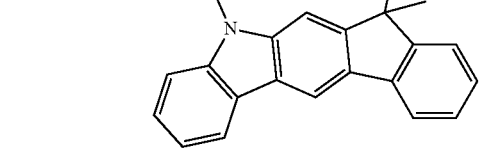
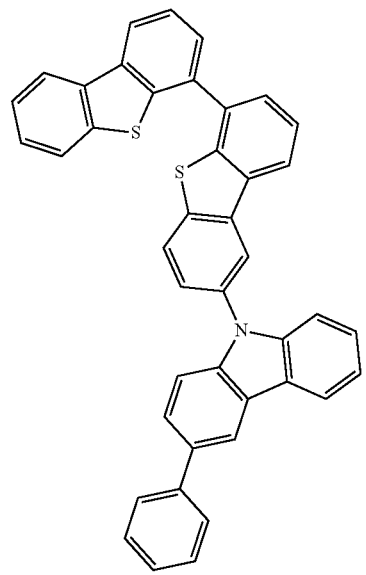
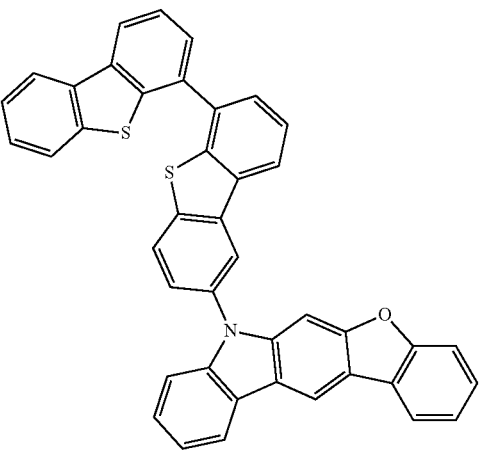

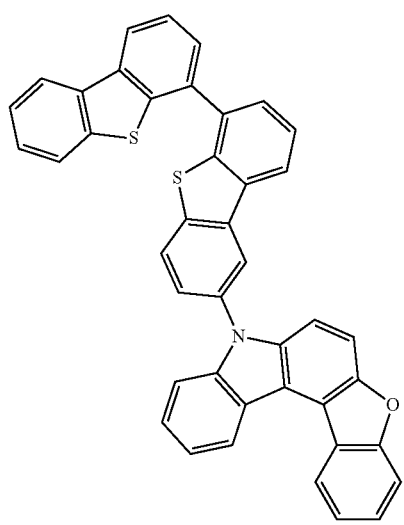
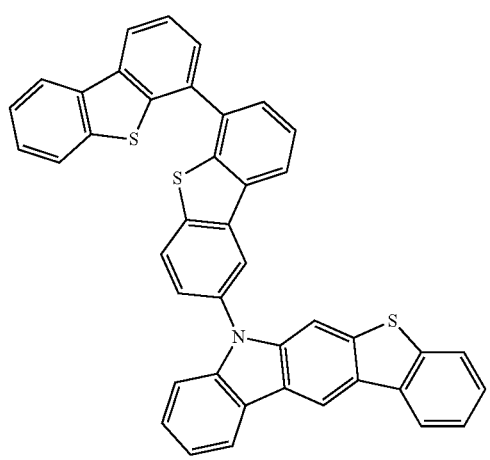
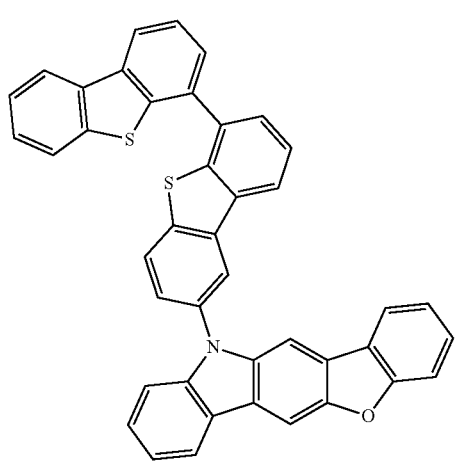
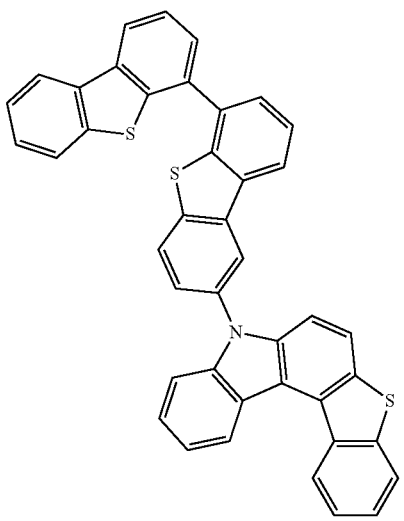
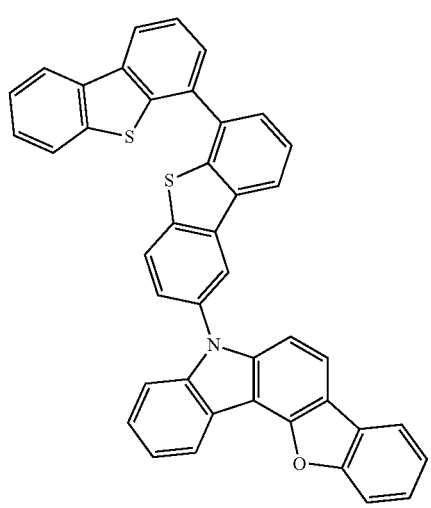
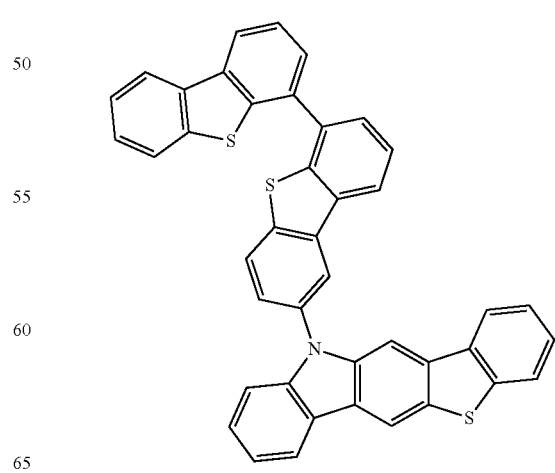

17
-continued
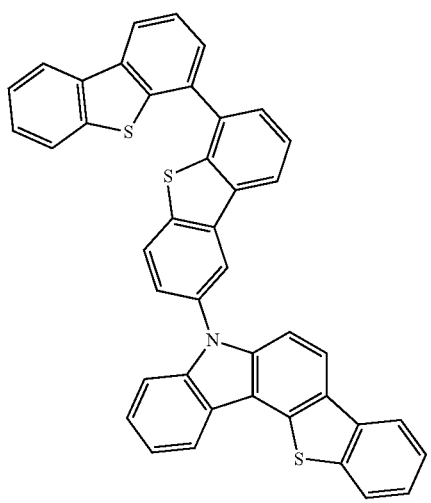
18
-continued
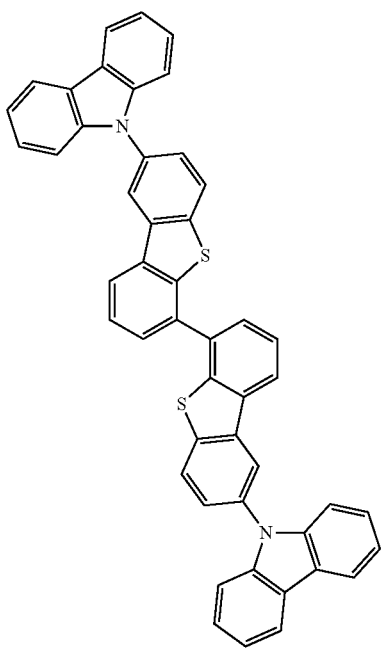
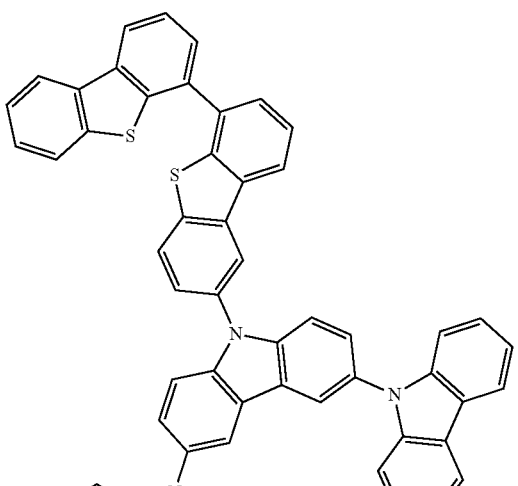
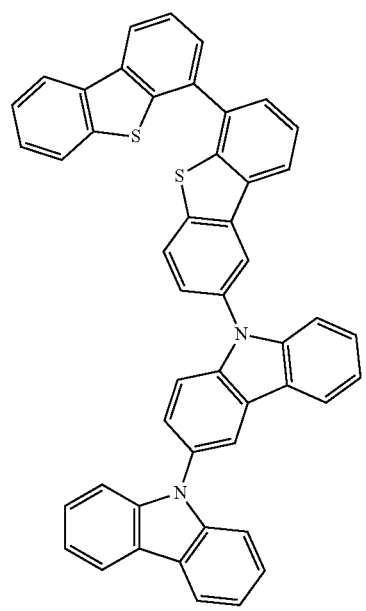
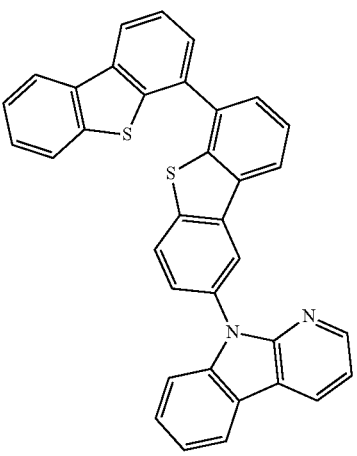

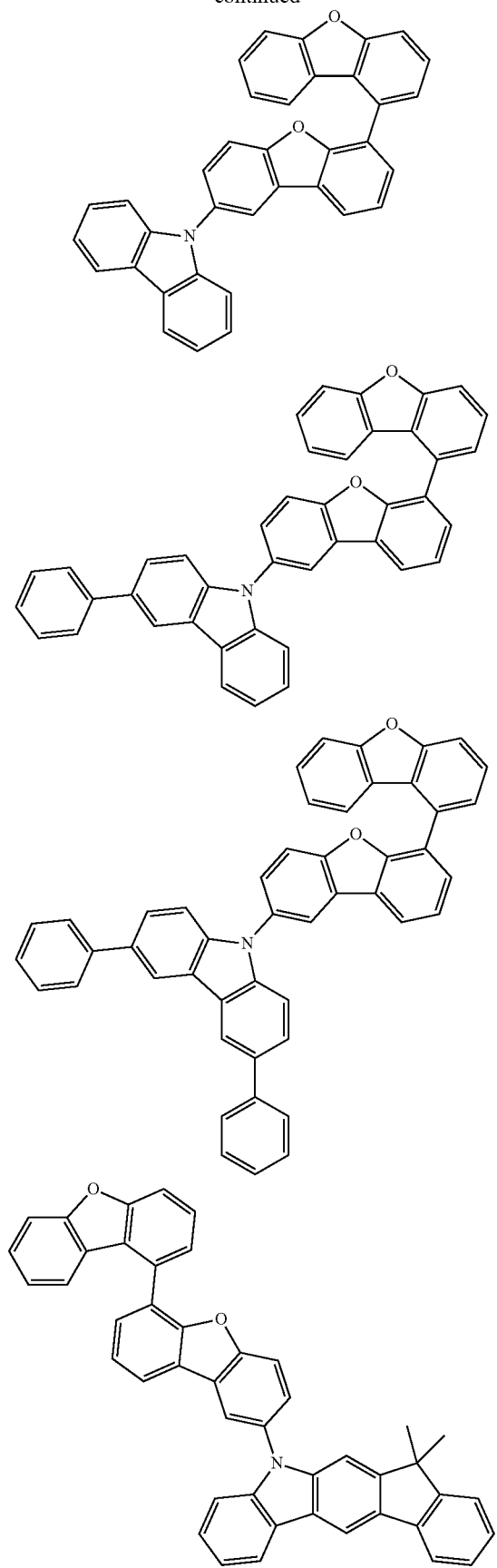

-continued
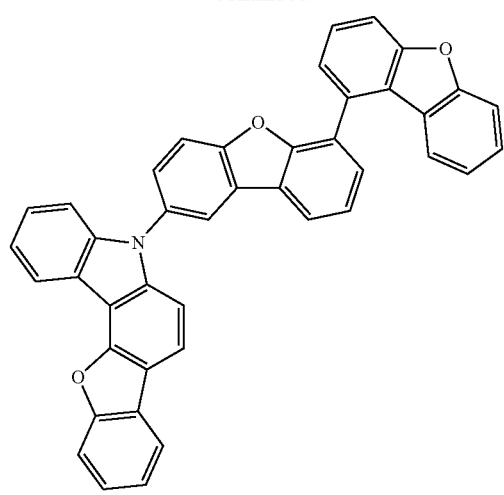
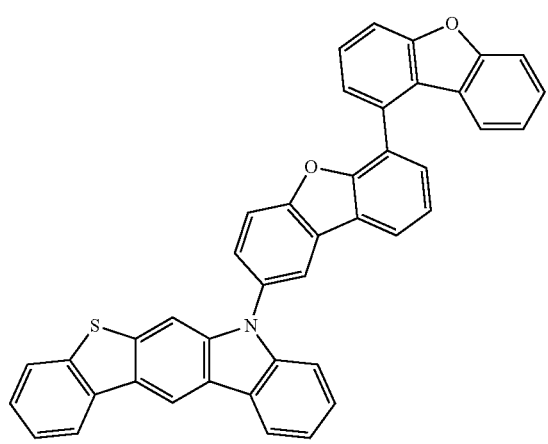
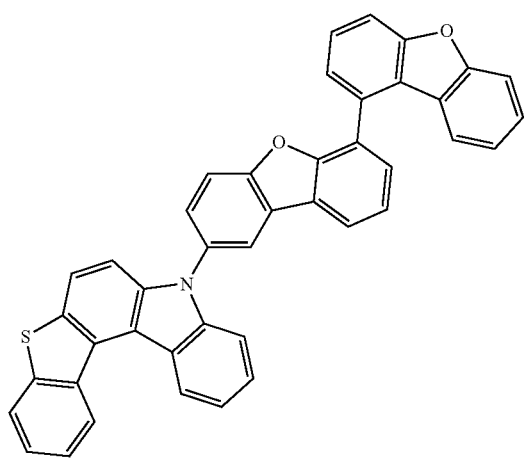
-continued
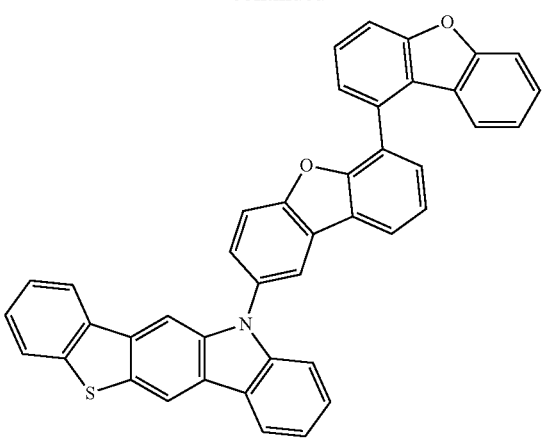
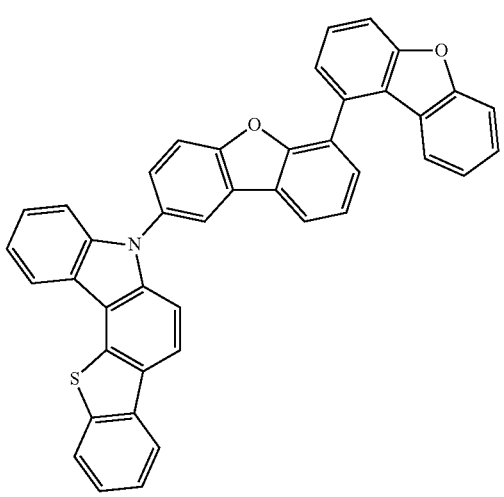
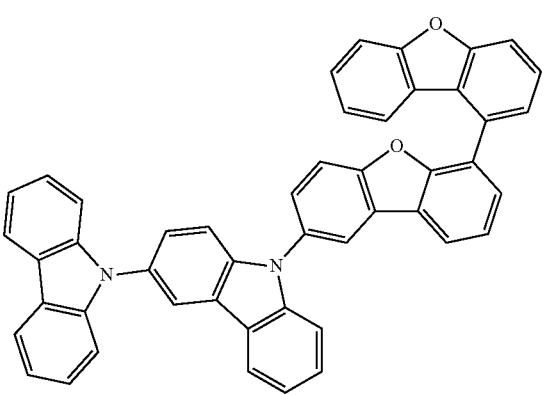

23
-continued
24
-continued
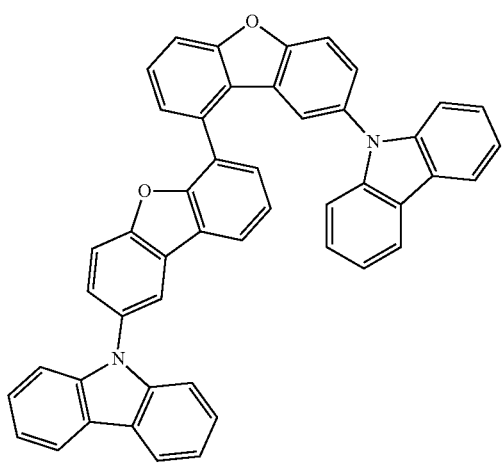
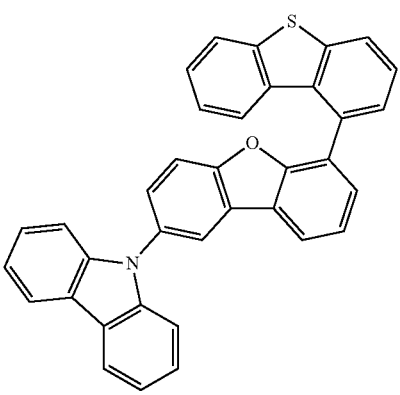
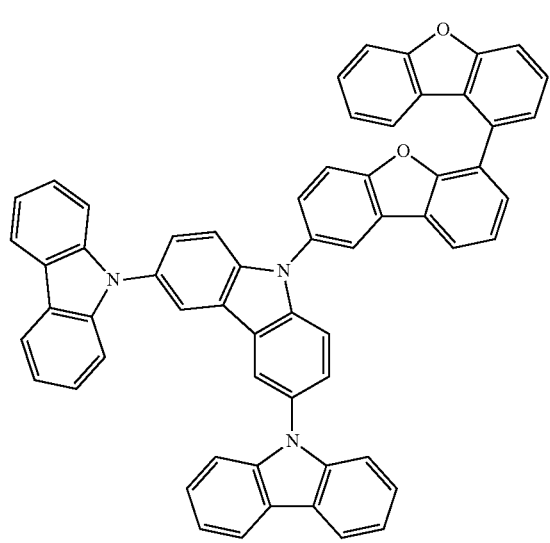
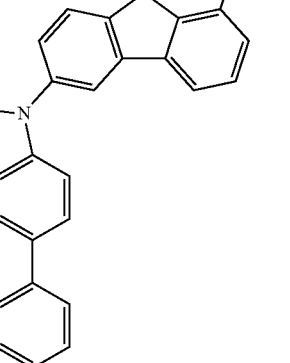
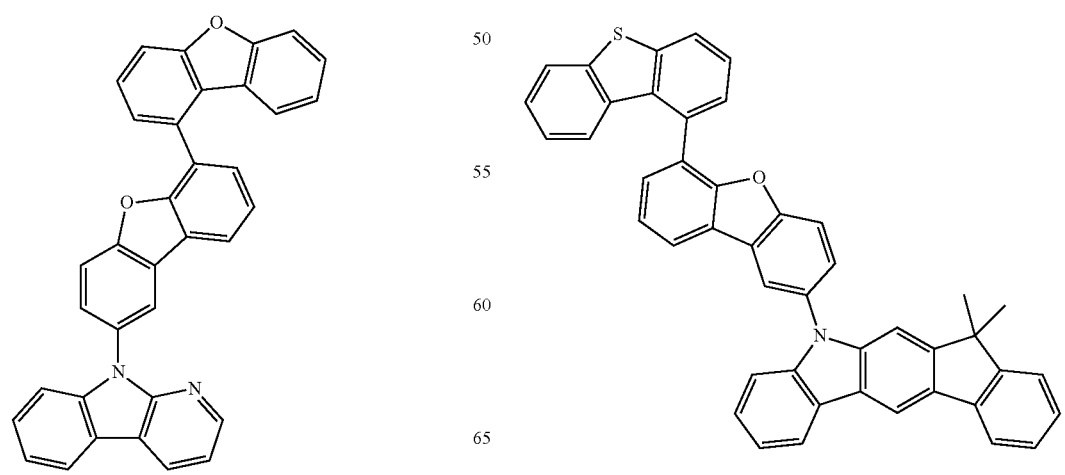

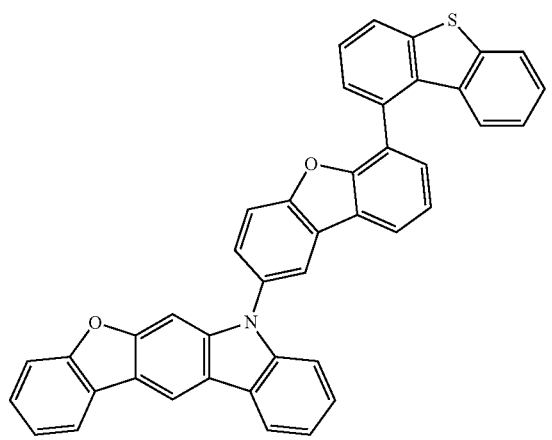
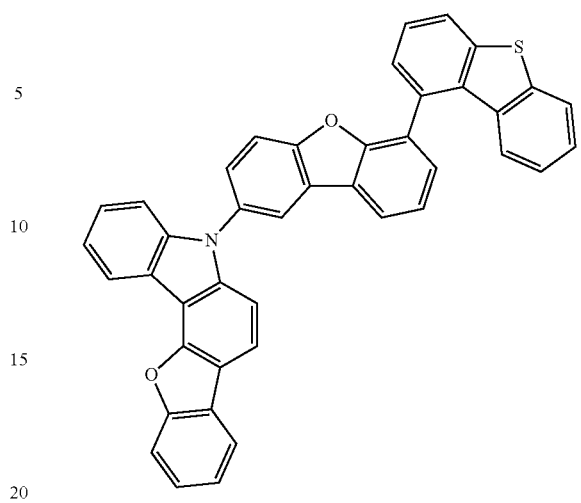
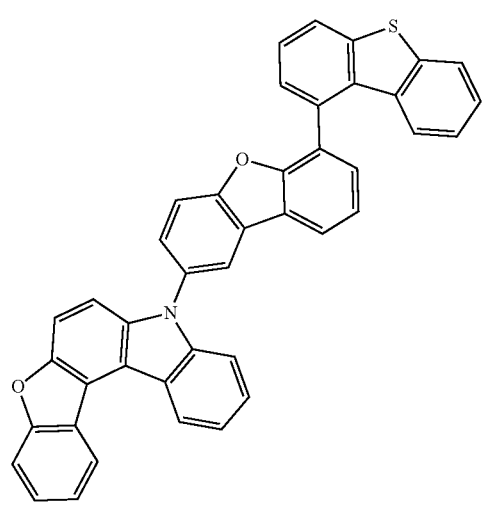
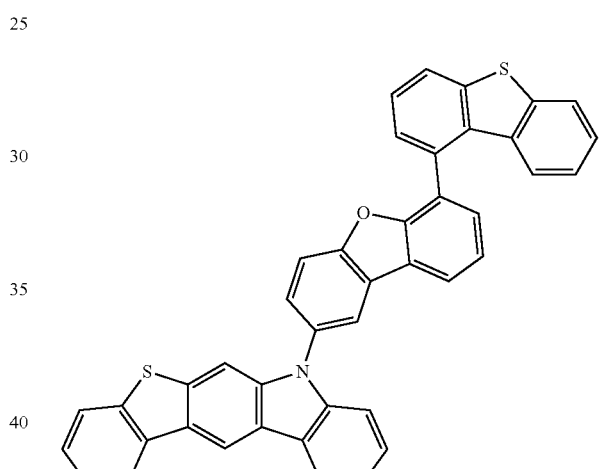
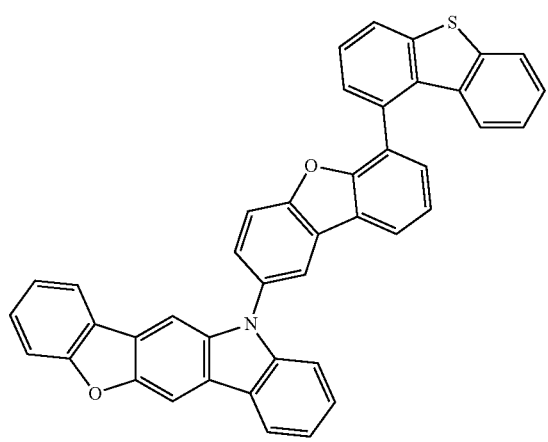
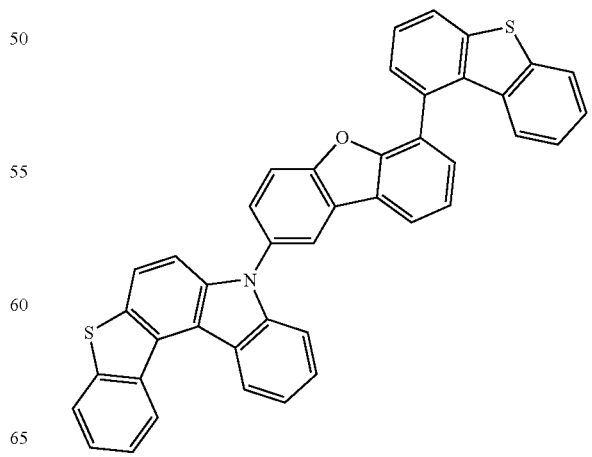

27
-continued
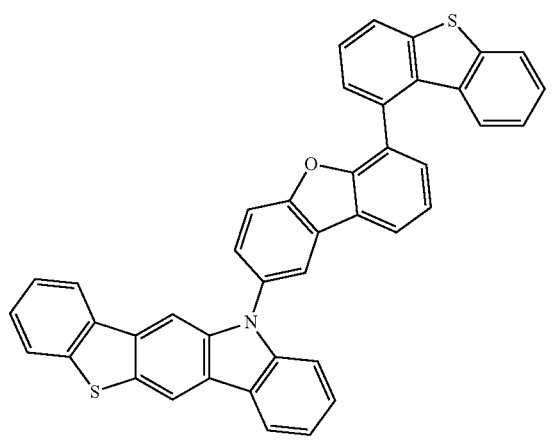
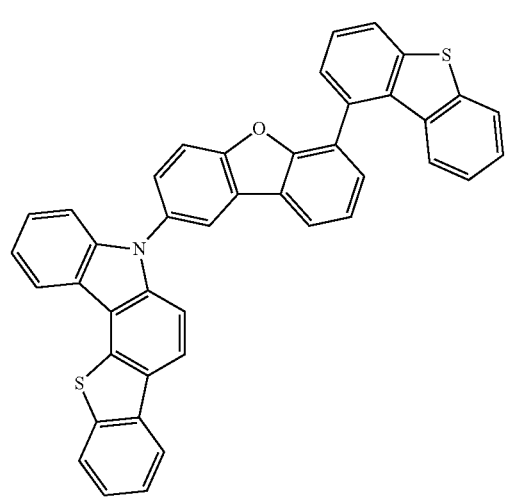
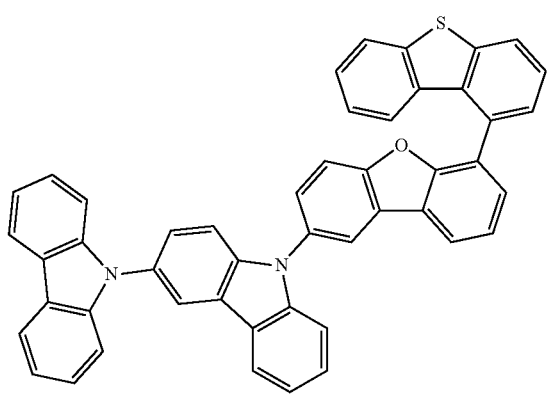
28
-continued
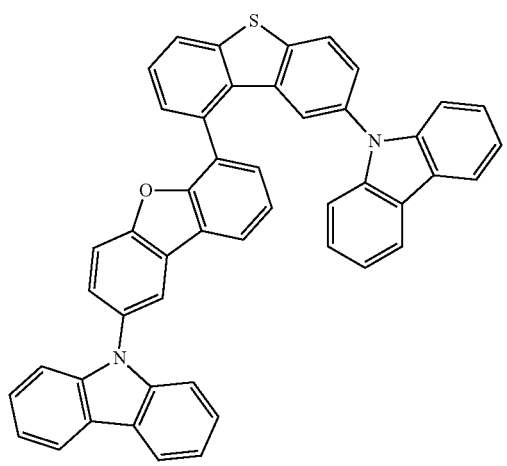
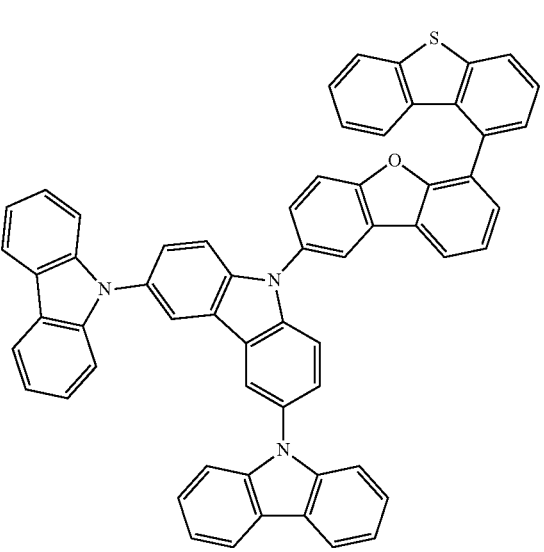
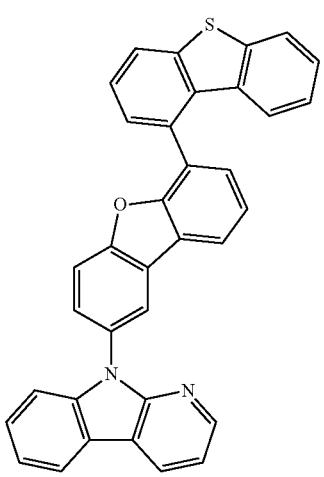

-continued
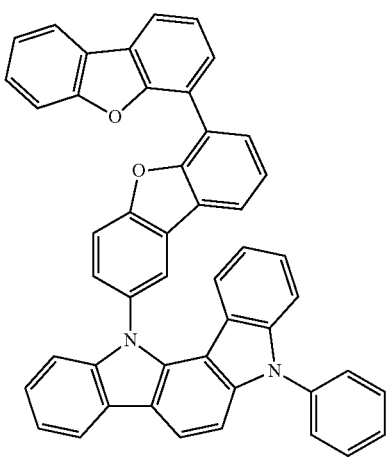
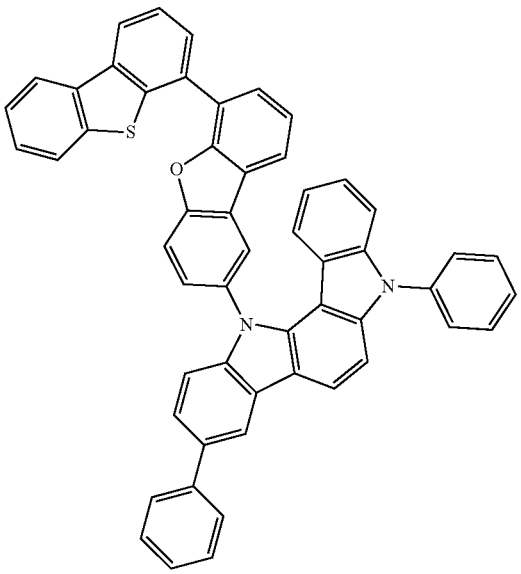
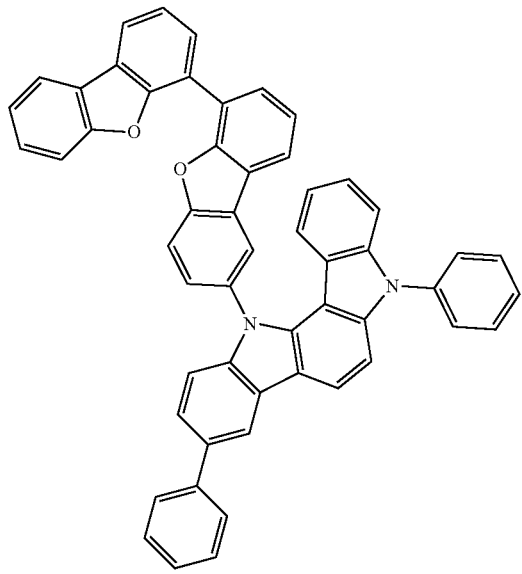
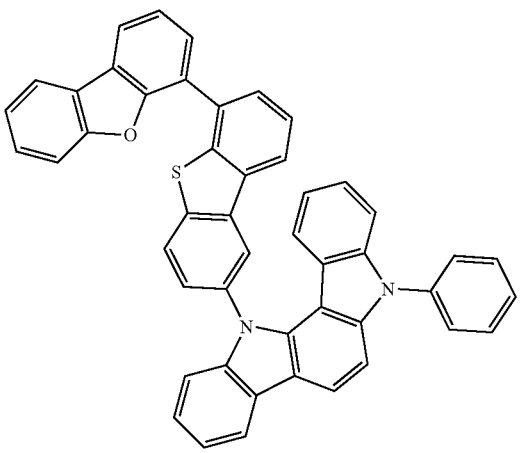
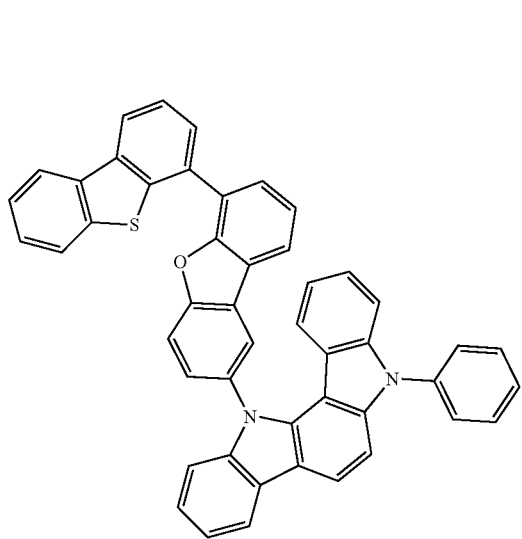
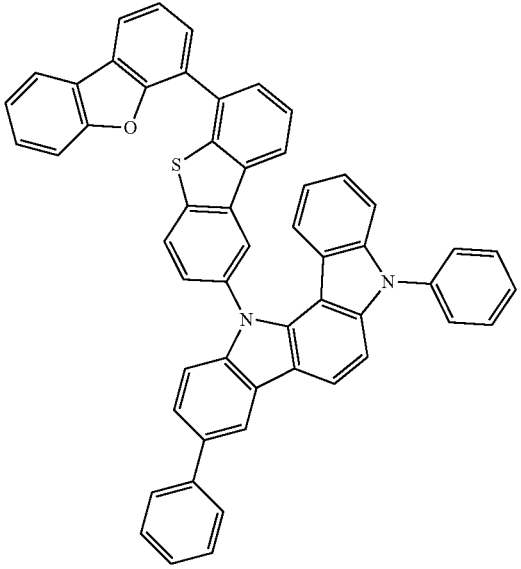

31
-continued
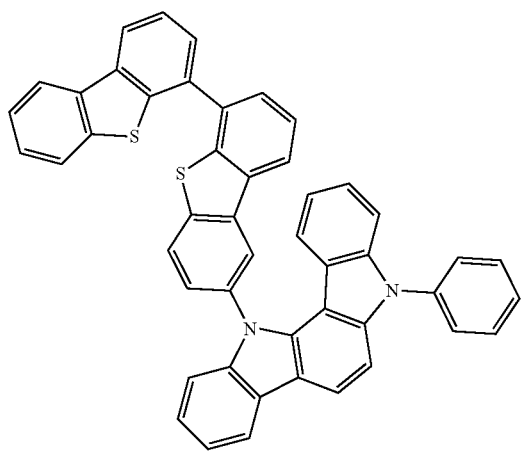
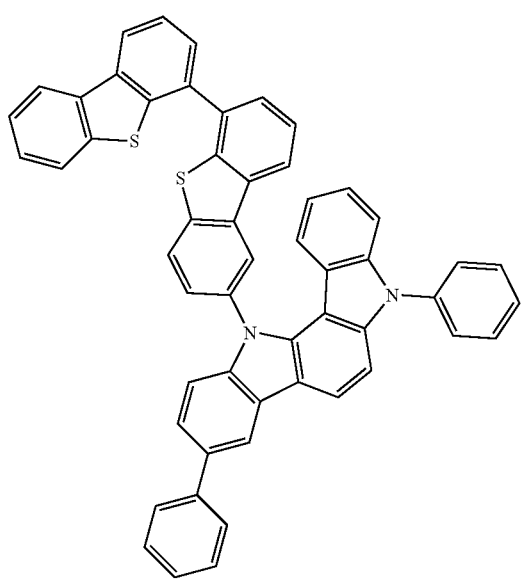
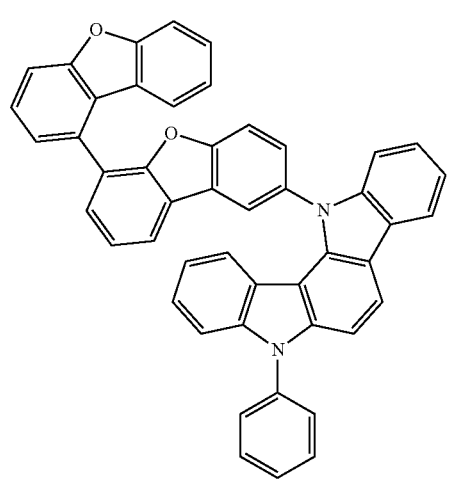
32
-continued
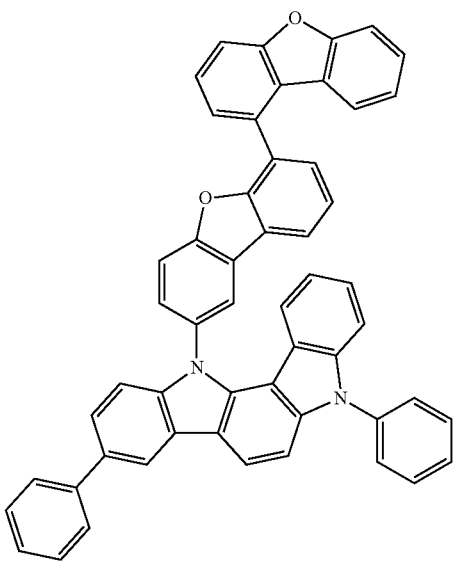
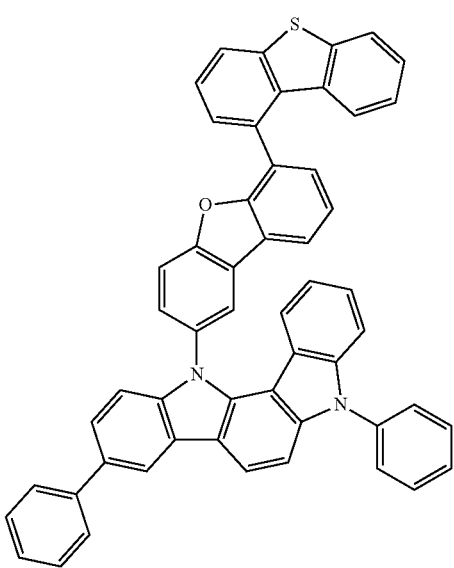
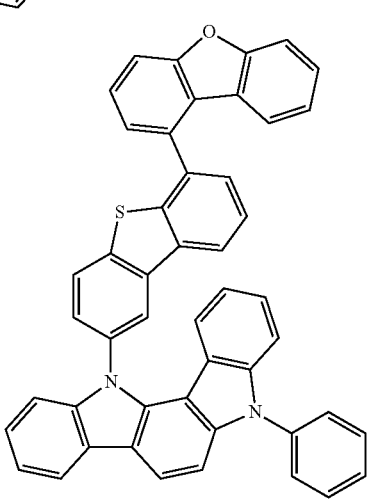

-continued
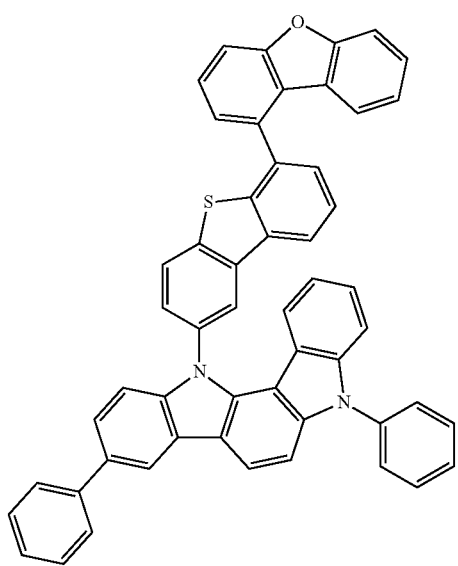
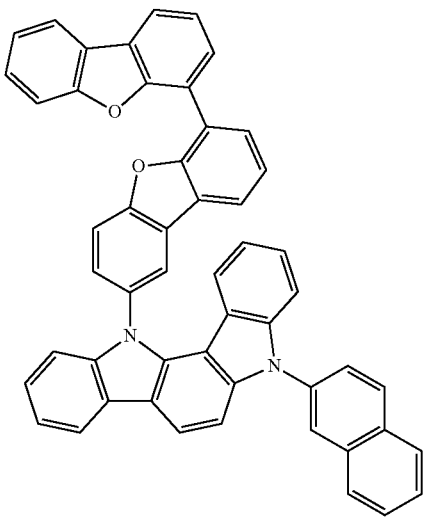
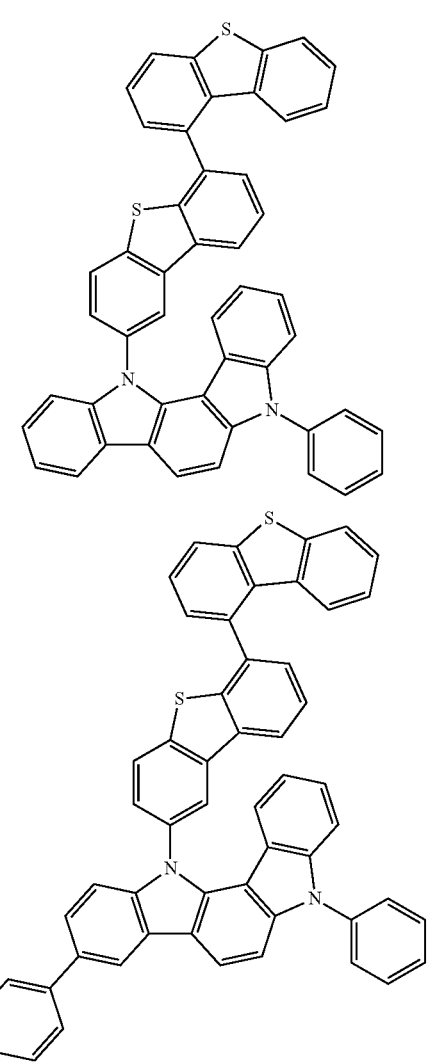
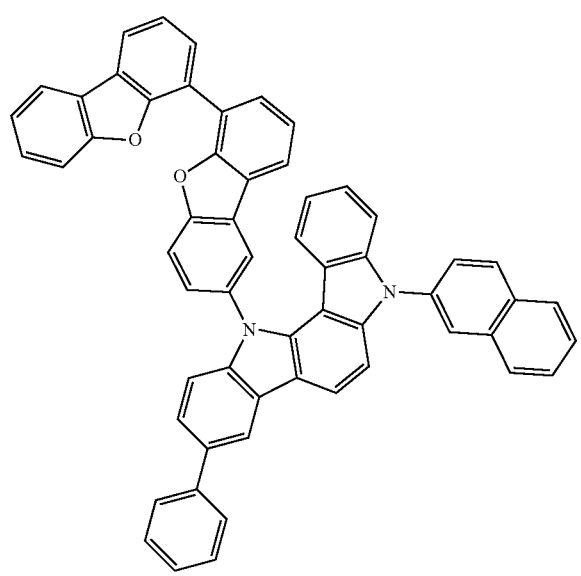
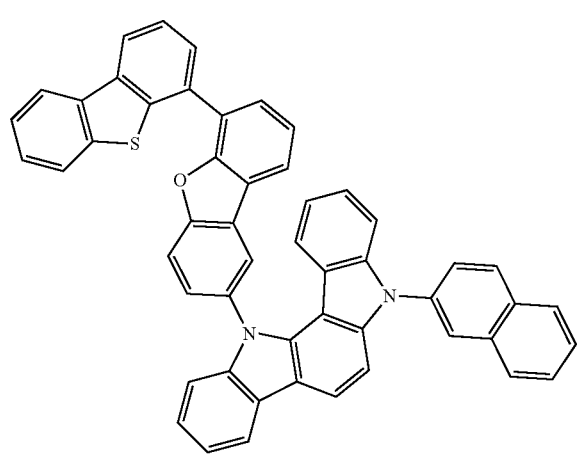

-continued
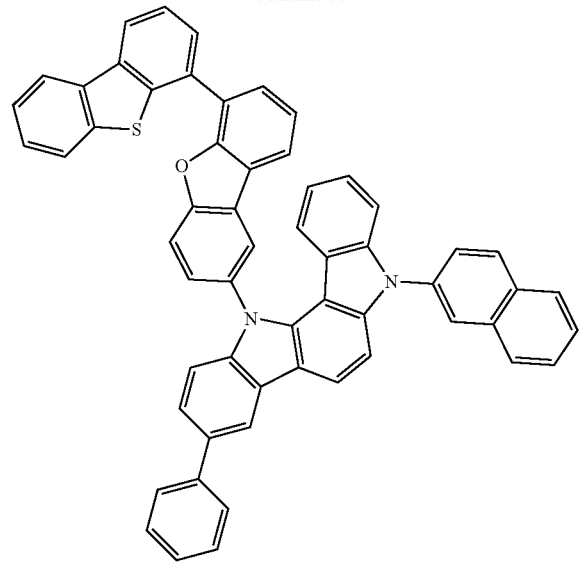
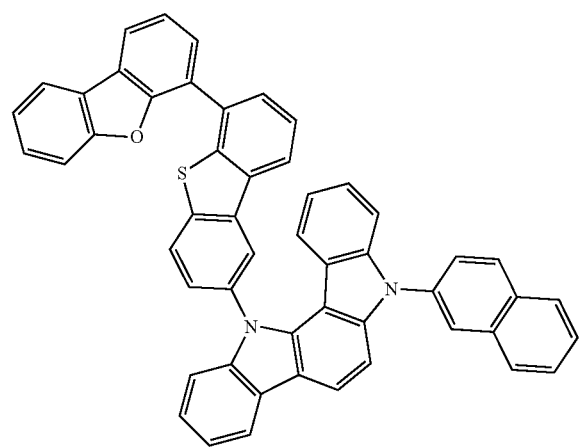
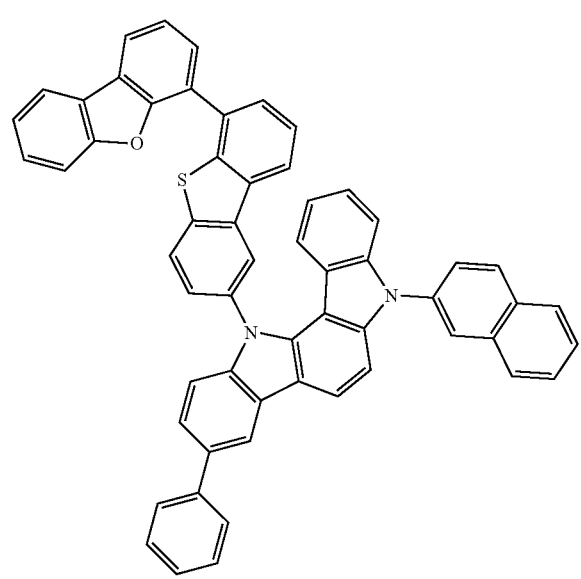
-continued
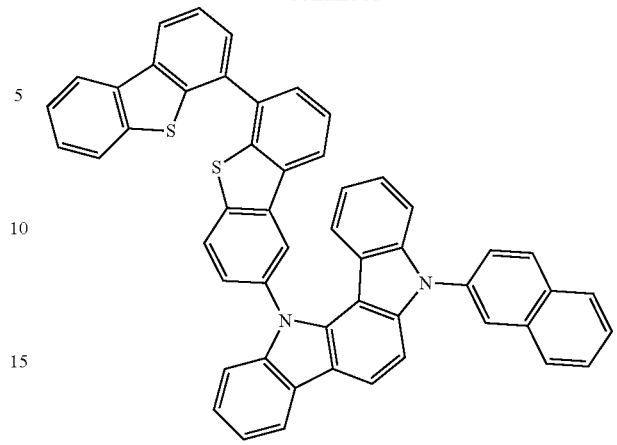
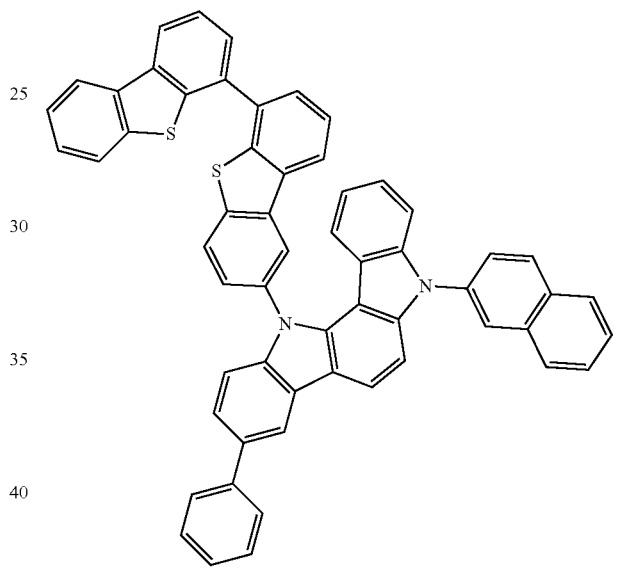
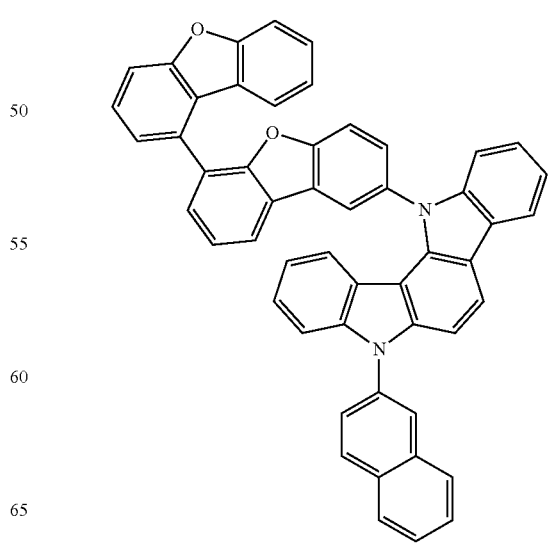

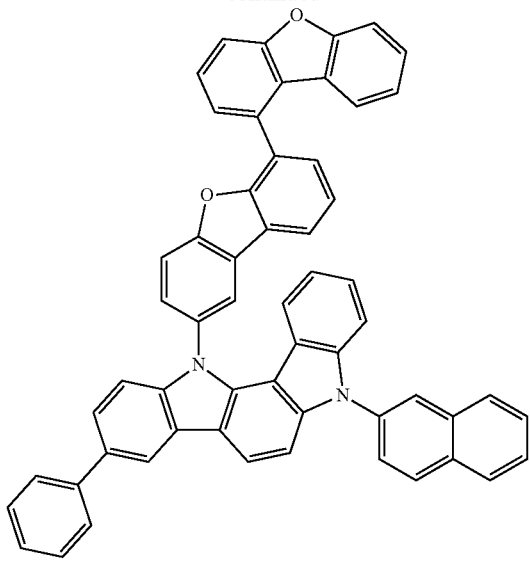
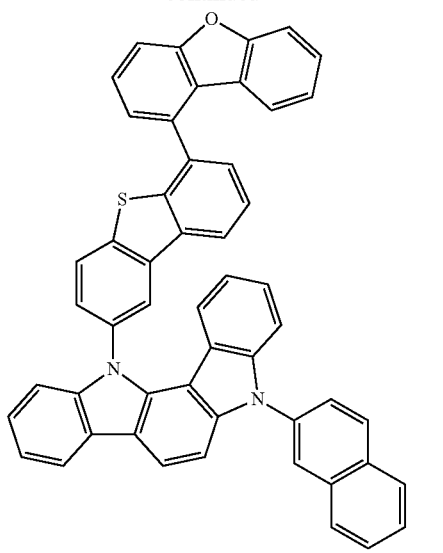
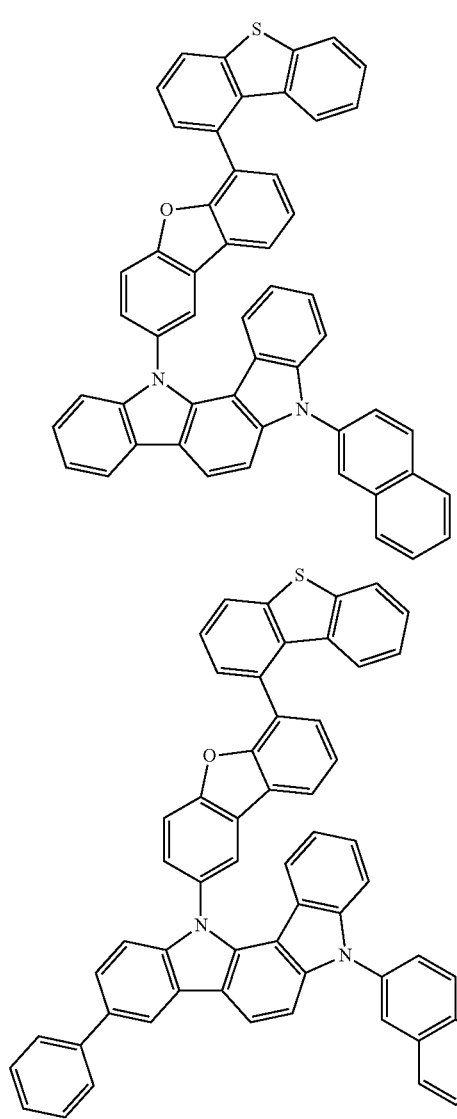
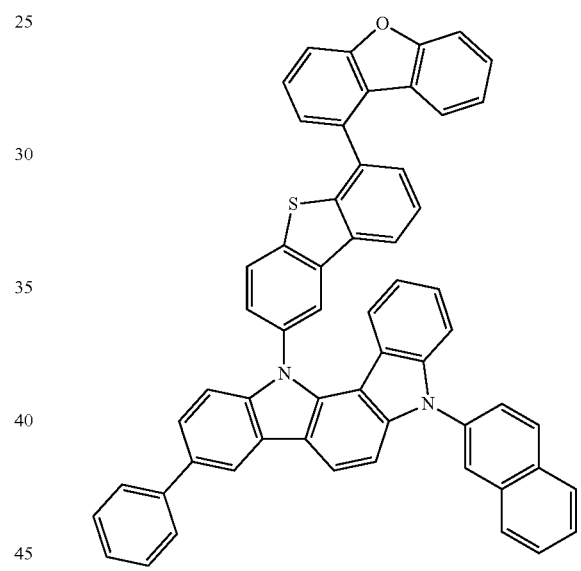
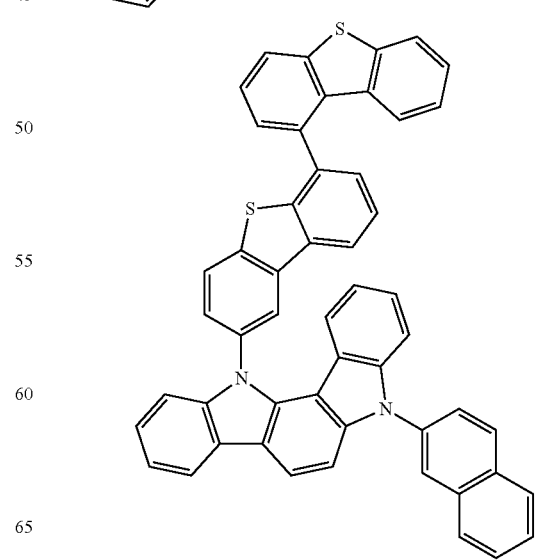

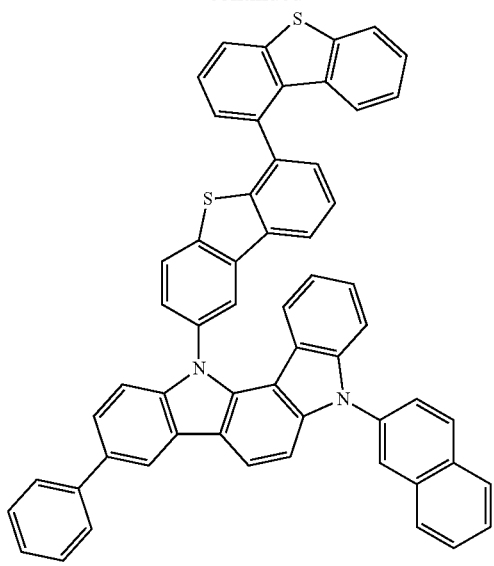
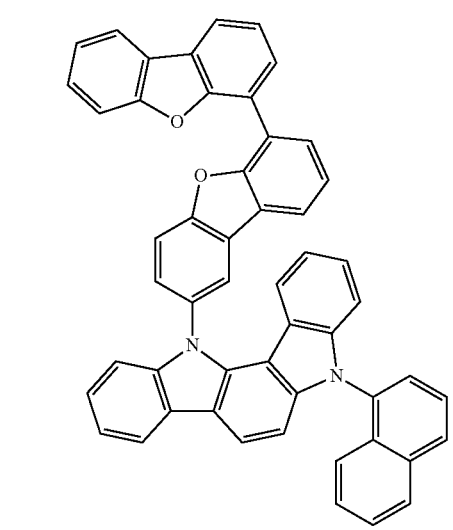
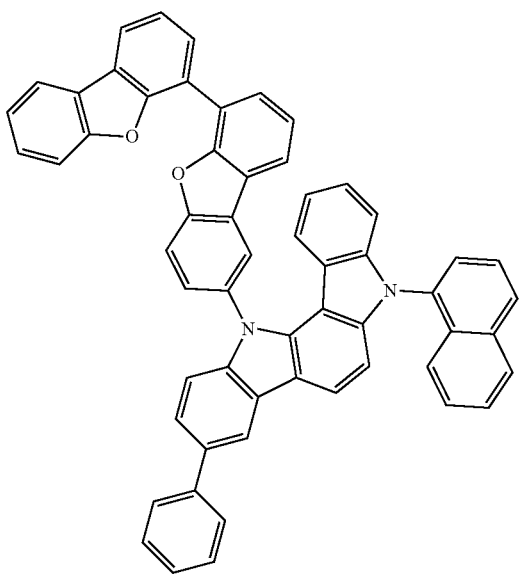
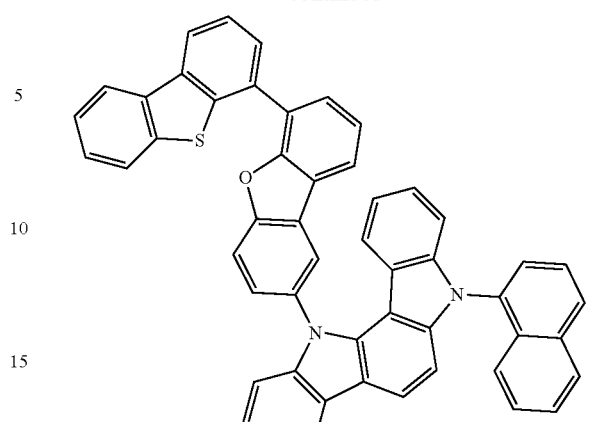
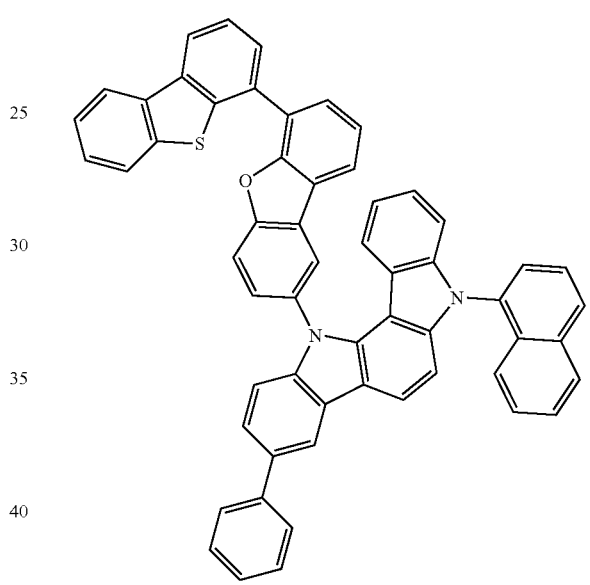
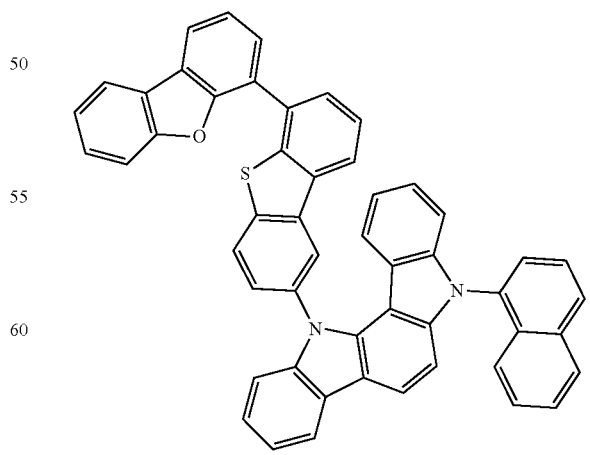

41
-continued
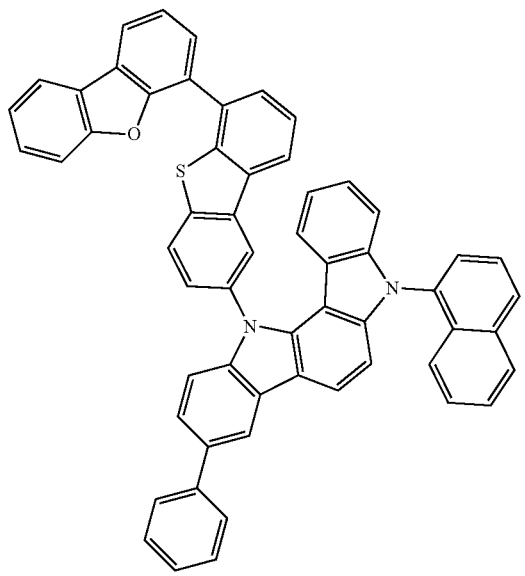
42
-continued
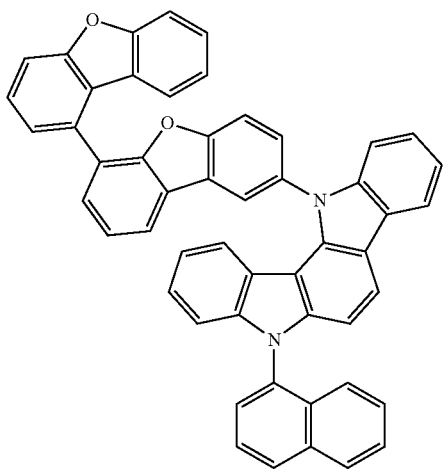
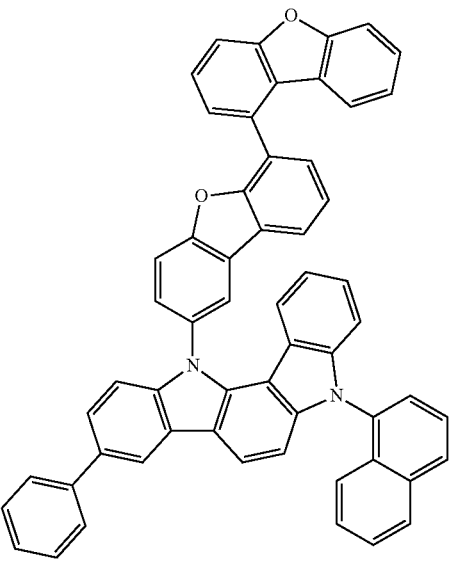
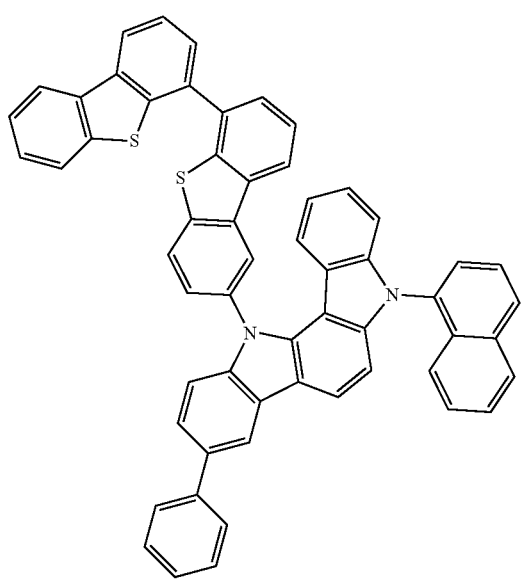
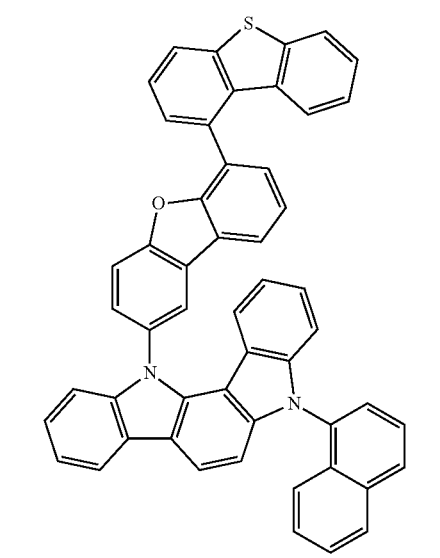

-continued
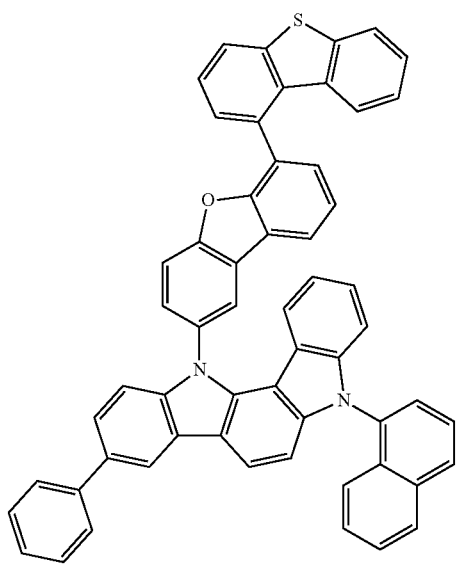
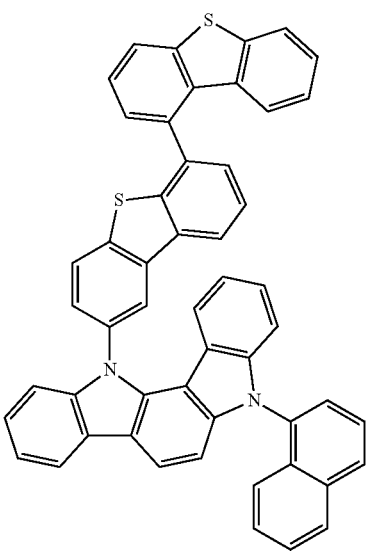
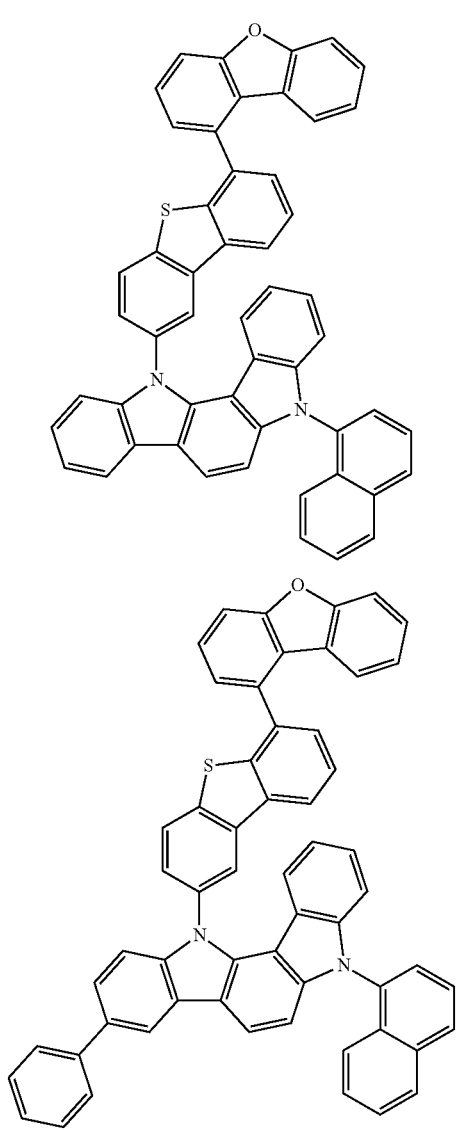
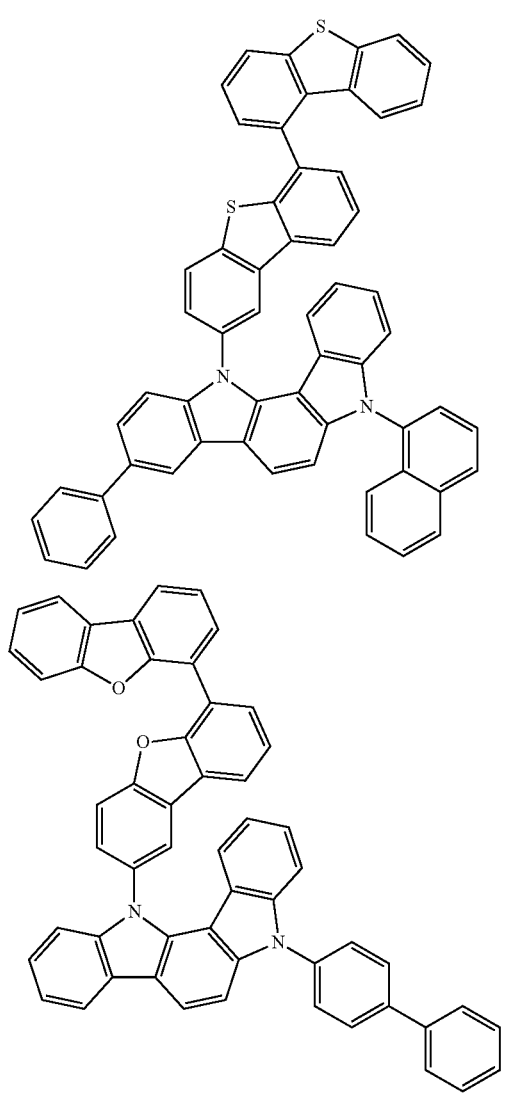

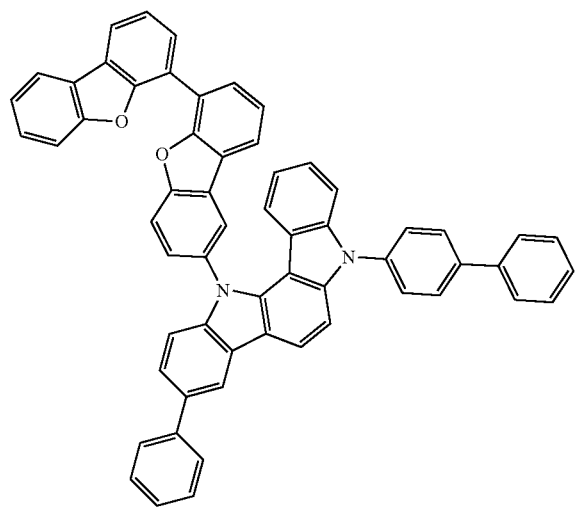
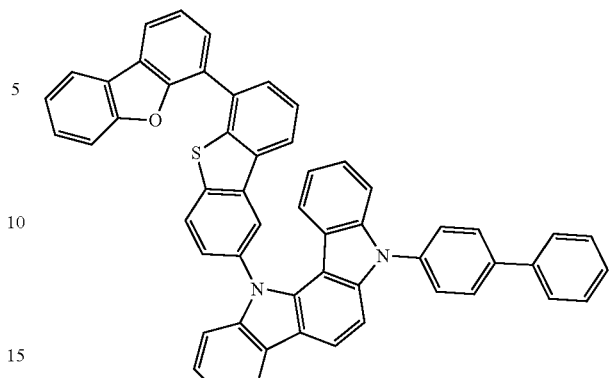
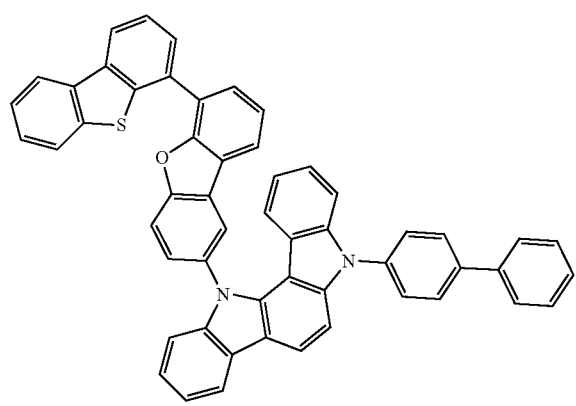
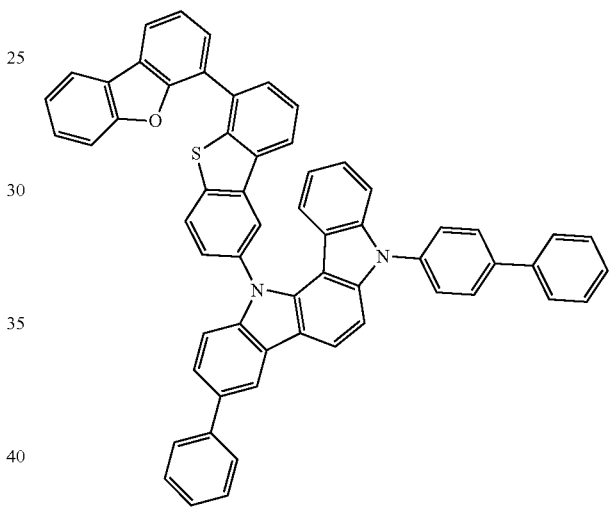
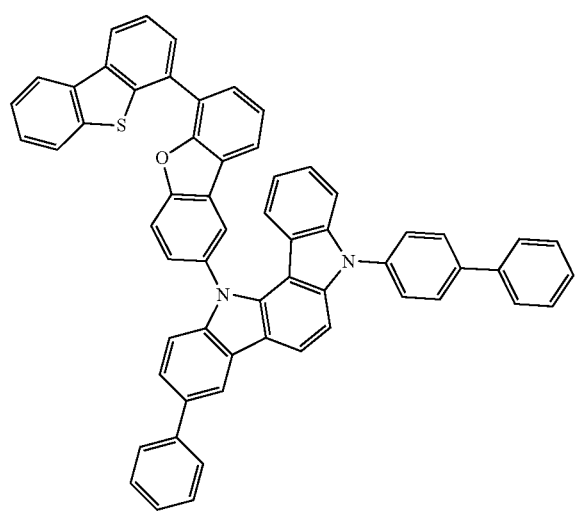
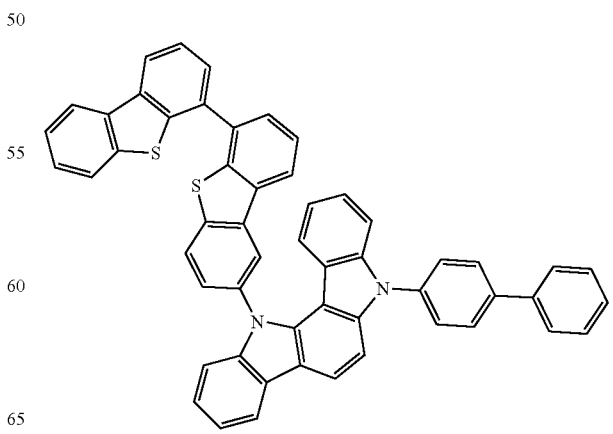

47
-continued
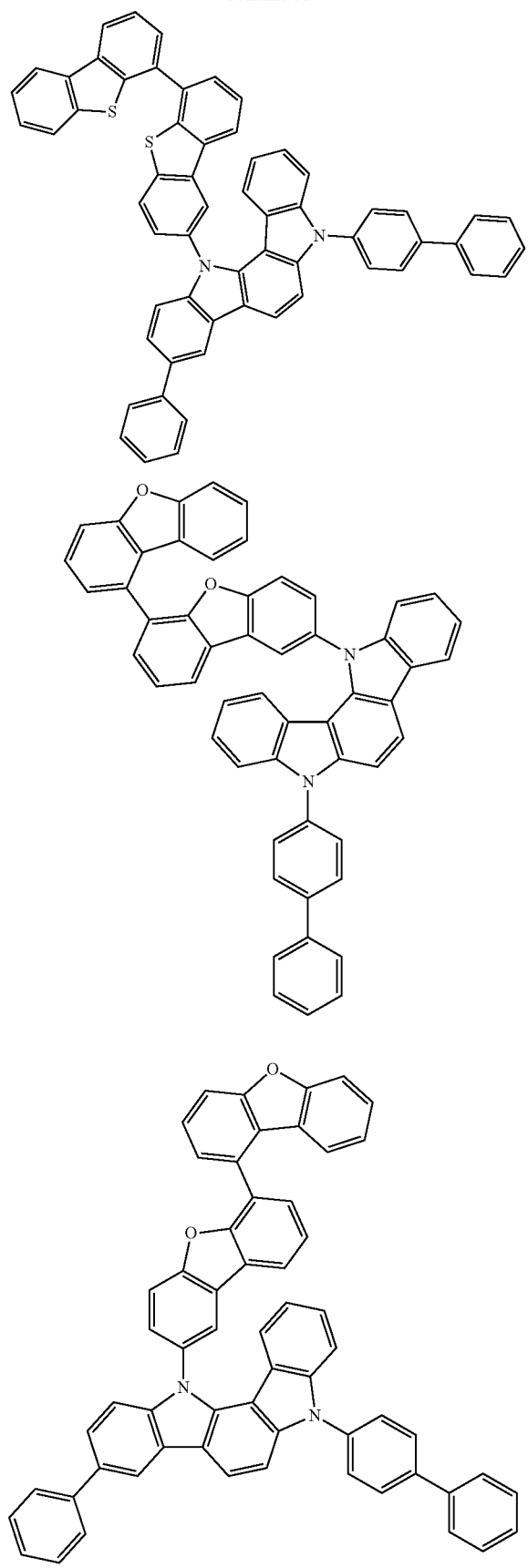
48
-continued
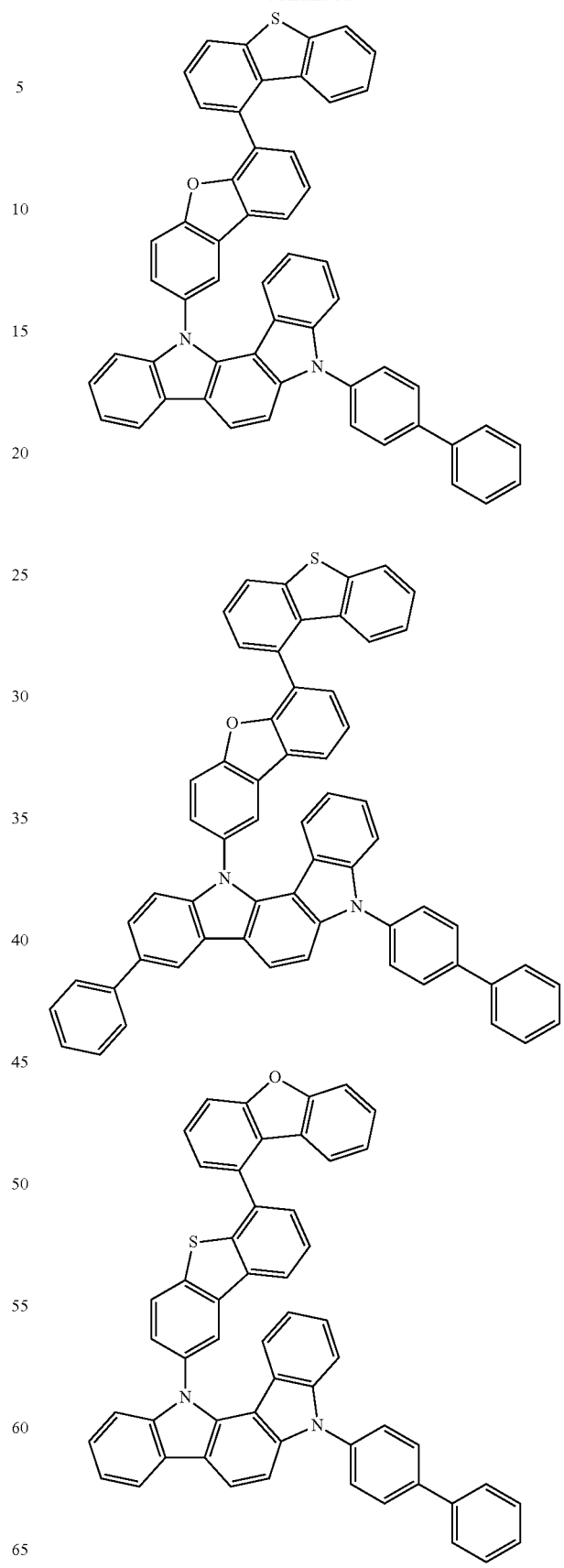

-continued
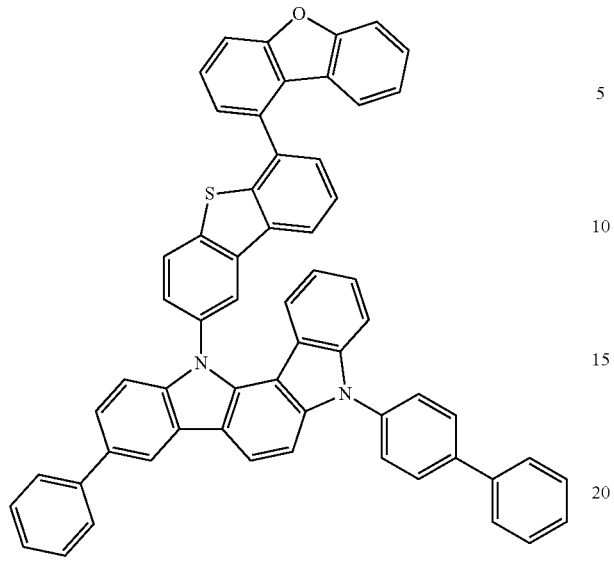
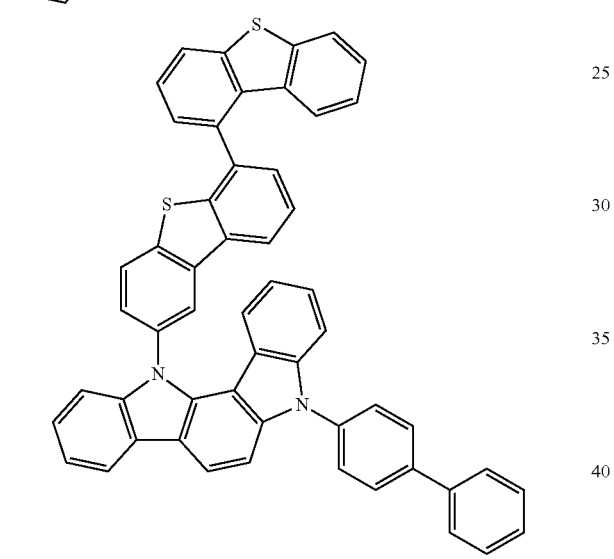
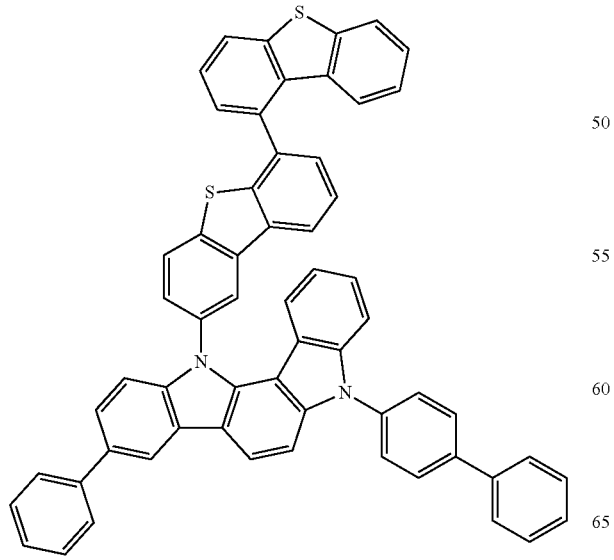
-continued
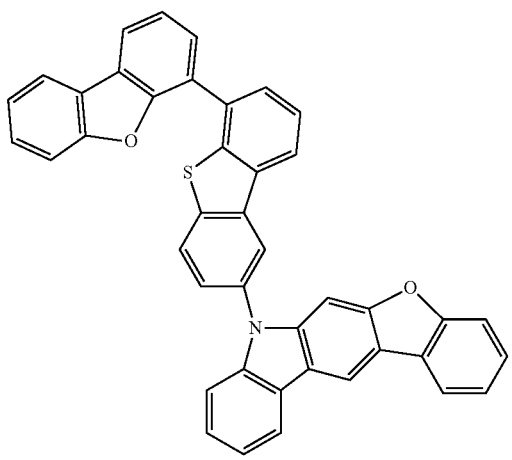
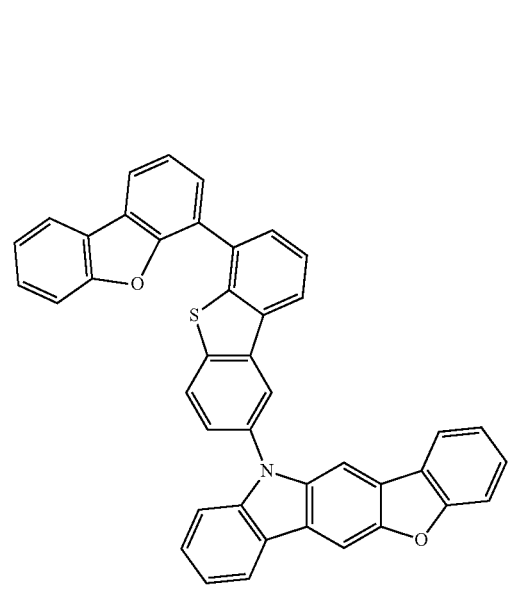

51
-continued
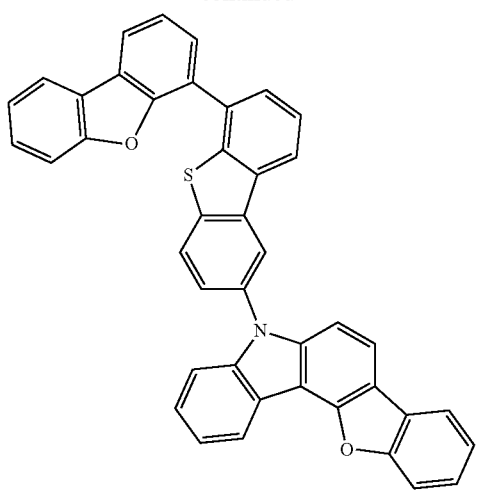
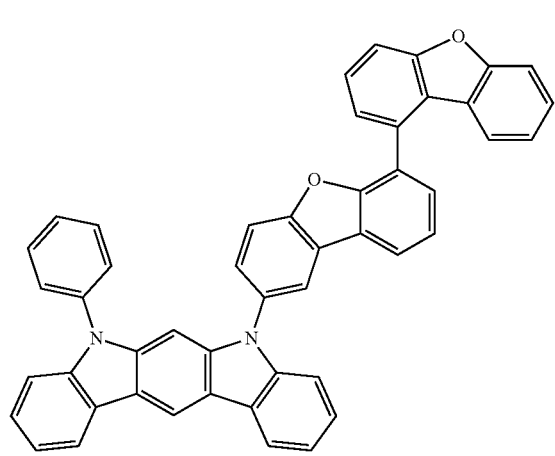
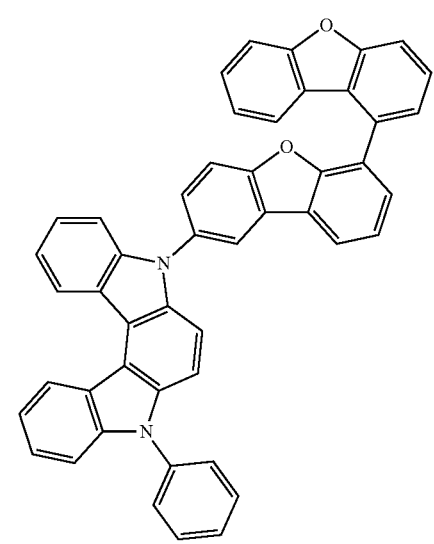
52
-continued
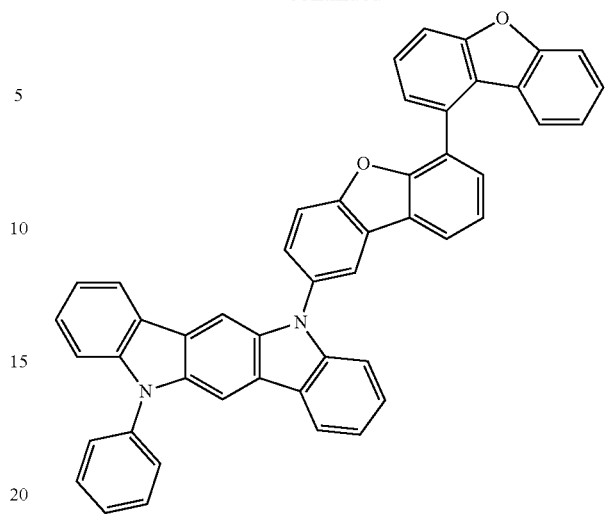
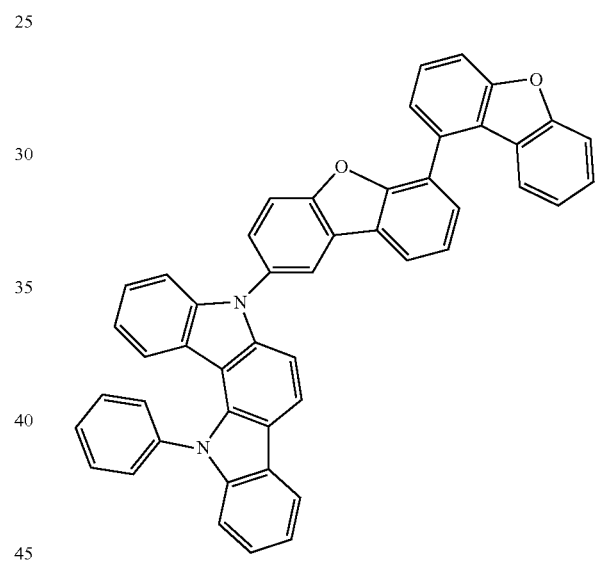
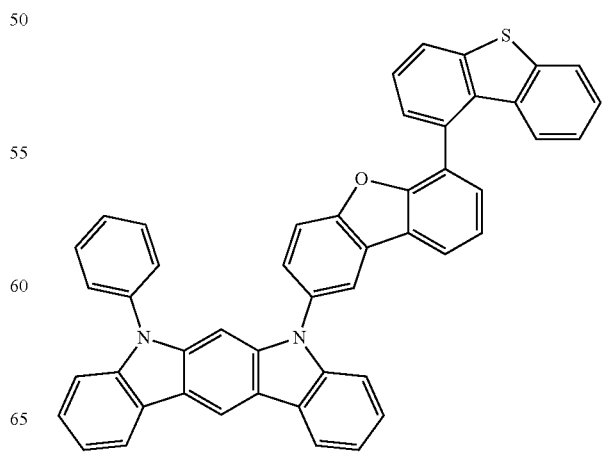

53
-continued
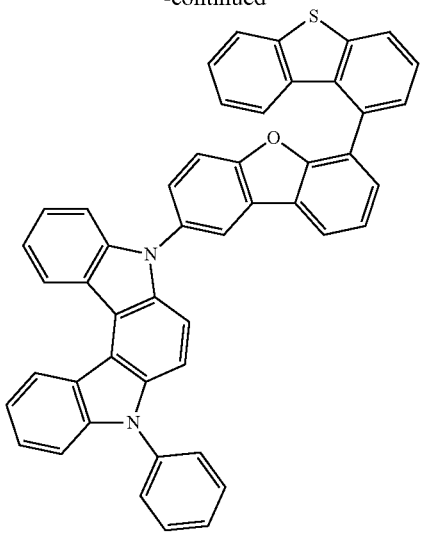
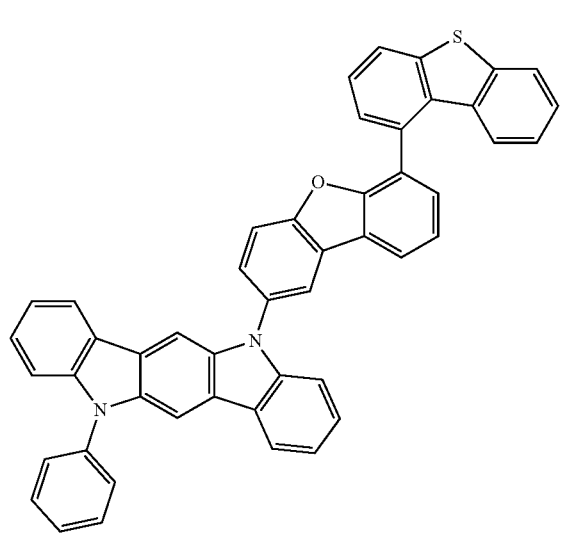
54
-continued
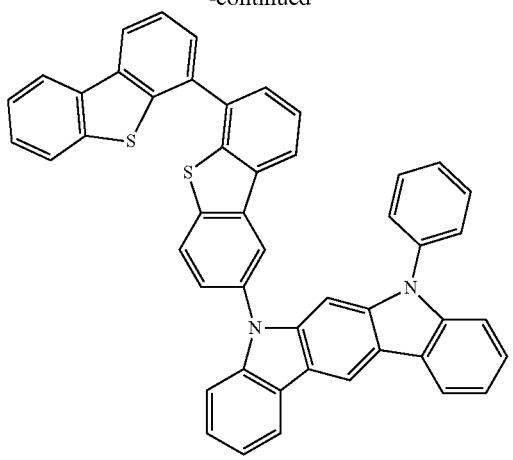
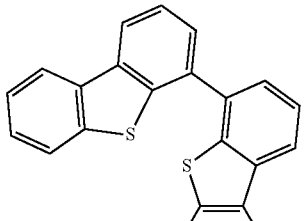
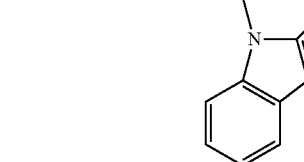
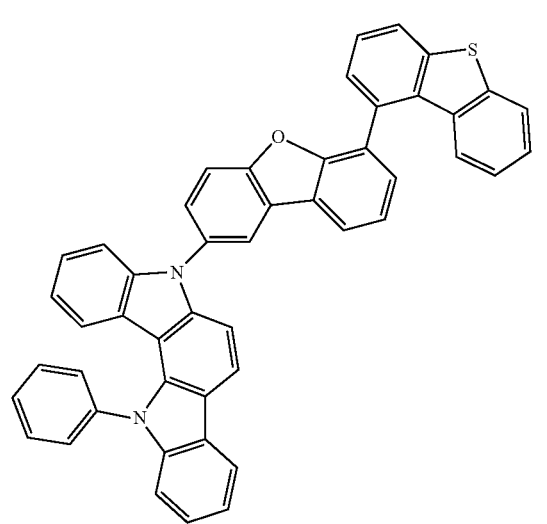

-continued

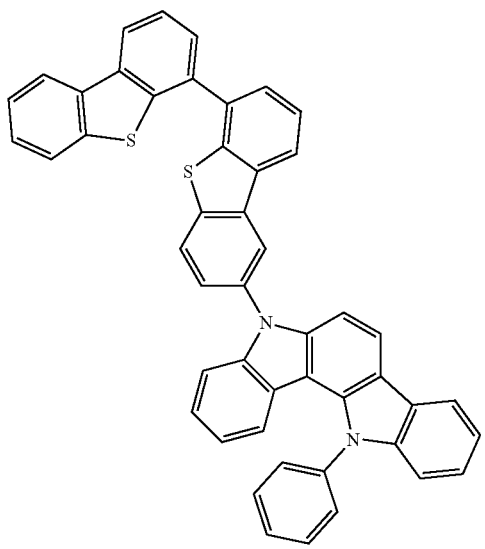

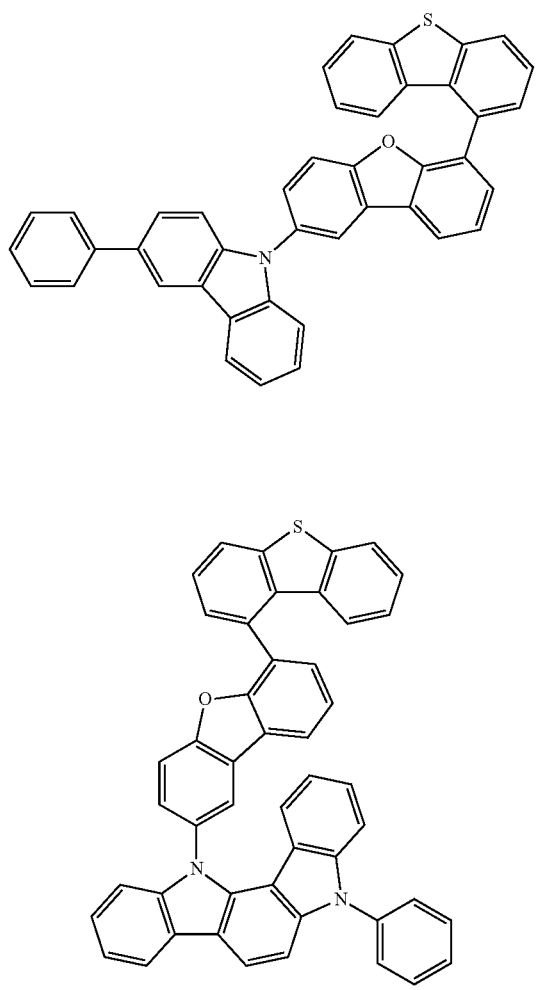

The n-type host 244 may be represented by Formula 3-1 or Formula 3-2.

[Formula 3-1]

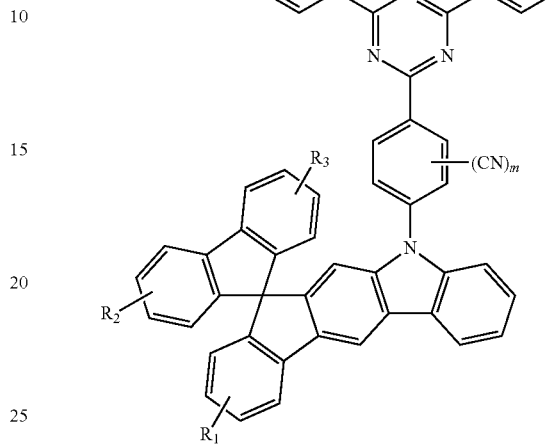

[Formula 3-2]

In Formulas 3-1 and 3-2, each of $R_1$ to $R_3$ is independently selected from the group consisting of hydrogen (protium), deuterium, C1 to C10 alkyl, C6 to C30 aryl and C5 to C30 heteroaryl, and m is an integer of 0 to 4. For example, each of R1 to R3 may be independently selected from the group consisting of hydrogen, methyl, phenyl, carbazolyl and dibenzofuranyl, and m may be 1.

For example, the n-type host 244 may be one of Formula 4.
[Formula 4]
1
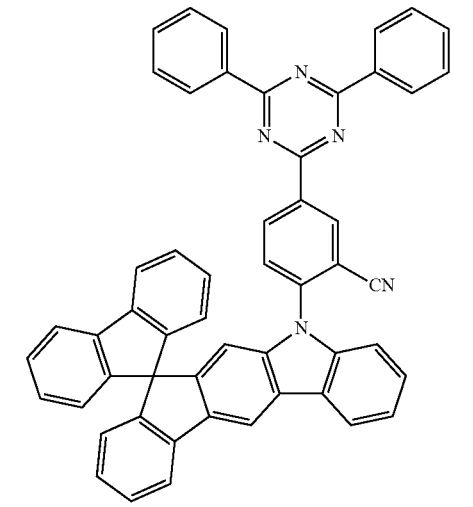
2
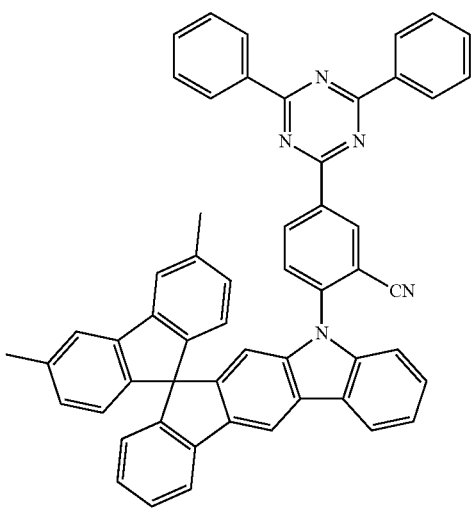
3
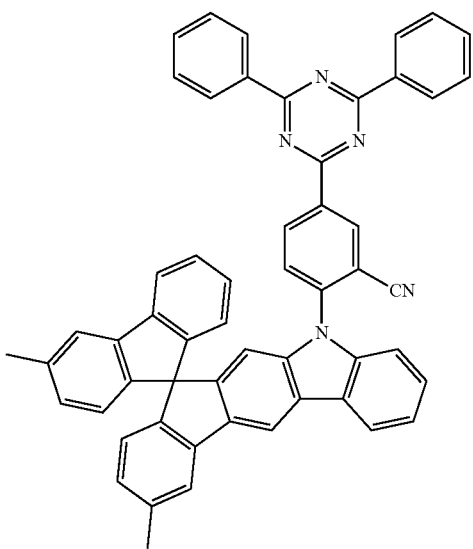
4
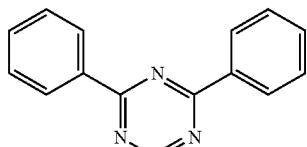
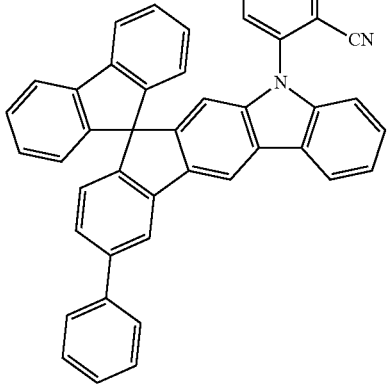
5
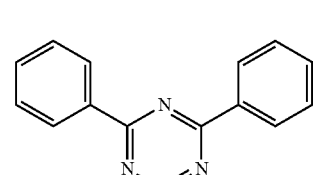
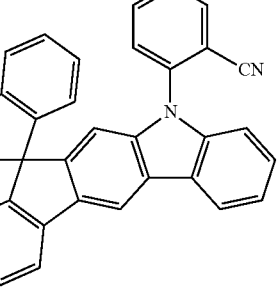

59
-continued
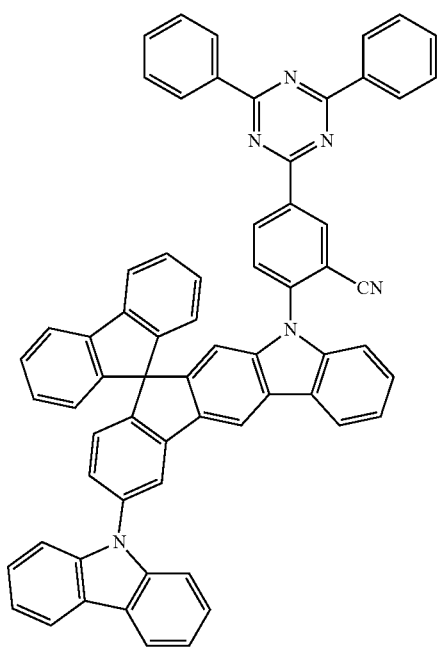
6
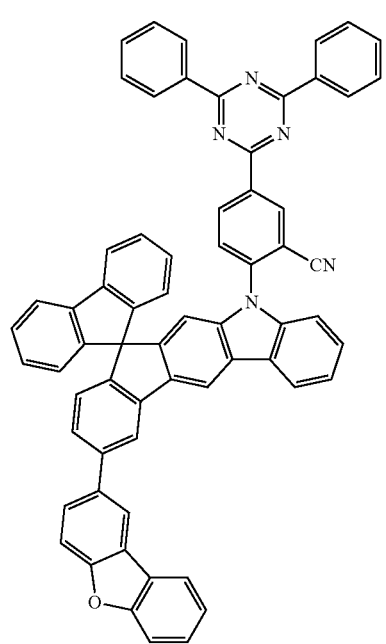
7
60
-continued
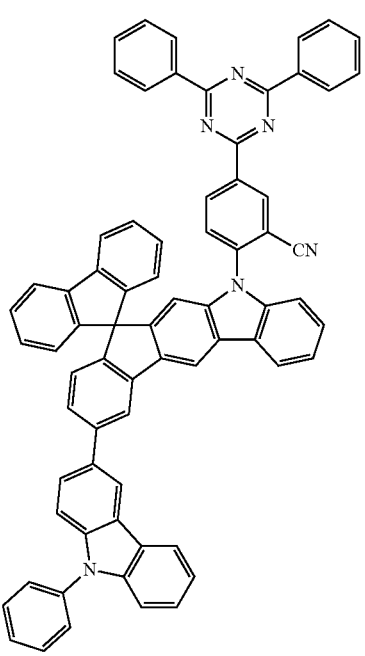
8
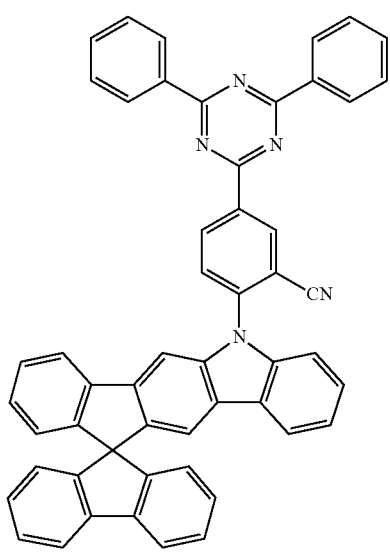
9

-continued
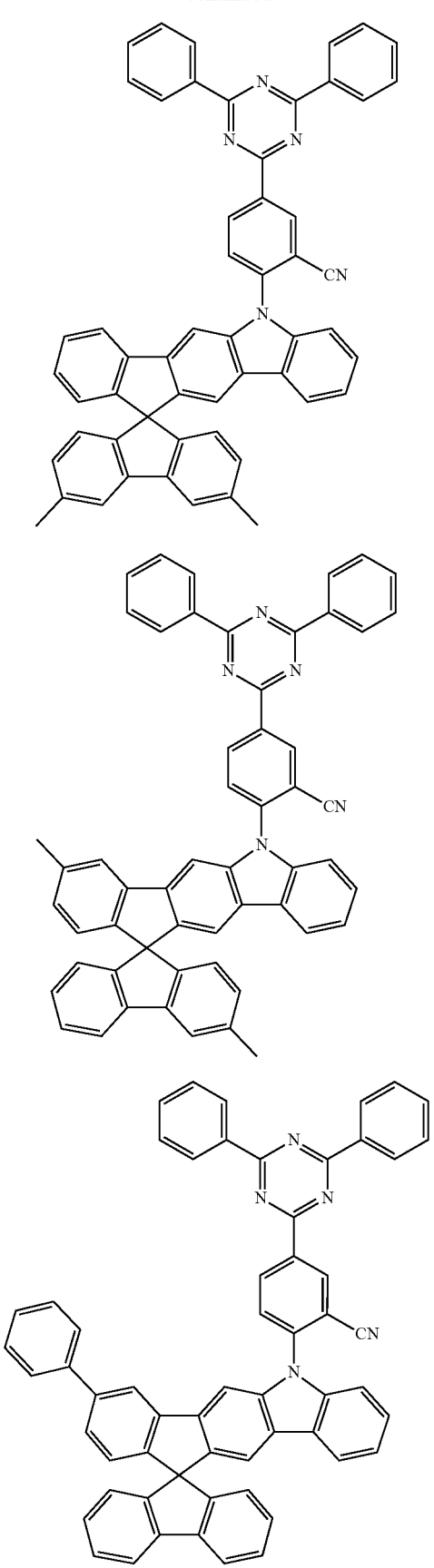
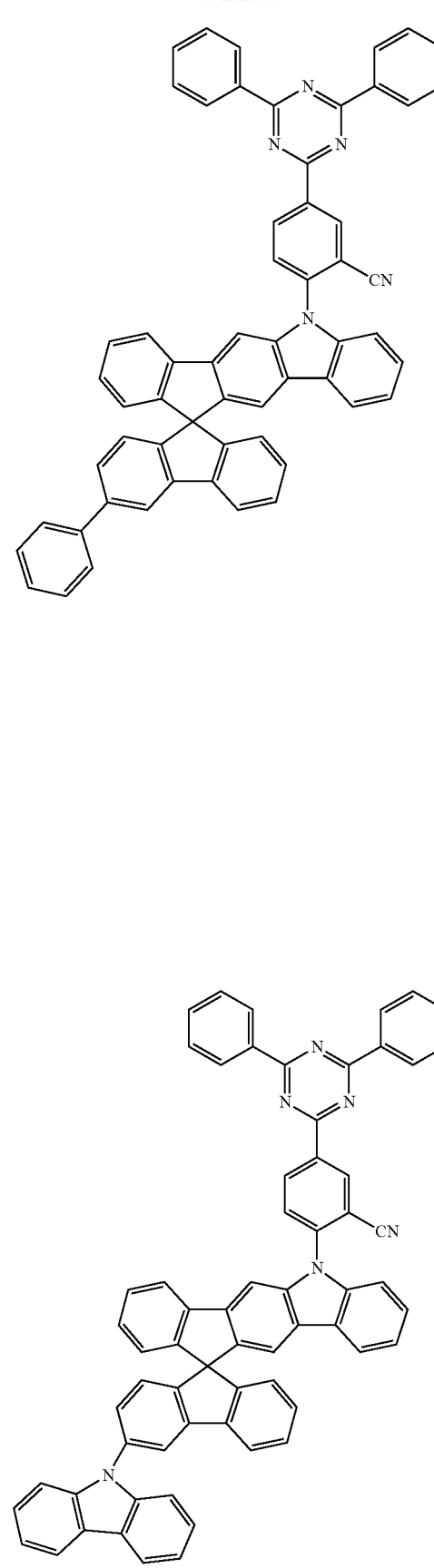

-continued

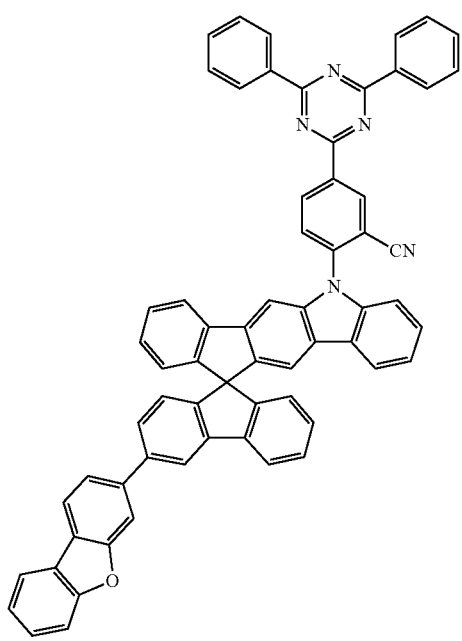

The phosphorescent dopant may be represented by Formula 5.

[Formula 5]

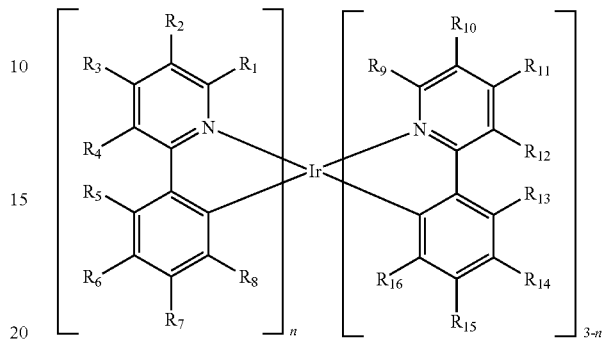

In Formula 5, each of $R_1$ to $R_{16}$ is independently selected from the group consisting of hydrogen (protium), deuterium, halogen, cyano, C1 to C10 alkyl, C1 to C10 alkoxy, C6 to C30 aryl and C5 to C30 heteroaryl. Adjacent two of $R_1$ to $R_{16}$ may form a fused ring, and n is an integer, e.g., between 1 and 3.

For example, the phosphorescent dopant may be one of Formula 6.

[Formula 6]

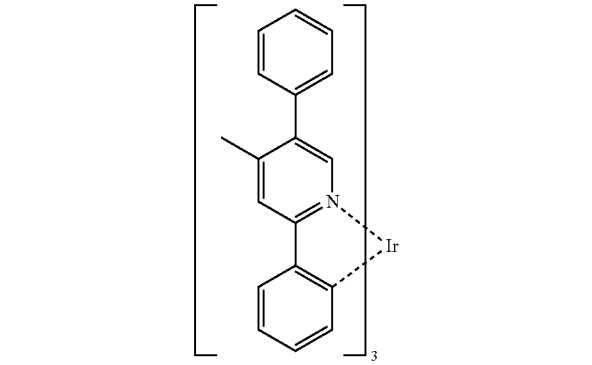

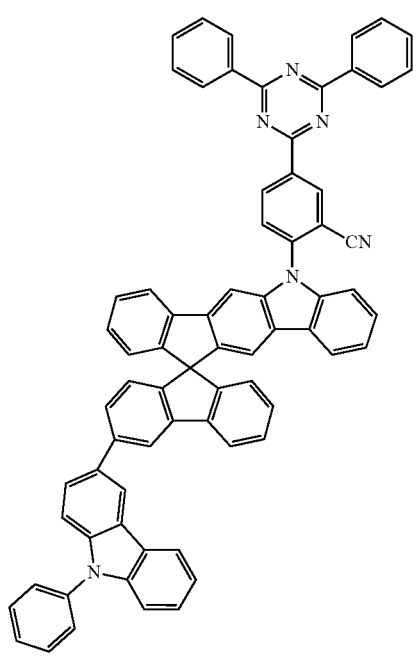

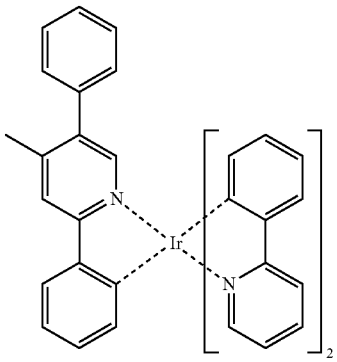

-continued
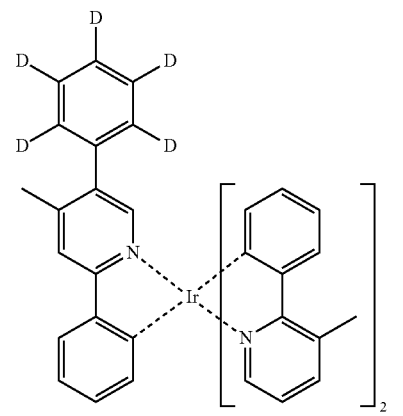
3
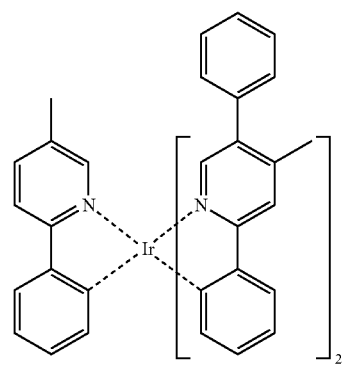
4
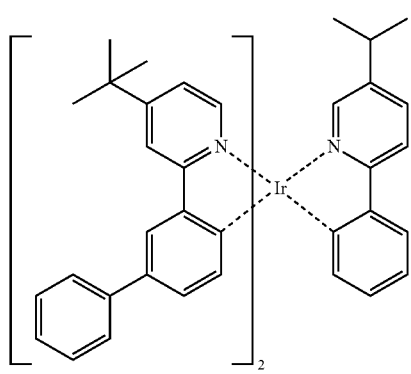
5
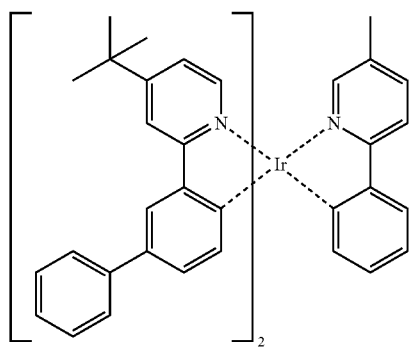
6
-continued
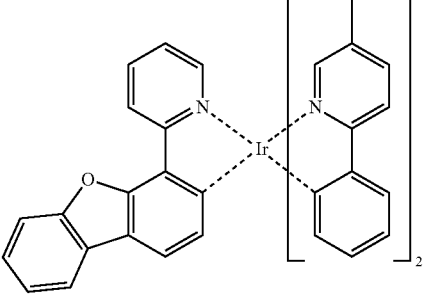
7
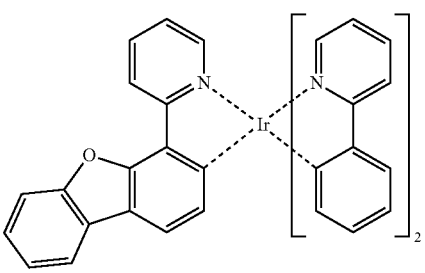
8
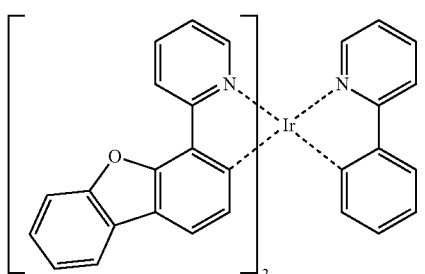
9
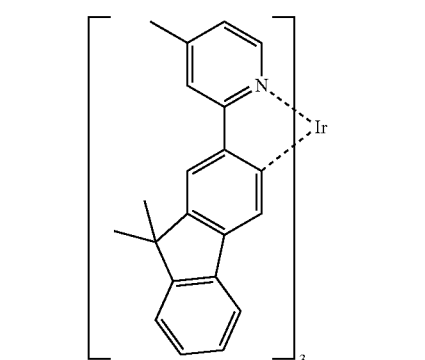
10
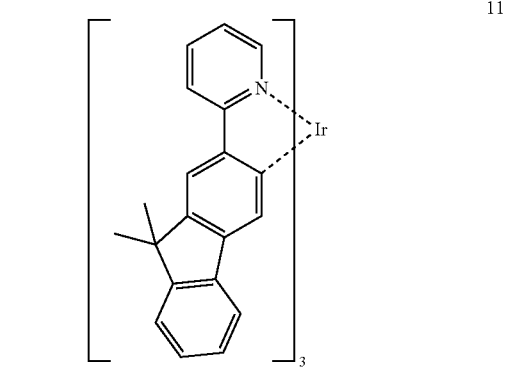
11

(2) Compound B

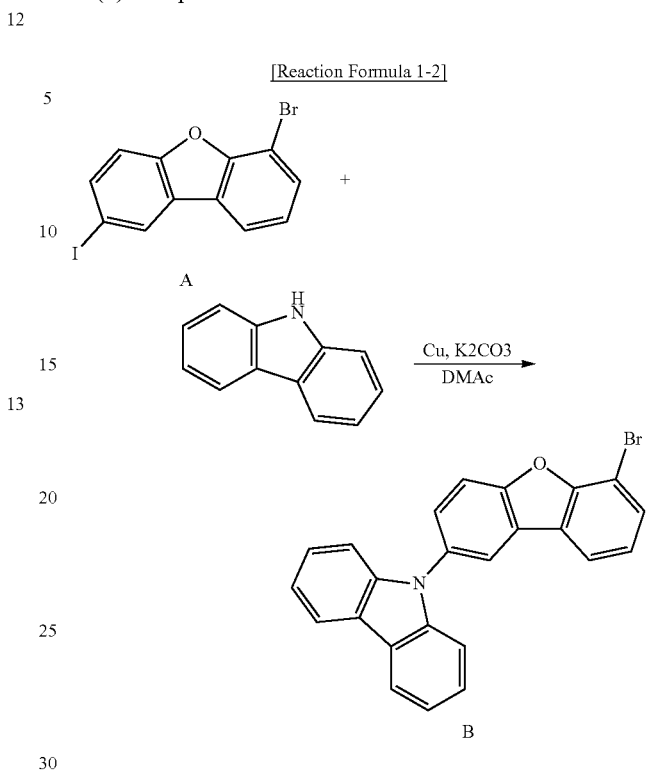

[Synthesis of P-Type Host]
1. Compound PH1
(1) Compound A

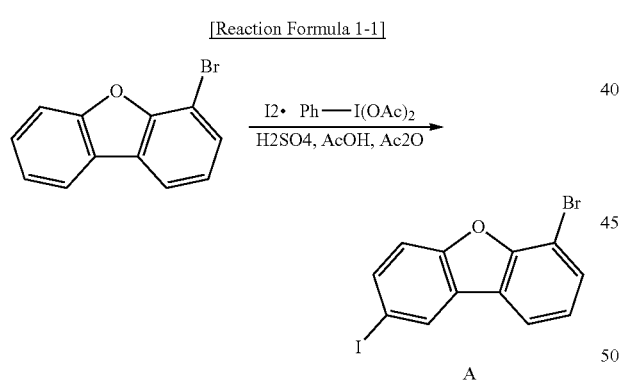

The compound A (9.8 g, 26.35 mmol), carbazole (2.2 g, 13.18 mmol), copper powder (2 g, 32.53 mmol) and potassium carbonate (3.6 g, 26.35 mmol) were put into dimethyl acetoamide (70 ml), and the mixture was stirred under the temperature of 130° C. for 24 hrs.

After completion of reaction, the mixture was cooled into the room temperature and was filtered using silica pad to remove copper powder. After the resultant was washed with water, anhydrous magnesium sulfate was added into the obtained organic layer, and the mixture was stirred. The mixture was filtered using silica pad and was concentrated under the reduced pressure. The mixture was refined such that the compound B (yield: 68%) was obtained.

(3) Compound PH1

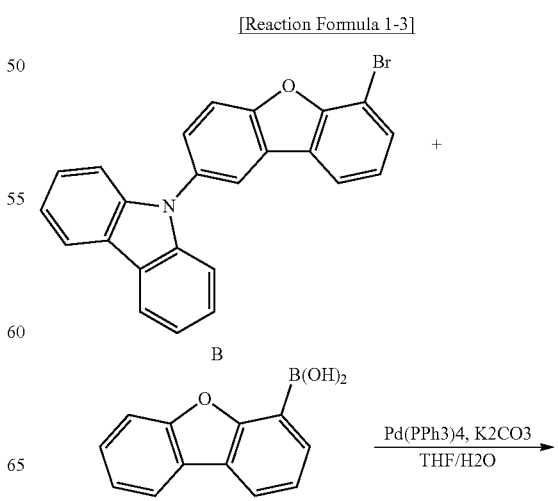

Under the N₂ condition, 4-bromo dibenzofuran (10 g, 40.65 mmol), iodine (5.1 g, 20.32 mmol) and phenyl iodide diacetate (6.6 g, 20.32 mmol) were put into a mixed solution of acetic acid (150 ml) and acetic anhydride (150 ml). Three drops of sulfuric acid were added into the mixed solution, and the mixed solution was stirred for 10 hrs. After completion of reaction, ethyl acetate was added into the mixed solution, and the mixed solution was washed by water. After separation of layers, anhydrous magnesium sulfate was added to the obtained organic layer, and the mixture was stirred. The mixture was filtered by using silica pad, and the resultant was concentrated under reduced-pressure. Then, the resultant was refined such that the compound A (yield: 65%) was obtained.

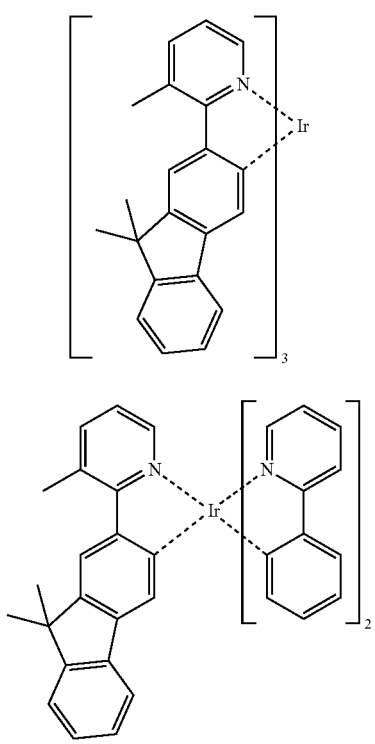

-continued

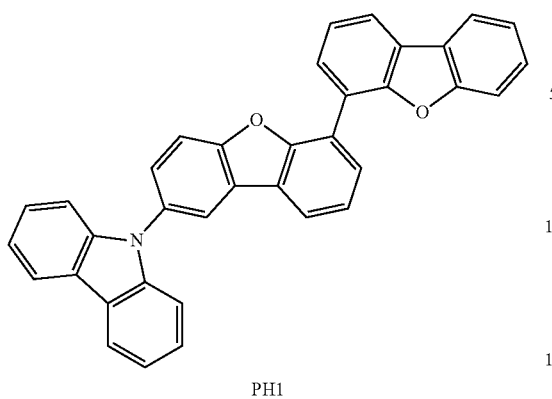

PH1

The compound B (8.4 g, 20.43 mmol), dibenzo[b,d]furan-4-ylboronic acid (4.76 g, 22.47 mmol) and tetrakis(triphenylphosphine)palladium (2 mol %) were put into tetrahydrofuran (50 ml), and potassium carbonate (40.86 mmol) dissolved in water (25 ml) was added. The mixture was stirred under the temperature of 80° C. for 12 hrs, and the reaction was completed. The water and the organic layer was separated from the mixture under the room temperature. Anhydrous magnesium sulfate was added into the obtained organic layer, and the mixture was stirred. The mixture was filtered using silica pad and was concentrated under the reduced pressure. The mixture was refined such that the compound PH1 (yield: 78%) was obtained.

2. Compound PH2

[Reaction Formula 2]

-continued

PH2

The compound B (8.4 g, 20.43 mmol) and dibenzo[b,d]furan-1-ylboronic acid (4.76 g, 22.47 mmol) were used in "Reaction Formula 1-3" such that the compound PH2 (yield: 57%) was obtained.

3. Compound PH3

[Reaction Formula 3]

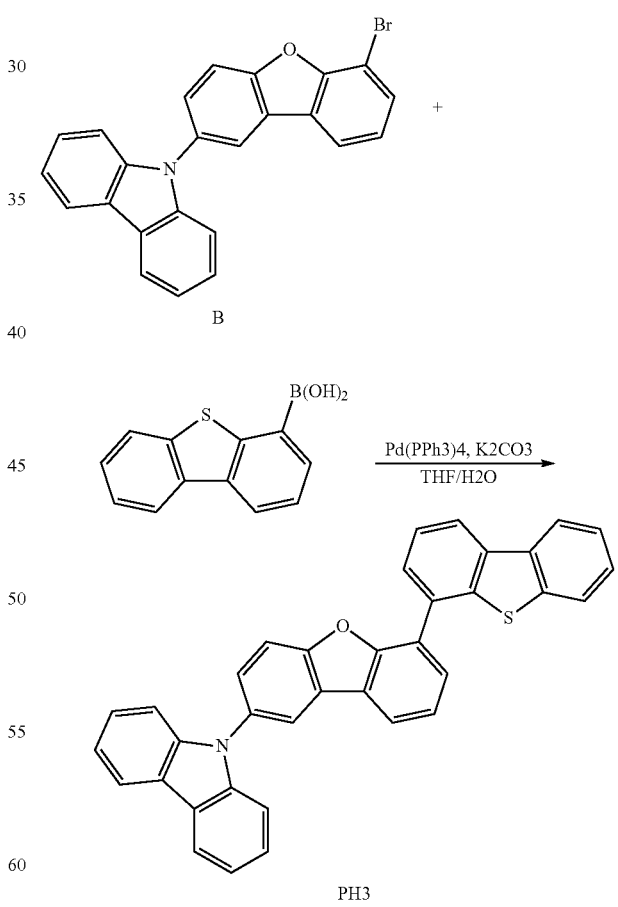

PH3

The compound B (8.4 g, 20.43 mmol) and dibenzo[b,d]thiophen-4-ylboronic acid (5.12 g, 22.47 mmol) were used in "Reaction Formula 1-3" such that the compound PH3 (yield: 62%) was obtained.

4. Compound PH4

(1) Compound C (2) Compound PH4

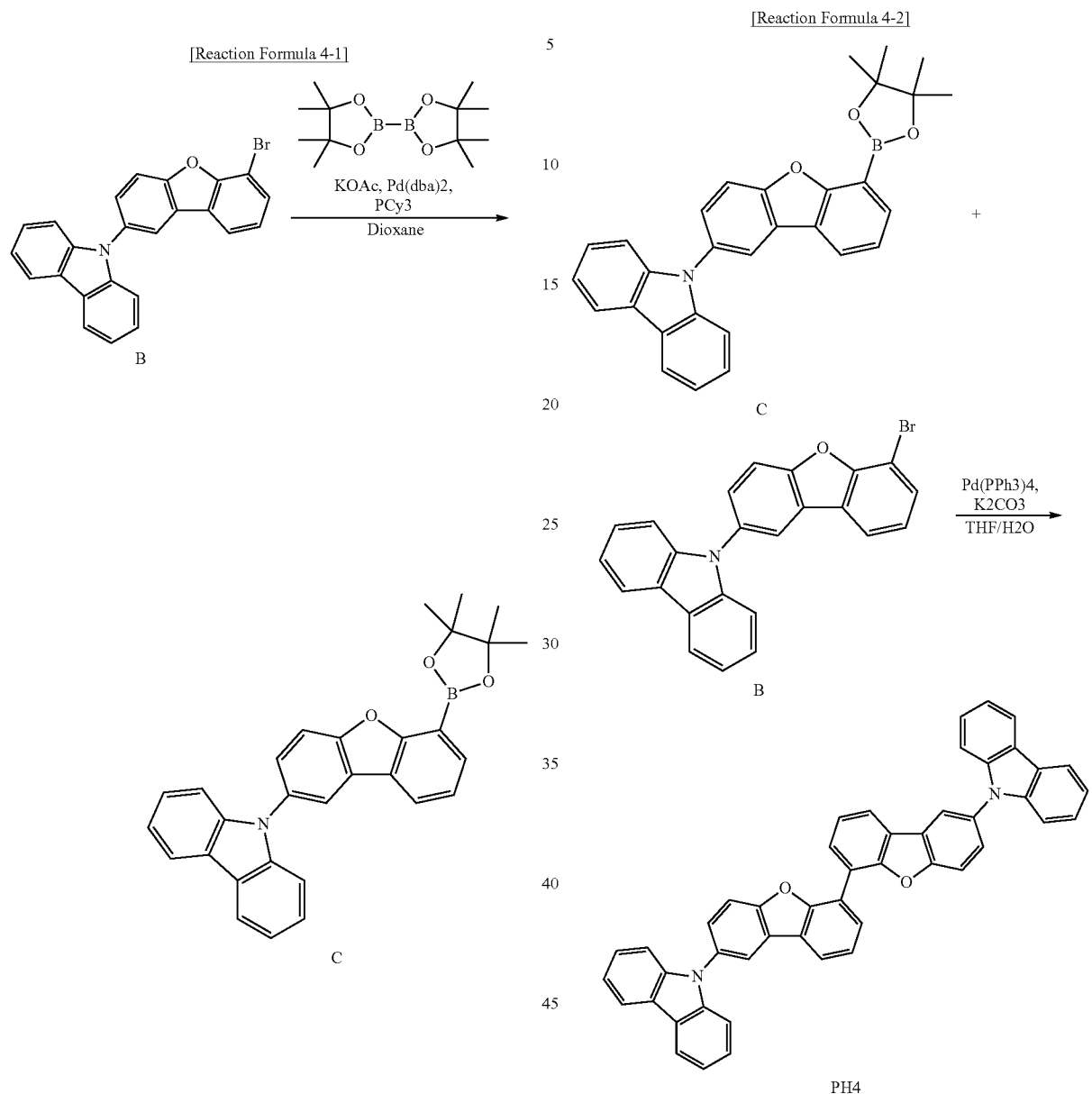

The compound B (5 g, 12.16 mmol), bis(pinacolato) diboron (3.7 g, 14.59 mmol), potassium acetate (2.39 g, 24.32 mmol), bis(dibenzylideneacetone)palladium (4 mol %) and tricyclohexylphosphine (0.27 g, 0.97 mmol) were put into dioxane (50 ml), and the mixture was stirred under the temperature of 100° C. for 12 hrs. After completion of reaction, the mixture was cooled into the room temperature. Anhydrous magnesium sulfate was added into the mixture, and the mixture was stirred. The mixture was filtered using silica pad and was concentrated under the reduced pressure. The mixture was refined such that the compound C (yield: 85%) was obtained.

The compound C (4.75 g, 10.34 mmol) and the compound B (4.25 g, 10.34 mmol) were used in "Reaction Formula 1-3" such that the compound PH4 (yield: 70%) was obtained.

5. Compound PH5

(1) Compound D

[Reaction Formula 5-1]

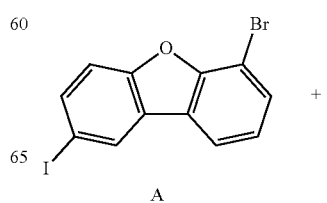

73

-continued

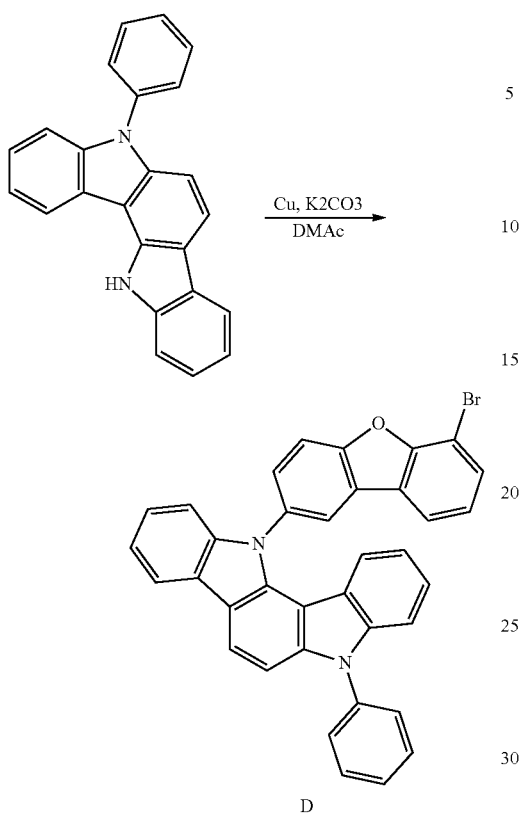

D

The compound A (5 g, 13.45 mmol) and 5-phenyl-5,12-dihydroindolo[3,2-a]carbazole (4.47 g, 13.45 mmol, Cas No. 1247053-55-9) were used in "Reaction Formula 1-2" such that the compound D (yield: 51%) was obtained.

(2) Compound PH5

[Reaction Formula 5-2]

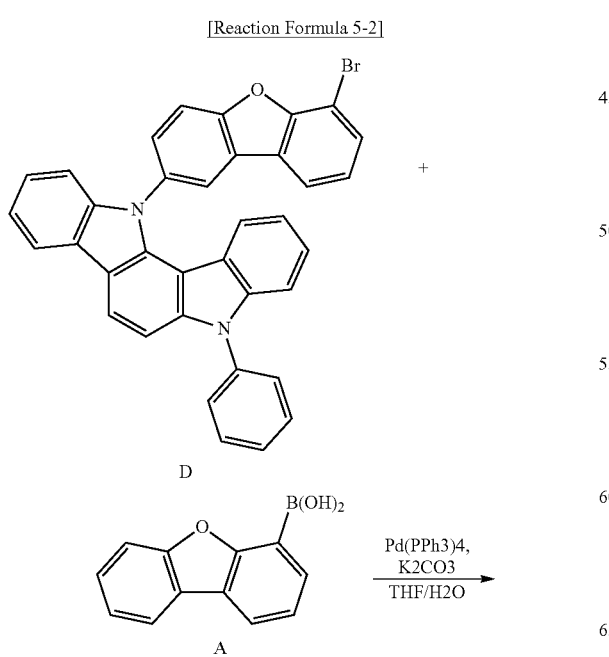

74

-continued

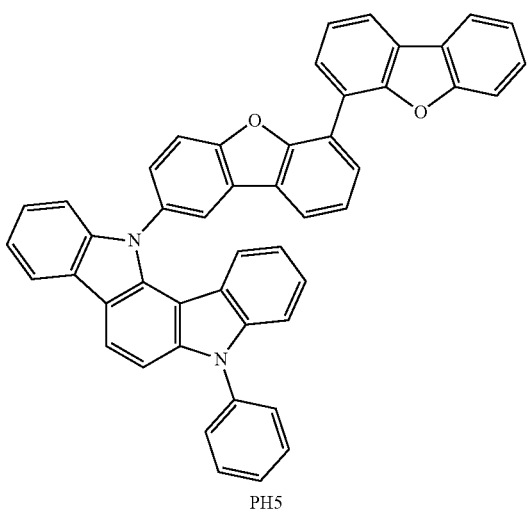

PH5

The compound D (4 g, 6.94 mmol) and dibenzo[b,d]furan-4-ylboronic acid (1.62 g, 7.63 mmol) were used in "Reaction Formula 1-3" such that the compound PH5 (yield: 64%) was obtained.

6. Compound PH6

[Reaction Formula 6]

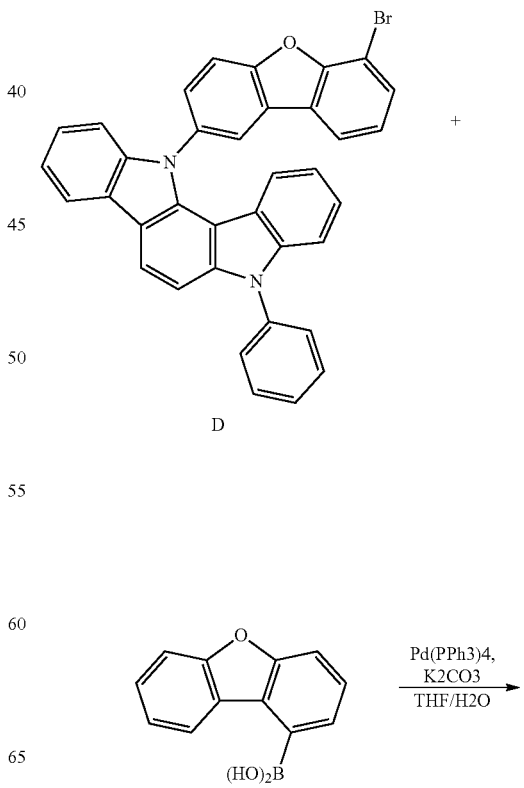

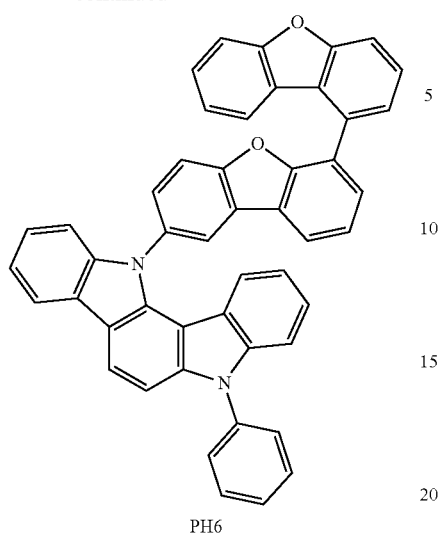
PH6
The compound D (4 g, 6.94 mmol) and dibenzo[b,d]furan-1-ylboronic acid (1.62 g, 7.63 mmol) were used in "Reaction Formula 1-3" such that the compound PH6 (yield: 60%) was obtained.
7. compound PH7
(1) Compound E
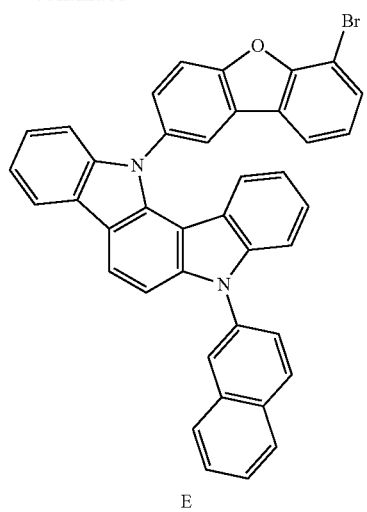
E
The compound A (5 g, 13.45 mmol) and 5-(naphthalen-2-yl)-5,12-dihydroindolo[3,2-a]carbazole (5.14 g, 13.45 mmol) were used in "Reaction Formula 1-2" such that the compound E (yield: 57%) was obtained.
(2) Compound PH7
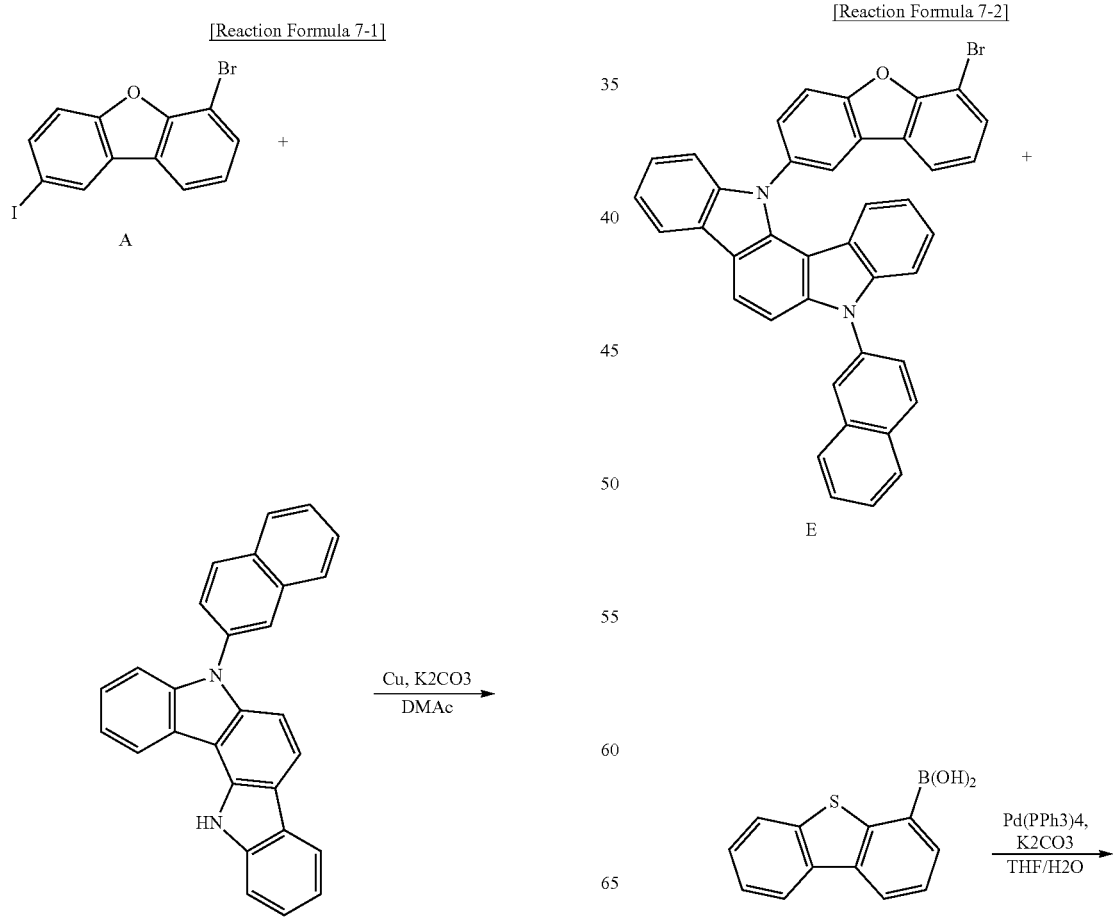

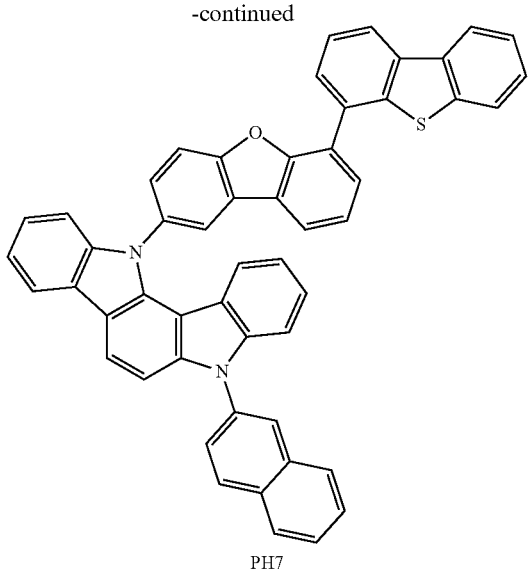

PH7

The compound E (4.8 g, 7.67 mmol) and dibenzo[b,d]thiophen-4-ylboronic acid (1.92 g, 8.44 mmol) were used in "Reaction Formula 1-3" such that the compound PH7 (yield: 60%) was obtained.

8. Compound PH8

(1) Compound F

[Reaction Formula 8-1]

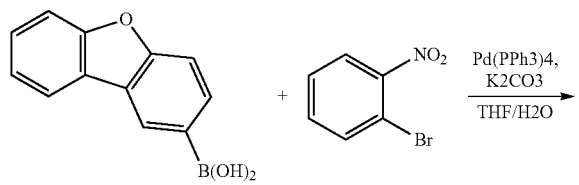

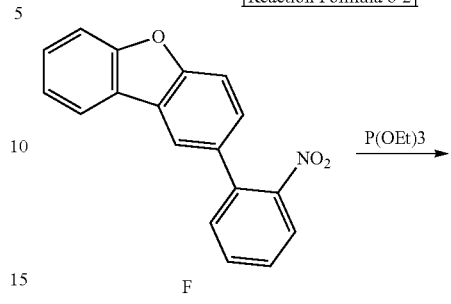

Dibenzo[b,d]furan-2-ylboronic acid (10 g, 47.16 mmol) and 1-bromo-2-nitrobenzene (9.48 g, 47.16 mmol) were used in "Reaction Formula 1-3" such that the compound F (yield: 78%) was obtained.

(2) Compound G

[Reaction Formula 8-2]

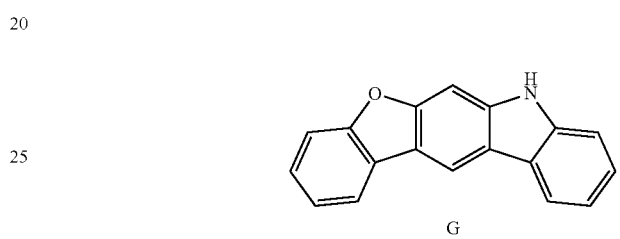

The compound F (10.6 g, 36.78 mmol) was put into triethyl phosphite (90 ml), and the mixture was refluxed and stirred for 10 hrs. The mixture was cooled into the room temperature and concentrated under the reduced pressure. The mixture was washed by water and extracted by ethyl acetate. Anhydrous magnesium sulfate was added into the obtained organic layer, and the mixture was stirred. The mixture was filtered using silica pad and was concentrated under the reduced pressure. The mixture was refined such that the compound G (yield: 66%) was obtained.

(3) Compound H

[Reaction Formula 8-3]

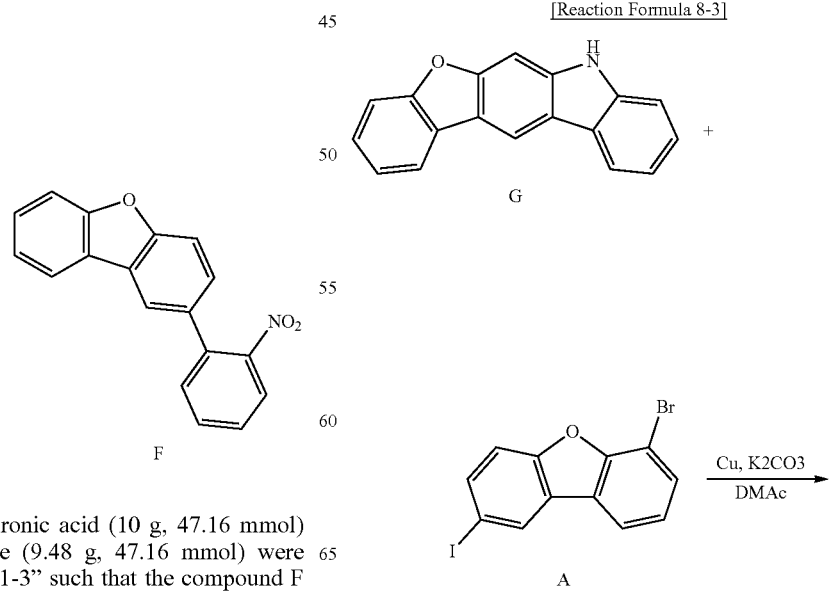

-continued

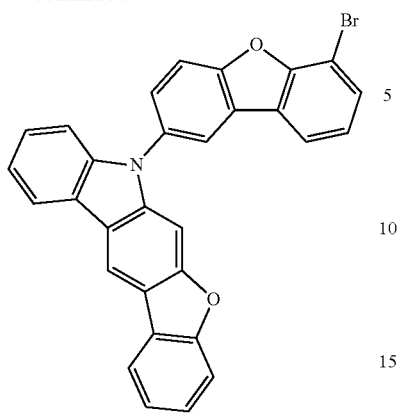

The compound G (6.24 g, 24.27 mmol) and the compound A (9.02 g, 24.27 mmol) were used in "Reaction Formula 1-2" such that the compound H (yield: 55%) was obtained.

(4) Compound PH8

[Reaction Formula 8-4]

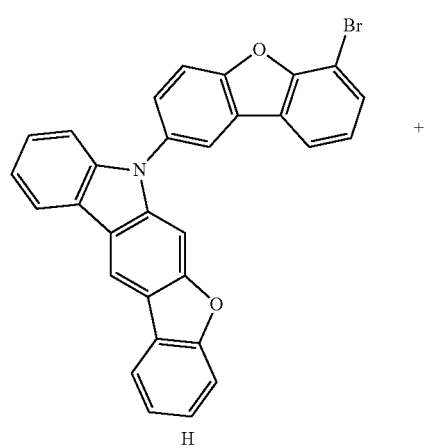

+

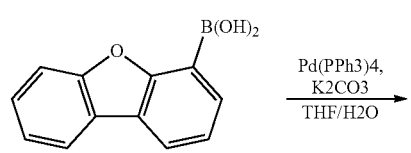

Pd(PPh3)4,
K2CO3
―――――→
THF/H2O

-continued

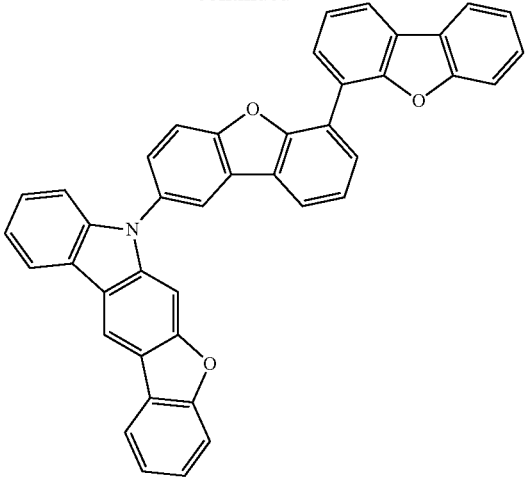

PH8

The compound H (6.69 g, 13.35 mmol) and dibenzo[b, d]furan-4-ylboronic acid (3.12 g, 14.69 mmol) were used in "Reaction Formula 1-3" such that the compound PH8 (yield: 72%) was obtained.

In the EML 240, a percentage by weight of the n-type host 244 may be equal to or greater than that of the p-type host 242. As a result, a recombination zone in the EML 240 may be shifted toward the first electrode 160, e.g., toward the EBL 230, such that the lifespan of the OLED D is further increased.

The percentage by weight of the phosphorescent dopant in the EML 240 may be about 1 to 5. For example, when the percentage by weight of the phosphorescent dopant is above 5, the concentration quenching problem may be generated such that the emitting efficiency and the lifespan of the OLED D may be decreased. However, in the OLED D of the present disclosure, the EML 240 includes the phosphorescent dopant having the percentage by weight of about 1 to 5 with the p-type host 242 and the n-type host 244, the decrease of the emitting efficiency and the lifespan of the OLED D is prevented.

As described above, the EML 240 of the OLED D in the present disclosure includes the p-type host 242, the n-type host 244 and the phosphorescent dopant. The energy level of the HOMO of the n-type host 244 is equal to or smaller (higher) than that of the p-type host 242 and is equal to or greater (lower) than that of the phosphorescent dopant. The difference between the energy level of the singlet state of the n-type host 244 and the energy level of the triplet state of the n-type host 244 is larger than 0.3 eV and smaller than 0.5 eV. As a result, the emitting efficiency and the lifespan of the OLED D and the organic light emitting display device 100 are improved.

In addition, the energy level of the LUMO of the phosphorescent dopant may be equal to or smaller (higher) than that of the n-type host 244 and may be equal to or greater (lower) than that of the p-type host 242. As a result, the emitting efficiency and the lifespan of the OLED D and the organic light emitting display device 100 are further improved.

Moreover, in the EML 240, the percentage by weight of the n-type host 244 may be equal to or greater than that of the p-type host 242, and the phosphorescent dopant may have the percentage by weight of about 1 to 5. As a result, the emitting efficiency and the lifespan of the OLED D and the organic light emitting display device 100 are further improved.

[OLED]

An HIL (the compound of Formula 7, 10 nm), an HTL (NPB (the compound of Formula 8), 75 nm), an EBL (m-CBP (the compound of Formula 9), 15 nm), an EML (35 nm), an EBL (B3PYMPM (the compound of Formula 10), 10 nm), an ETL (TPBi (the compound of Formula 11), 25 nm), an EIL (LiF), and a cathode (Al) are sequentially stacked on an anode (ITO, 50 nm).

[Formula 7]

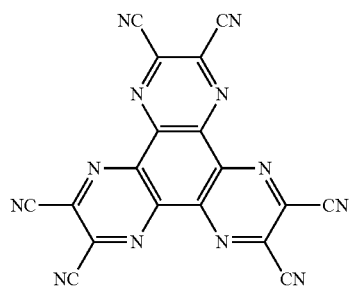

[Formula 8]

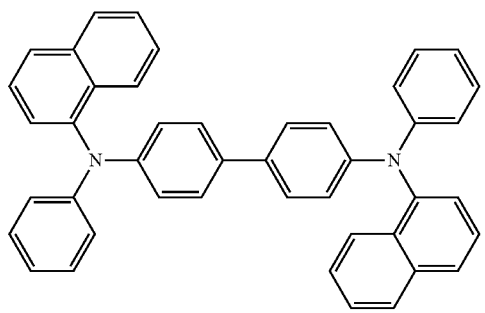

[Formula 9]

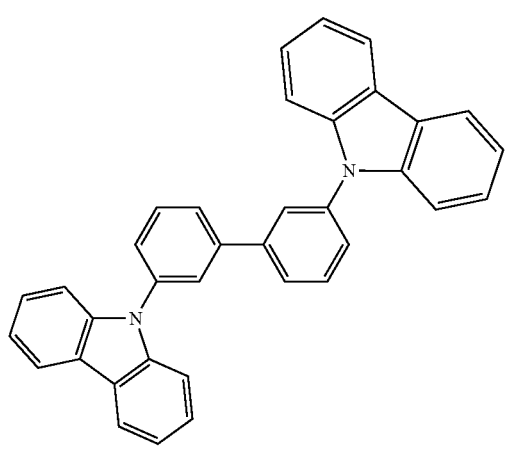

[Formula 10]

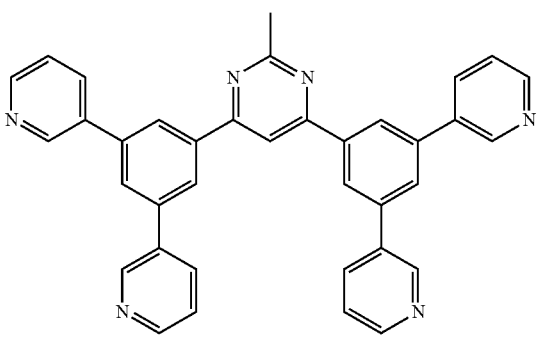

[Formula 11]

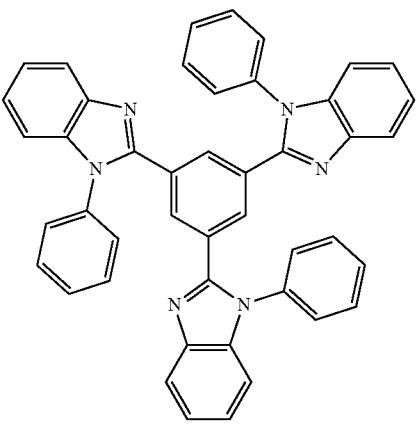

(1) Comparative Example 1 (Ref1)

The EML is formed by using the compound of Formula 12 as the p-type host, the compound of Formula 13 as the n-type host and the compound 1 of Formula 6 as the phosphorescent dopant.

(2) Comparative Example 2 (Ref2)

The EML is formed by using the compound PH1 as the p-type host, the compound of Formula 14 as the n-type host and the compound 1 of Formula 6 as the phosphorescent dopant.

(3) Comparative Example 3 (Ref3)

The EML is formed by using the compound PH4 as the p-type host, the compound of Formula 14 as the n-type host and the compound 1 of Formula 6 as the phosphorescent dopant.

(4) Comparative Example 4 (Ref4)

The EML is formed by using the compound PH4 as the p-type host, the compound of Formula 13 as the n-type host and the compound 1 of Formula 6 as the phosphorescent dopant.

(5) Example 1 (Ex1)

The EML is formed by using the compound PH1 as the p-type host, the compound 1 of Formula 4 as the n-type host and the compound 1 of Formula 6 as the phosphorescent dopant.

(6) Example 2 (Ex2)

The EML is formed by using the compound PH4 as the p-type host, the compound 9 of Formula 4 as the n-type host and the compound 1 of Formula 6 as the phosphorescent dopant.

(7) Example 3 (Ex3)

The EML is formed by using the compound PH1 as the p-type host, the compound 2 of Formula 4 as the n-type host and the compound 1 of Formula 6 as the phosphorescent dopant.

(8) Example 4 (Ex4)

The EML is formed by using the compound PH4 as the p-type host, the compound 10 of Formula 4 as the n-type host and the compound 1 of Formula 6 as the phosphorescent dopant.

In the OLED of Comparative Examples 1 to 4 and Examples 1 to 4, a weight percentage ratio of the p-type host to the n-type host is 1:1, and the phosphorescent dopant has a weight percentage of 5.

[Formula 12]

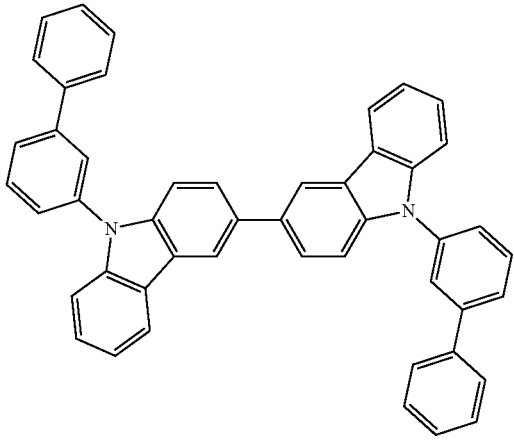

[Formula 13]

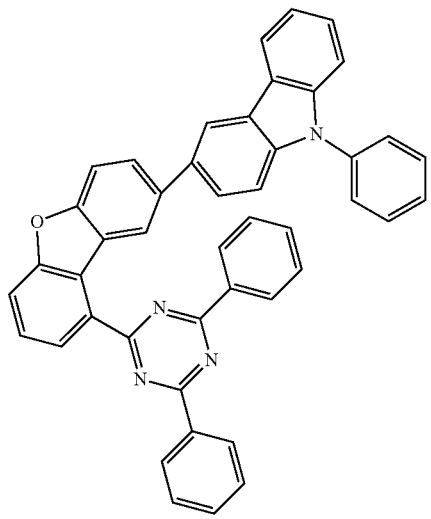

[Formula 14]

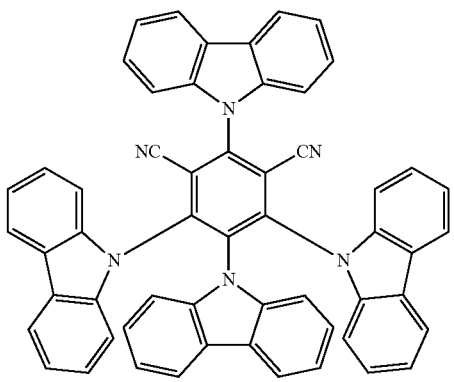

The energy level of the singlet state, the energy level of the triplet state and the difference between the energy level of the singlet state and the energy level of the triplet state of the n-type host used in Comparative Examples 1 to 4 and Examples 1 to 4 are measured and listed in Table 1.

TABLE 1

|  | S1 | T1 | $\Delta E_{ST}$ |
|---|---|---|---|
| Compound of Formula 13 | 2.85 | 2.30 | 0.55 |
| Compound of Formula 14 | 2.60 | 2.50 | 0.1 |
| Compound 1 of Formula 4 | 2.86 | 2.55 | 0.31 |
| Compound 9 of Formula 4 | 2.84 | 2.48 | 0.36 |
| Compound 2 of Formula 4 | 2.86 | 2.44 | 0.42 |
| Compound 10 of Formula 4 | 2.83 | 2.35 | 0.48 |

As shown in Table 1, in the compounds of Formula 4, the difference between the energy level of the singlet state and the energy level of the triplet state is greater than 0.3 eV and smaller than 0.5 eV.

The properties of the driving voltage (V), the current efficiency (cd/A), the power efficiency (1 m/W), the external quantum efficiency (EQE), the CIE color coordinate, the maximum emission wavelength ($\lambda_{max}$), and the lifespan (T95) in the OLEDs of Comparative Examples 1 to 4 and Examples 1 to 4 are measured and listed in Table 2.

TABLE 2

|  | V | cd/A | lm/W | EQE [%] | CIE X | CIE Y | $\lambda_{max}$ [nm] | FWHM [nm] | T95 @3000 nit |
|---|---|---|---|---|---|---|---|---|---|
| Ref 1 | 4.2 | 55 | 44 | 16 | 0.38 | 0.59 | 536 | 70 | 300 |
| Ref 2 | 4.3 | 37 | 26 | 11 | 0.46 | 0.55 | 541 | 80 | 200 |
| Ref 3 | 4.5 | 38 | 24 | 10 | 0.45 | 0.54 | 542 | 85 | 200 |
| Ref 4 | 4.6 | 34 | 22 | 8 | 0.38 | 0.58 | 525 | 70 | 50 |
| Ex 1 | 4.3 | 60 | 54 | 19 | 0.37 | 0.60 | 525 | 71 | 600 |
| Ex 2 | 4.3 | 61 | 55 | 19 | 0.37 | 0.60 | 525 | 71 | 400 |
| Ex 3 | 4.4 | 58 | 51 | 17 | 0.38 | 0.59 | 525 | 70 | 550 |
| Ex 4 | 4.4 | 59 | 51 | 18 | 0.38 | 0.60 | 525 | 70 | 500 |

As shown in Table 2, in comparison to the OLEDs of Comparative Examples 1 to 4, the OLEDs of Examples 1 to 4 has higher emitting efficiency and longer lifespan.

Referring to FIGS. 6A to 6H, which are schematic views illustrating an energy relation among a p-type host, an n-type delayed fluorescent host and a phosphorescent dopant in an emitting material layer of an OLED of Comparative Examples 1 to 4 and Examples 1 to 4, the emitting efficiency difference and the lifespan difference will be explained.

Figure 6A:
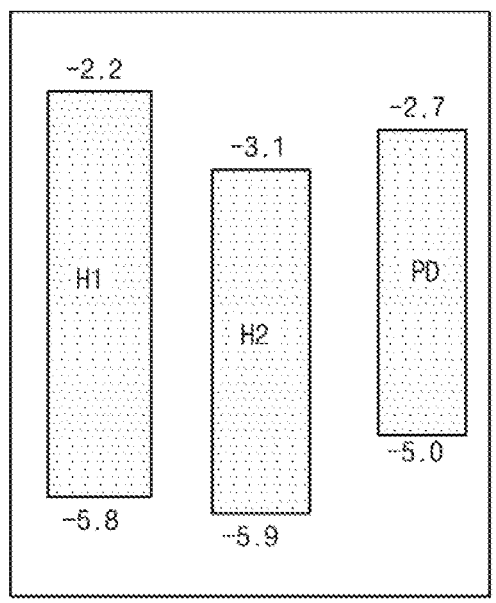
FIGS. 6A to 6H are schematic views illustrating an energy relation among a p-type host, an n-type delayed fluorescent host and a phosphorescent dopant in an emitting material layer of an OLED of Comparative Examples 1 to 4 and Examples 1 to 4.
Figure 6B:
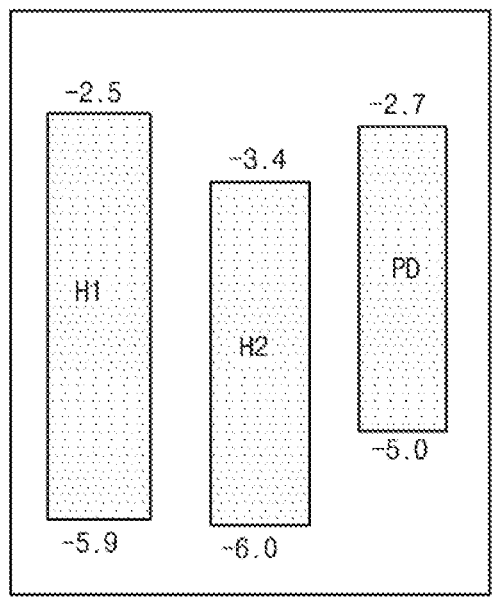

Referring to FIGS. 6A and 6B, in the OLED of Comparative Examples 1 and 2, the energy level of the HOMO of the n-type host H2 is lower than that of the p-type host H1. Namely, the OLED of Comparative Examples 1 and 2 does not satisfy the condition of '|HOMO$_{PH}$|≥|HOMO$_{NTH}$|' such that the emitting efficiency and the lifespan of the OLED are decreased.

Figure 6C:
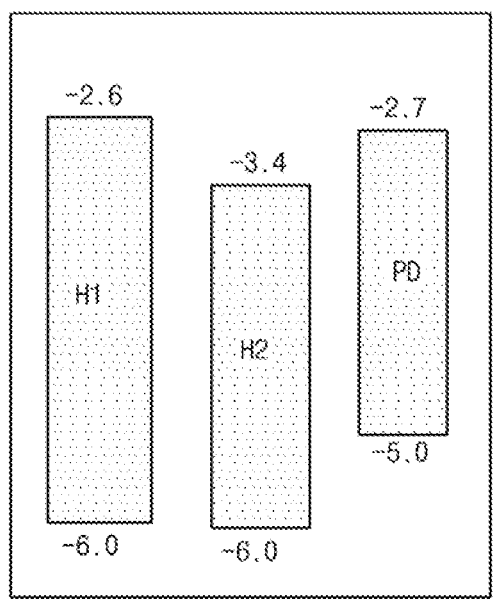
Figure 6D:
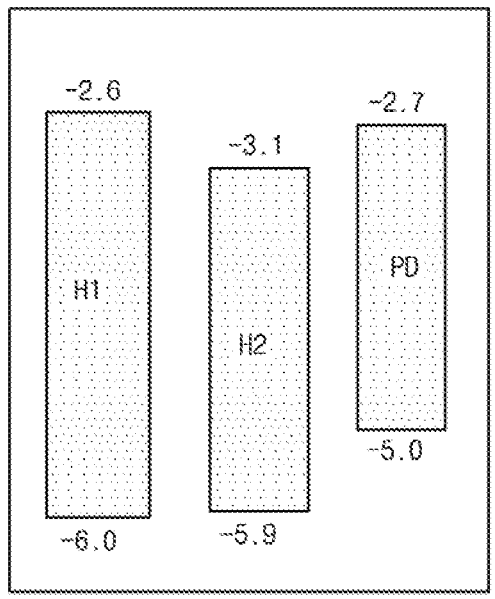
Figure 6E:
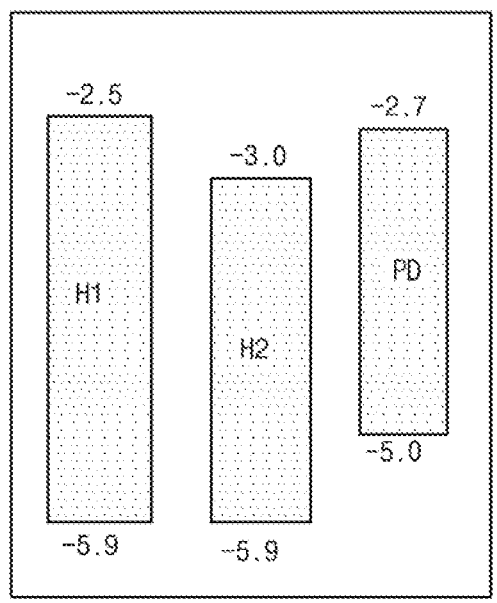
Figure 6F:
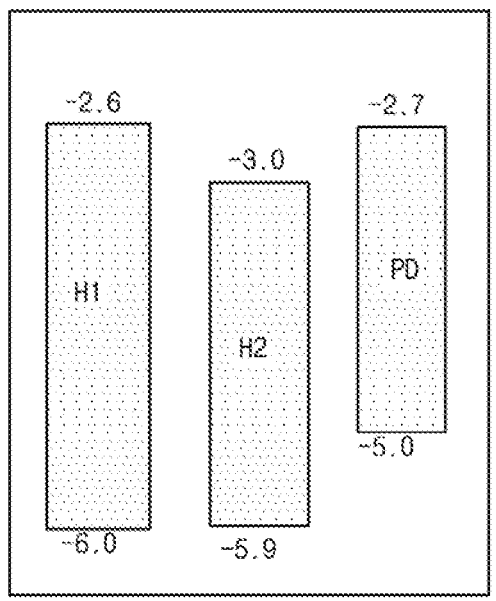
Figure 6G:
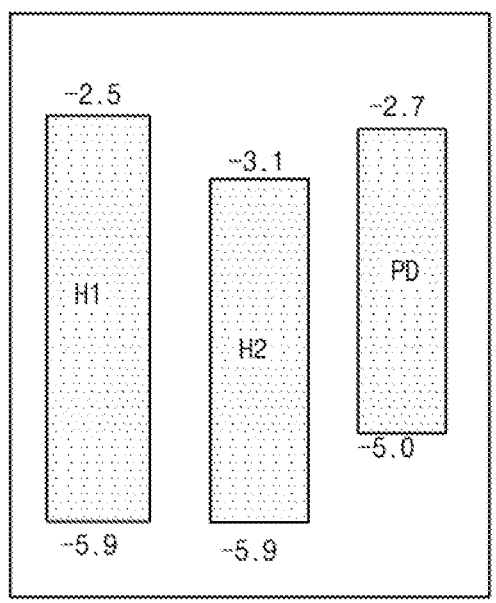
Figure 6H:
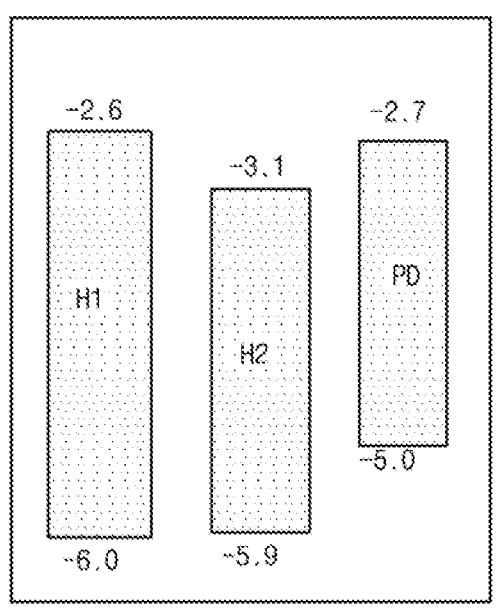

Referring to FIGS. 6C and 6D, the OLED of Comparative Examples 3 and 4 satisfy the above condition. However, in the OLED of Comparative Example 3, the difference ($\Delta E_{ST}$) between the energy level of the singlet state and the energy level of the triplet state is smaller than 0.3 eV. In the OLED of Comparative Example 4, the difference ($\Delta E_{ST}$) between the energy level of the singlet state and the energy level of the triplet state is greater than 0.5 eV. Namely, the OLED of Comparative Examples 3 and 4 does not satisfy the condition of '0.3<$\Delta E_{ST}$<0.5' such that the emitting efficiency and the lifespan of the OLED are decreased.

Referring to FIGS. 6E to 6H, the OLED of Examples 1 to 4 satisfy the condition of '|$HOMO_{PH}$|≥|$HOMO_{NTH}$|' and the condition of '0.3<$\Delta E_{ST}$<0.5' such that the emitting efficiency and the lifespan of the OLED are improved. In addition, the energy level of the LUMO of the phosphorescent dopant PD is lower than that of the p-type host H1 and higher than the n-type host H2, and the energy level of the HOMO of the phosphorescent dopant PD is higher than that of the p-type host H1 and that of the n-type host H2. As a result, the emitting efficiency and the lifespan of the OLED are further improved.

[OLED]

(1) Example 5

The EML is formed by using the compound PH1 as the p-type host, the compound 1 of Formula 4 as the n-type host and the compound 1 of Formula 6 as the phosphorescent dopant. A weight percentage ratio of the p-type host to the n-type host is 1:1, and the phosphorescent dopant has a weight percentage of 5.

(2) Example 6

The EML is formed by using the compound PH1 as the p-type host, the compound 1 of Formula 4 as the n-type host and the compound 1 of Formula 6 as the phosphorescent dopant. A weight percentage ratio of the p-type host to the n-type host is 1:2, and the phosphorescent dopant has a weight percentage of 5.

(3) Example 7

The EML is formed by using the compound PH1 as the p-type host, the compound 1 of Formula 4 as the n-type host and the compound 1 of Formula 6 as the phosphorescent dopant. A weight percentage ratio of the p-type host to the n-type host is 2:1, and the phosphorescent dopant has a weight percentage of 5.

(4) Example 8

The EML is formed by using the compound PH4 as the p-type host, the compound 9 of Formula 4 as the n-type host and the compound 1 of Formula 6 as the phosphorescent dopant. A weight percentage ratio of the p-type host to the n-type host is 1:1, and the phosphorescent dopant has a weight percentage of 5.

(5) Example 9

The EML is formed by using the compound PH4 as the p-type host, the compound 9 of Formula 4 as the n-type host and the compound 1 of Formula 6 as the phosphorescent dopant. A weight percentage ratio of the p-type host to the n-type host is 1:2, and the phosphorescent dopant has a weight percentage of 5.

(6) Example 10

The EML is formed by using the compound PH4 as the p-type host, the compound 9 of Formula 4 as the n-type host and the compound 1 of Formula 6 as the phosphorescent dopant. A weight percentage ratio of the p-type host to the n-type host is 2:1, and the phosphorescent dopant has a weight percentage of 5.

(7) Example 11

The EML is formed by using the compound PH1 as the p-type host, the compound 2 of Formula 4 as the n-type host and the compound 1 of Formula 6 as the phosphorescent dopant. A weight percentage ratio of the p-type host to the n-type host is 1:1, and the phosphorescent dopant has a weight percentage of 5.

(8) Example 12

The EML is formed by using the compound PH1 as the p-type host, the compound 2 of Formula 4 as the n-type host and the compound 1 of Formula 6 as the phosphorescent dopant. A weight percentage ratio of the p-type host to the n-type host is 1:2, and the phosphorescent dopant has a weight percentage of 5.

(9) Example 13

The EML is formed by using the compound PH1 as the p-type host, the compound 2 of Formula 4 as the n-type host and the compound 1 of Formula 6 as the phosphorescent dopant. A weight percentage ratio of the p-type host to the n-type host is 2:1, and the phosphorescent dopant has a weight percentage of 5.

The properties of the driving voltage (V), the current efficiency (cd/A), the power efficiency (1 m/W), the external quantum efficiency (EQE), the CIE color coordinate, the maximum emission wavelength ($\lambda_{max}$), and the lifespan (T95) in the OLEDs of Examples 5 to 13 are measured and listed in Table 3.

TABLE 3

|  | V | cd/A | lm/W | EQE [%] | CIE X | CIE Y | $\lambda_{max}$ [nm] | FWHM [nm] | T95 @3000 nit |
|---|---|---|---|---|---|---|---|---|---|
| Ex 5 | 4.3 | 60 | 54 | 19 | 0.37 | 0.60 | 525 | 71 | 600 |
| Ex 6 | 4.2 | 60 | 56 | 19 | 0.38 | 0.60 | 528 | 71 | 650 |
| Ex 7 | 4.3 | 60 | 54 | 19 | 0.38 | 0.60 | 524 | 70 | 550 |
| Ex 8 | 4.3 | 61 | 55 | 19 | 0.37 | 0.60 | 525 | 71 | 400 |
| Ex 9 | 4.3 | 61 | 55 | 18 | 0.37 | 0.61 | 530 | 71 | 500 |
| Ex 10 | 4.4 | 61 | 53 | 17 | 0.36 | 0.59 | 523 | 69 | 280 |
| Ex 11 | 4.4 | 58 | 51 | 17 | 0.38 | 0.59 | 525 | 70 | 550 |
| Ex 12 | 4.4 | 57 | 51 | 18 | 0.39 | 0.60 | 525 | 70 | 580 |
| Ex 13 | 4.5 | 59 | 50 | 17 | 0.38 | 0.59 | 525 | 69 | 480 |

As shown in Table 3, when the amount of the p-type host is greater than that of the n-type host, the lifespan of the OLED is decreased. Accordingly, in the EML of the OLED of the present disclosure, the amount (the percentage by weight) of the n-type host may be equal to or greater than that of the p-type host. For example, the n-type host and the p-type host may have a weight percentage ratio of about 1:1 to 2:1.

[OLED]

(1) Example 14

The EML is formed by using the compound PH1 as the p-type host, the compound 1 of Formula 4 as the n-type host and the compound 1 of Formula 6 as the phosphorescent dopant. A weight percentage ratio of the p-type host to the n-type host is 1:1, and the phosphorescent dopant has a weight percentage of 5.

(2) Example 15

The EML is formed by using the compound PH1 as the p-type host, the compound 1 of Formula 4 as the n-type host and the compound 1 of Formula 6 as the phosphorescent dopant. A weight percentage ratio of the p-type host to the n-type host is 1:1, and the phosphorescent dopant has a weight percentage of 10.

(3) Example 16

The EML is formed by using the compound PH1 as the p-type host, the compound 1 of Formula 4 as the n-type host and the compound 1 of Formula 6 as the phosphorescent dopant. A weight percentage ratio of the p-type host to the n-type host is 1:1, and the phosphorescent dopant has a weight percentage of 15.

(4) Example 17

The EML is formed by using the compound PH4 as the p-type host, the compound 9 of Formula 4 as the n-type host and the compound 1 of Formula 6 as the phosphorescent dopant. A weight percentage ratio of the p-type host to the n-type host is 1:1, and the phosphorescent dopant has a weight percentage of 5.

(5) Example 18

The EML is formed by using the compound PH4 as the p-type host, the compound 9 of Formula 4 as the n-type host and the compound 1 of Formula 6 as the phosphorescent dopant. A weight percentage ratio of the p-type host to the n-type host is 1:1, and the phosphorescent dopant has a weight percentage of 10.

(6) Example 19

The EML is formed by using the compound PH4 as the p-type host, the compound 9 of Formula 4 as the n-type host and the compound 1 of Formula 6 as the phosphorescent dopant. A weight percentage ratio of the p-type host to the n-type host is 1:1, and the phosphorescent dopant has a weight percentage of 15.

(7) Example 20

The EML is formed by using the compound PH1 as the p-type host, the compound 2 of Formula 4 as the n-type host and the compound 1 of Formula 6 as the phosphorescent dopant. A weight percentage ratio of the p-type host to the n-type host is 1:1, and the phosphorescent dopant has a weight percentage of 5.

(8) Example 21

The EML is formed by using the compound PH1 as the p-type host, the compound 2 of Formula 4 as the n-type host and the compound 1 of Formula 6 as the phosphorescent dopant. A weight percentage ratio of the p-type host to the n-type host is 1:1, and the phosphorescent dopant has a weight percentage of 10.

(9) Example 22

The EML is formed by using the compound PH1 as the p-type host, the compound 2 of Formula 4 as the n-type host and the compound 1 of Formula 6 as the phosphorescent dopant. A weight percentage ratio of the p-type host to the n-type host is 1:1, and the phosphorescent dopant has a weight percentage of 15.

The properties of the driving voltage (V), the current efficiency (cd/A), the power efficiency (1 mW), the external quantum efficiency (EQE), the CIE color coordinate, the maximum emission wavelength ($\lambda_{max}$), and the lifespan (T95) in the OLEDs of Examples 14 to 22 are measured and listed in Table 4.

TABLE 4

|  | V | cd/A | lm/W | EQE [%] | CIE X | CIE Y | $\lambda_{max}$ [nm] | FWHM [nm] | T95 @3000 nit |
|---|---|---|---|---|---|---|---|---|---|
| Ex 14 | 4.3 | 60 | 54 | 19 | 0.37 | 0.60 | 525 | 71 | 600 |
| Ex 15 | 4.2 | 60 | 56 | 18 | 0.37 | 0.60 | 525 | 70 | 550 |
| Ex 16 | 4.3 | 60 | 54 | 17 | 0.37 | 0.60 | 525 | 70 | 500 |
| Ex 17 | 4.3 | 61 | 55 | 19 | 0.37 | 0.60 | 525 | 71 | 400 |
| Ex 18 | 4.3 | 61 | 55 | 18 | 0.37 | 0.60 | 525 | 71 | 300 |
| Ex 19 | 4.4 | 61 | 53 | 16 | 0.37 | 0.60 | 525 | 70 | 320 |
| Ex 20 | 4.4 | 58 | 51 | 17 | 0.38 | 0.59 | 525 | 70 | 550 |
| Ex 21 | 4.4 | 57 | 51 | 17 | 0.38 | 0.59 | 525 | 69 | 500 |
| Ex 22 | 4.5 | 59 | 50 | 15 | 0.38 | 0.59 | 525 | 71 | 520 |

As shown in Table 4, as the percentage by weight of the phosphorescent dopant is increased, the emitting efficiency and the lifespan of the OLED are decreased. In the EML of the OLED of the present disclosure, the phosphorescent dopant may have a percentage by weight of about 1 to 5.

As described above, the EML 240 of the OLED D in the present disclosure includes the p-type host 242, the n-type host 244 and the phosphorescent dopant. The energy level of the HOMO of the n-type host 244 is equal to or smaller (higher) than that of the p-type host 242 and is equal to or greater (lower) than that of the phosphorescent dopant. The difference between the energy level of the singlet state of the n-type host 244 and the energy level of the triplet state of the n-type host 244 is larger than 0.3 eV and smaller than 0.5 eV.

In addition, the energy level of the LUMO of the phosphorescent dopant may be equal to or smaller (higher) than that of the n-type host 244 and may be equal to or greater (lower) than that of the p-type host 242.

Moreover, in the EML 240, the percentage by weight of the n-type host 244 may be equal to or greater than that of the p-type host 242, and the phosphorescent dopant may have the percentage by weight of about 1 to 5.

As a result, the emitting efficiency and the lifespan of the OLED D and the organic light emitting display device 100 are improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode, comprising:

a first electrode;

a second electrode facing the first electrode; and an emitting material layer including a p-type host, a n-type host and a phosphorescent dopant, the emitting material layer positioned between the first electrode and the second electrode, wherein the n-type host is represented by Formula 2-1 or Formula 2-2:

[Formula 2-1]

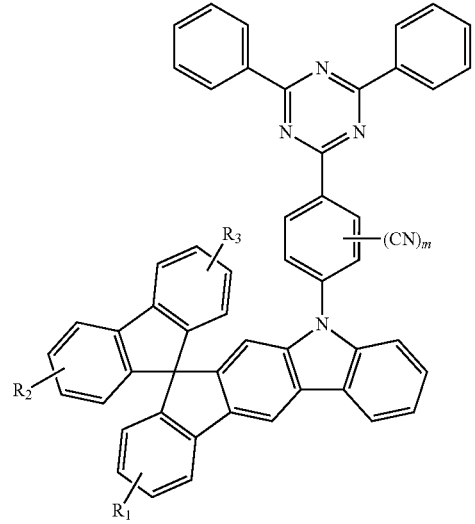

-continued

[Formula 2-2]

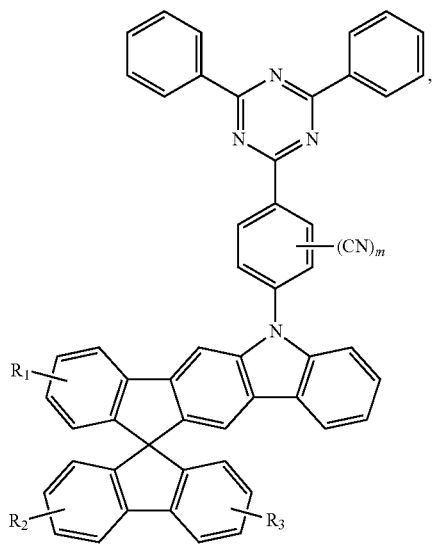

[Formula 1-2]

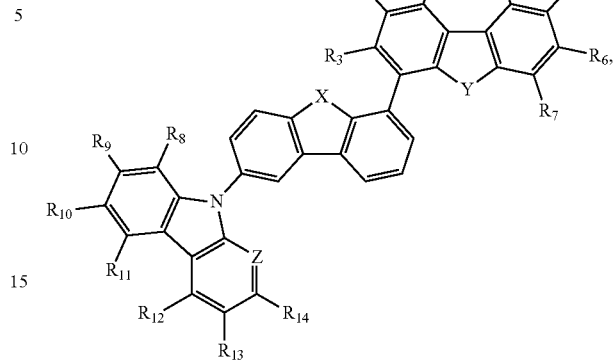

wherein each of X and Y is independently selected from the group consisting of oxygen and sulfur, and Z is N or $CR_{15}$, wherein each of $R_1$ to $R_{15}$ in Formula 1-1 or Formula 1-2 is independently selected from the group consisting of protium, deuterium, alkylsilyl, arylsilyl, C1 to C10 alkyl, C1 to C10 alkoxy, C6 to C30 aryl, C5 to C30 heteroaryl, alkylamine, heteroarylamine and arylamine, or adjacent two of $R_1$ to $R_{15}$ may form a fused ring;

wherein the phosphorescent dopant is represented by Formula 3:

[Formula 3]

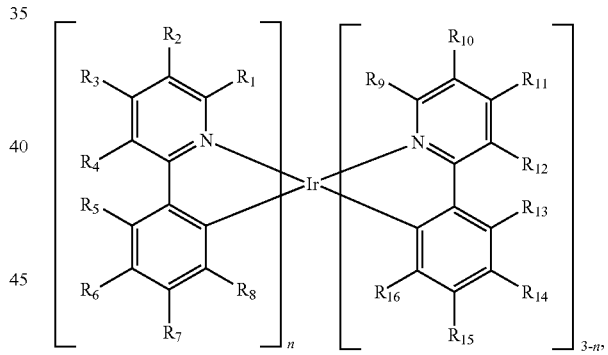

wherein each of $R_1$ to $R_3$ in Formula 2-1 or Formula 2-2 is independently selected from the group consisting of protium, deuterium, C1 to C10 alkyl, C6 to C30 aryl and C5 to C30 heteroaryl, and m is an integer of 0 to 4;

wherein the p-type host is represented by Formula 1-1 or Formula 1-2:

[Formula 1-1]

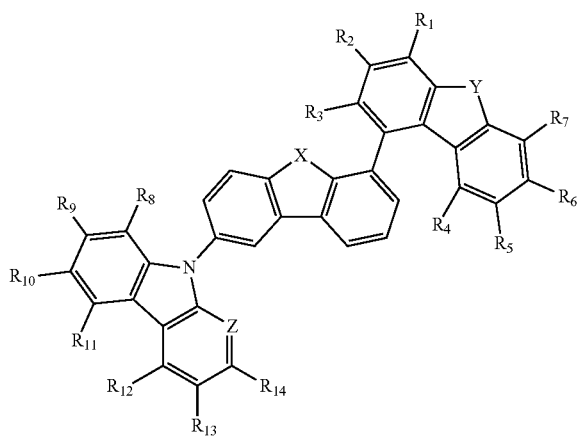

wherein each of $R_1$ to $R_{16}$ in Formula 3 is independently selected from the group consisting of protium, deuterium, halogen, cyano, C1 to C10 alkyl, C1 to C10 alkoxy, C6 to C30 aryl and C5 to C30 heteroaryl, or adjacent two of $R_1$ to $R_{16}$ may form a fused ring, and n is an integer between 1 and 3.

2. The organic light emitting diode of claim 1, wherein a percentage by weight of the n-type host is equal to or greater than a percentage by weight of the p-type host.

3. The organic light emitting diode of claim 1, wherein the phosphorescent dopant is 1% to 5% by weight in the emitting material layer.

4. The organic light emitting diode of claim 1, wherein a first energy level of a lowest unoccupied molecular orbital (LUMO) of the p-type host is higher than a second energy level of the LUMO of the n-type host.

5. The organic light emitting diode of claim 4, wherein a third energy level of the LUMO of the phosphorescent dopant is lower than the first energy level of the LUMO and is higher than the second energy level of the LUMO.

6. The organic light emitting diode of claim 1, wherein a third energy level of the HOMO of the phosphorescent dopant is equal to or higher than the second energy level of the HOMO.

7. The organic light emitting diode of claim 1, wherein the n-type host is a compound selected from:

1
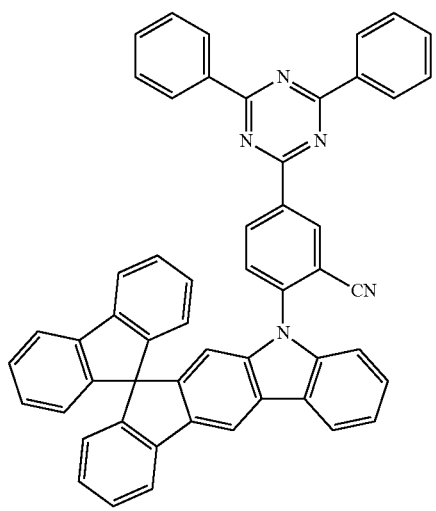

2
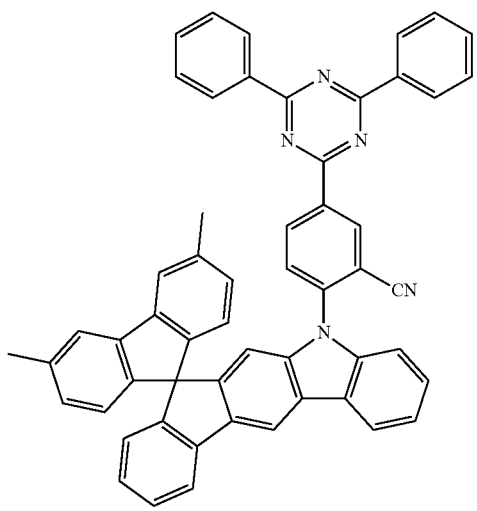

-continued

3
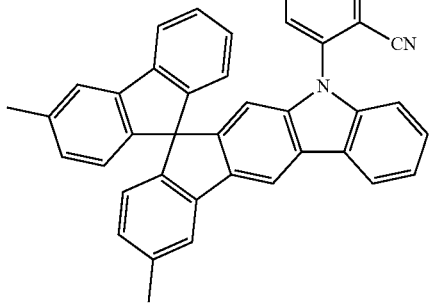

4
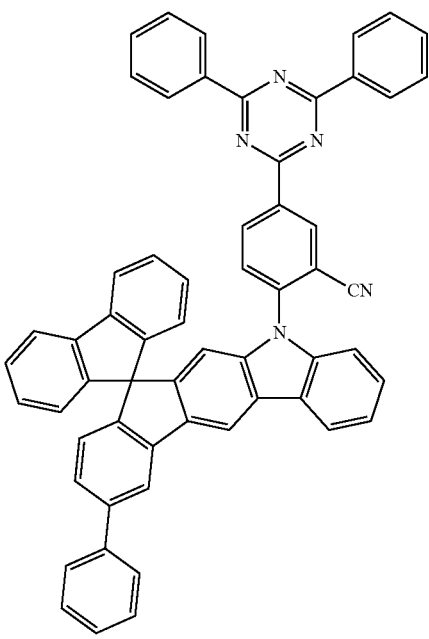

93
-continued
5
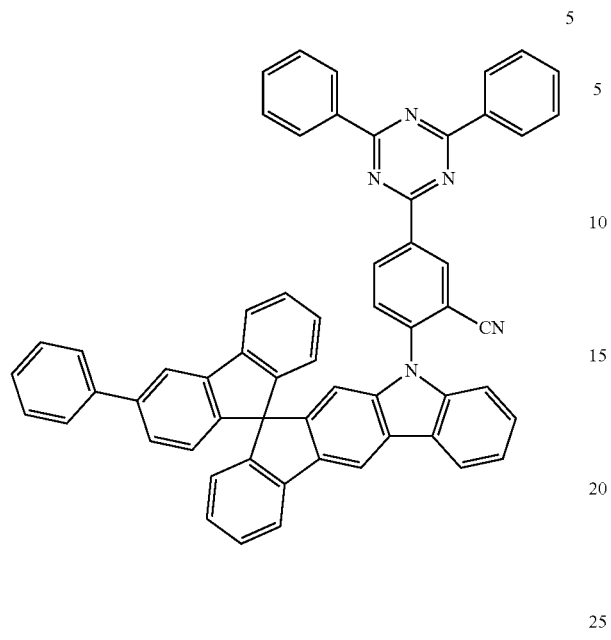
7
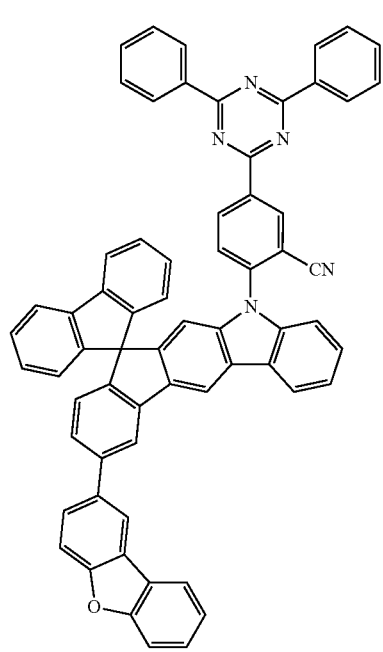
6
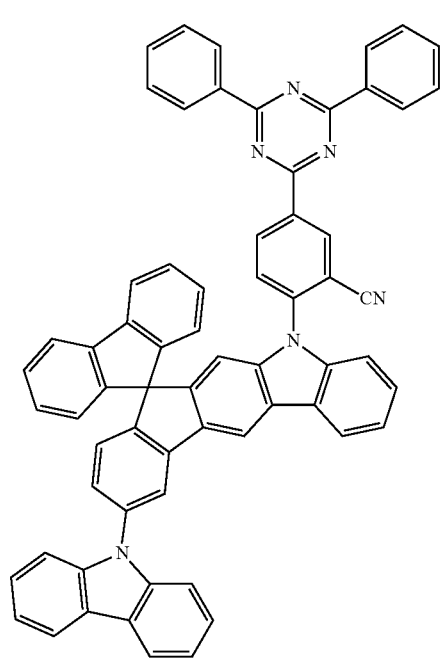
94
-continued
8
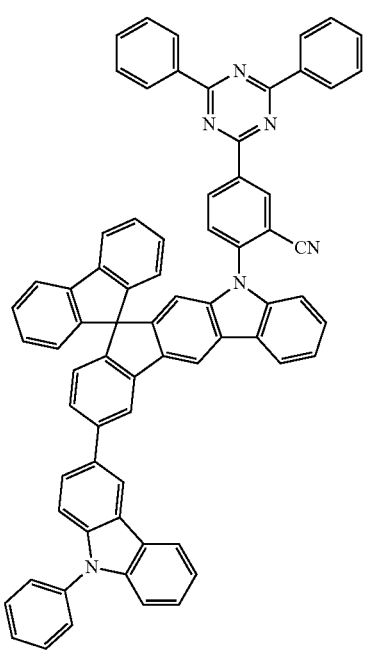

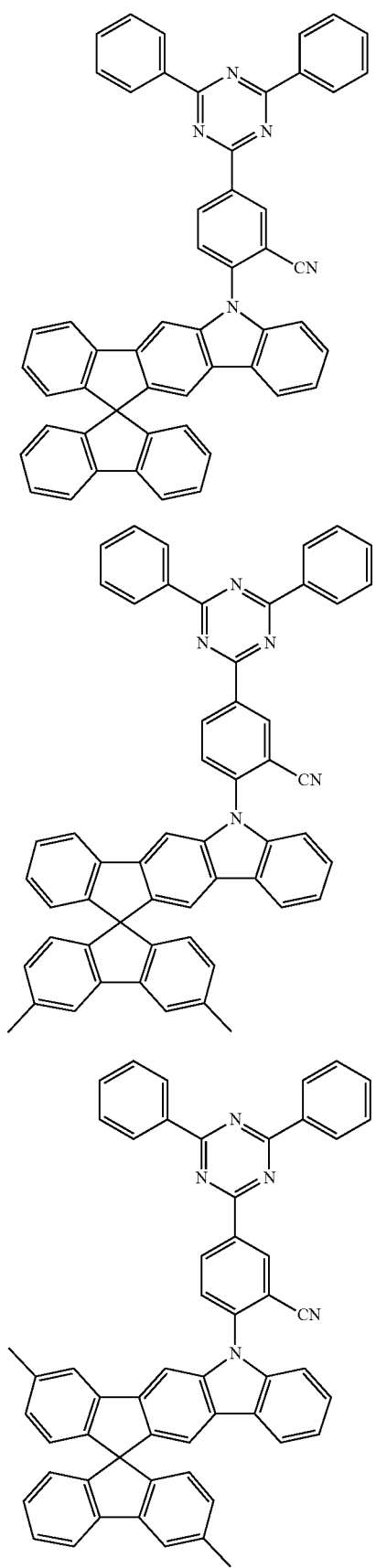
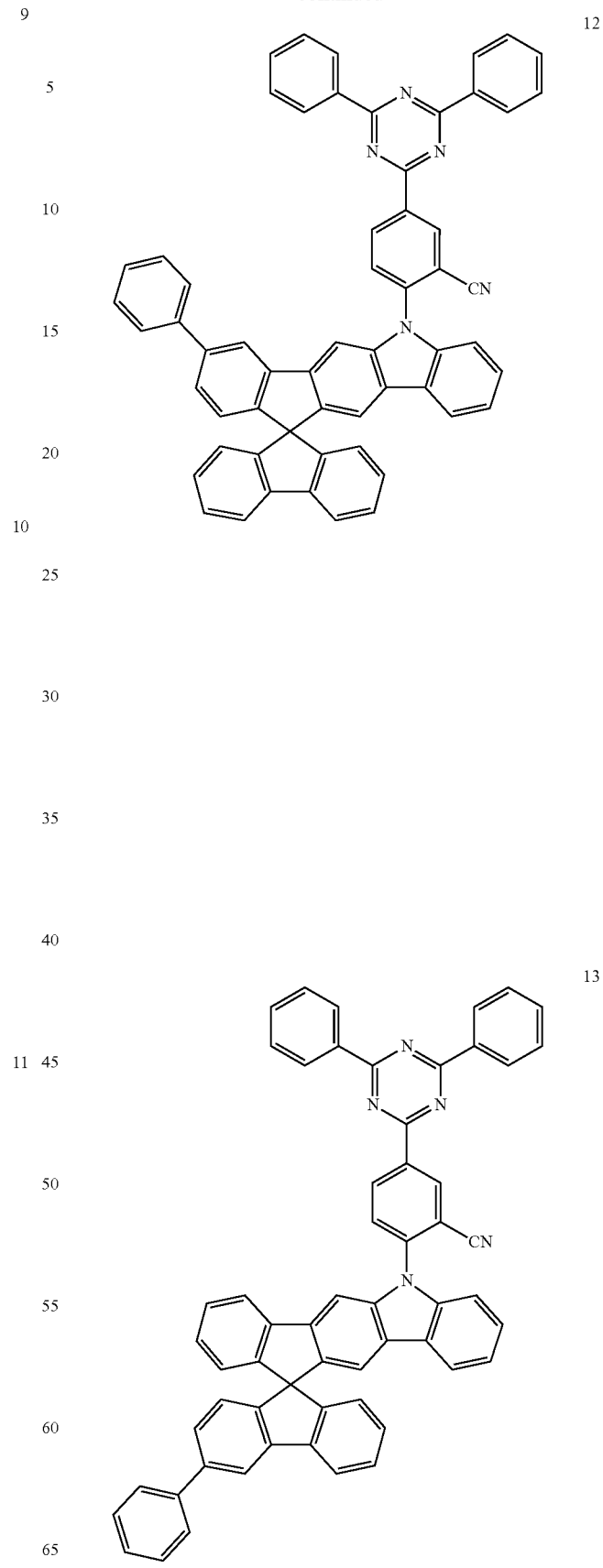

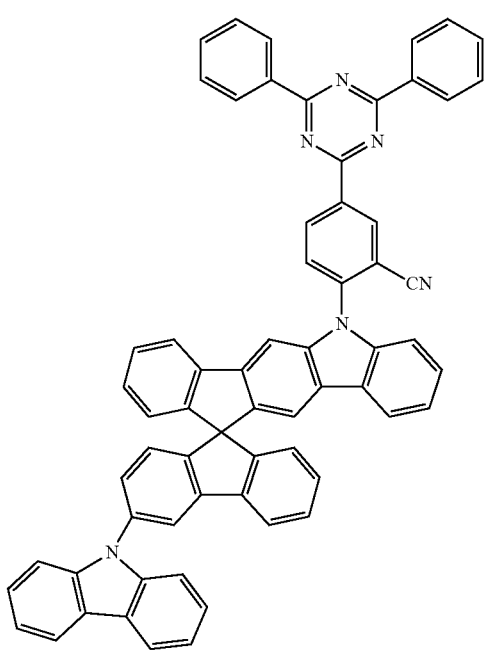

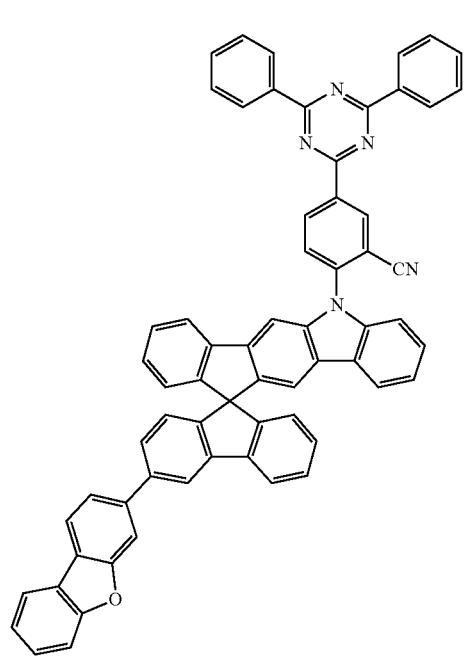

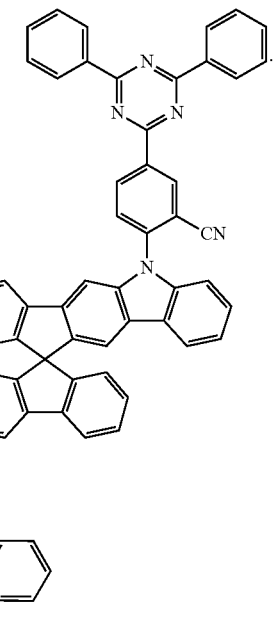

8. The organic light emitting diode of claim 1, wherein a first energy level of a highest occupied molecular orbital (HOMO) of the p-type host is equal to or lower than a second energy level of the HOMO of the n-type host, and a difference between an energy level of a singlet state of the n-type host and an energy level of a triplet state of the n-type host is greater than 0.3eV and smaller than 0.5eV.

9. The organic light emitting diode of claim 1, wherein the p-type host is represented by Formula 1-2.

10. An organic light emitting display device, comprising:
a substrate; and
an organic light emitting diode on the substrate and including a first electrode, a second electrode facing the first electrode, and an emitting material layer including a p-type host, a n-type host and a phosphorescent dopant, the emitting material layer positioned between the first electrode and the second electrode, wherein the n-type host is represented by Formula 2-1 or Formula 2-2:

[Formula 2-1]

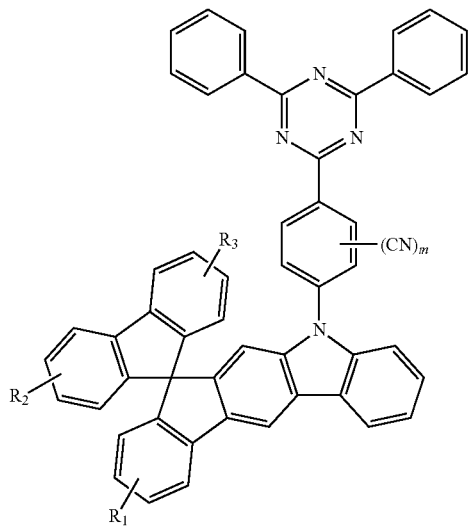

[Formula 2-2]

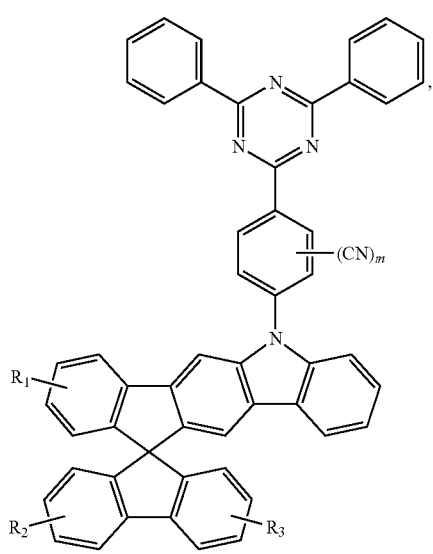

wherein each of $R_1$ to $R_3$ in Formula 2-1 or Formula 2-2 is independently selected from the group consisting of protium, deuterium, C1 to C10 alkyl, C6 to C30 aryl and C5 to C30 heteroaryl, and m is an integer of 0 to 4;

wherein the p-type host is represented by Formula 1-1 or Formula 1-2:

[Formula 1-1]

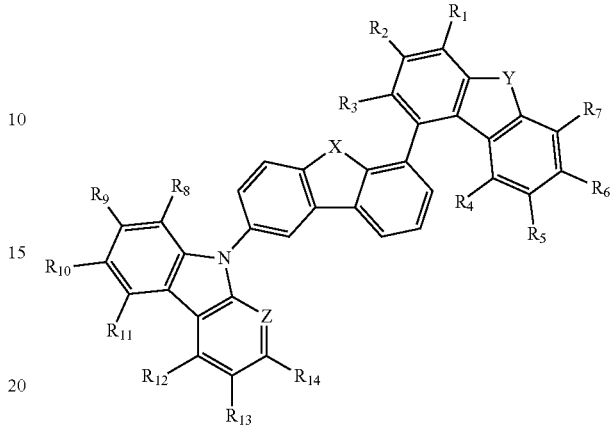

[Formula 1-2]

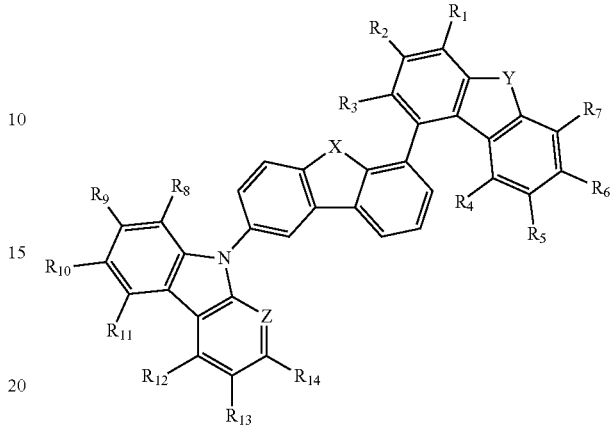

wherein each of X and Y is independently selected from the group consisting of oxygen and sulfur, and Z is N or $CR_{15}$, wherein each of $R_1$ to $R_{15}$ in Formula 1-1 or Formula 1-2 is independently selected from the group consisting of protium, deuterium, alkylsilyl, arylsilyl, C1 to C10 alkyl, C1 to C10 alkoxy, C6 to C30 aryl, C5 to C30 heteroaryl, alkylamine, heteroarylamine and arylamine, or adjacent two of $R_1$ to $R_{15}$ may form a fused ring;

wherein the phosphorescent dopant is represented by Formula 3:

[Formula 3]

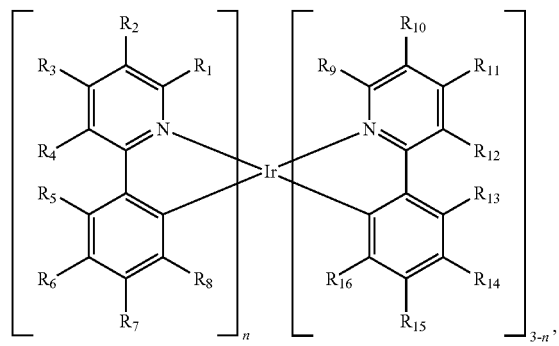

wherein each of $R_1$ to $R_{16}$ in Formula 3 is independently selected from the group consisting of protium, deuterium, halogen, cyano, C1 to C10 alkyl, C1 to C10 alkoxy, C6 to C30 aryl and C5 to C30 heteroaryl, or adjacent two of $R_1$ to $R_{16}$ may form a fused ring, and n is an integer between 1 and 3.

11. The organic light emitting display device of claim 10, wherein a percentage by weight of the n-type host is equal to or greater than a percentage by weight of the p-type host.

12. The organic light emitting display device of claim 10, wherein the phosphorescent dopant is 1% to 5% by weight in the emitting material layer.

13. The organic light emitting display device of claim 10, wherein a first energy level of a lowest unoccupied molecular orbital (LUMO) of the p-type host is higher than a second energy level of the LUMO of the n-type host.

14. The organic light emitting display device of claim 13, wherein a third energy level of the LUMO of the phosphorescent dopant is lower than the first energy level of the LUMO of the p-type host and is higher than the second energy level of the LUMO of the n-type host.

15. The organic light emitting display device of claim 10, wherein a third energy level of the HOMO of the phosphorescent dopant is equal to or higher than the second energy level of the HOMO of the n-type host.

16. The organic light emitting diode of claim 10, wherein the n-type host is a compound selected from:

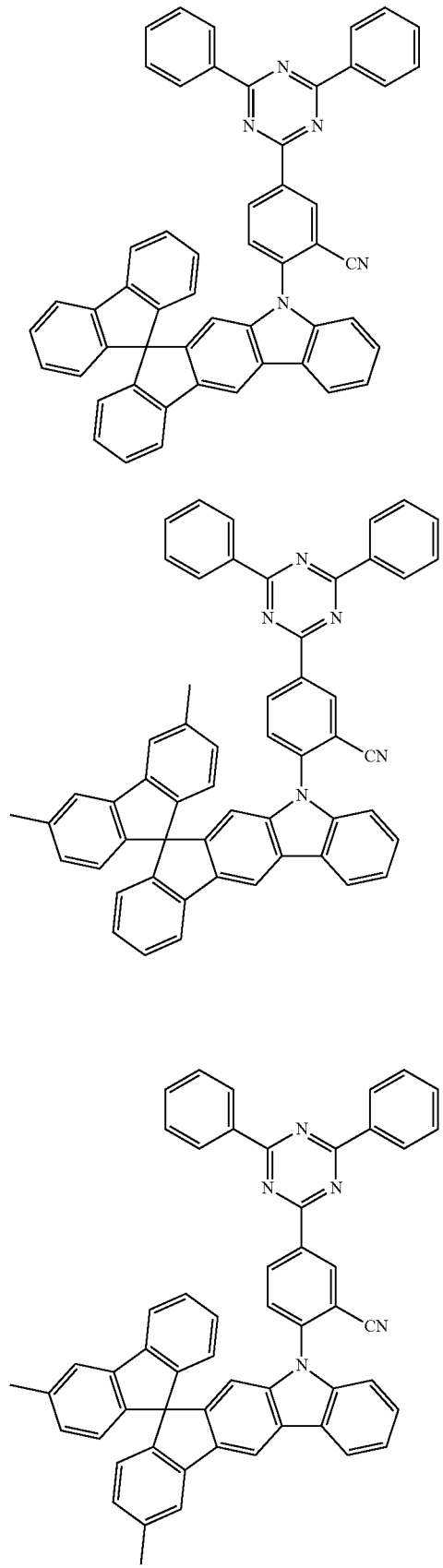

103
-continued
4
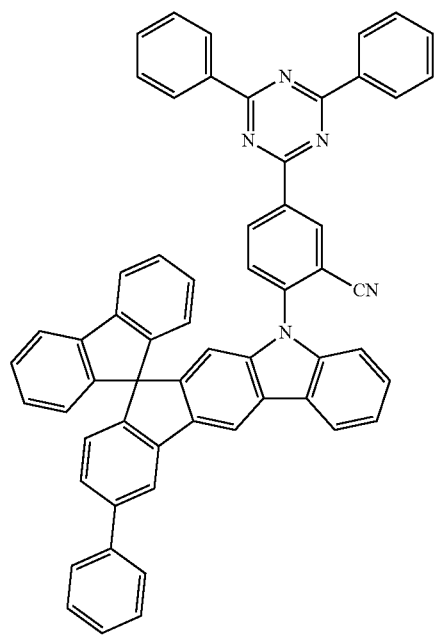
5
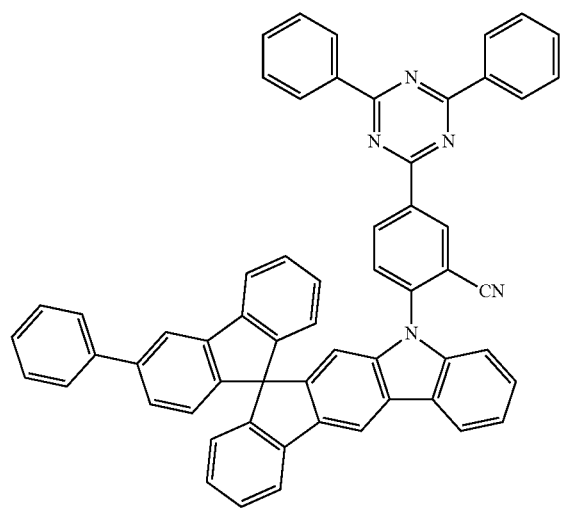
104
-continued
6
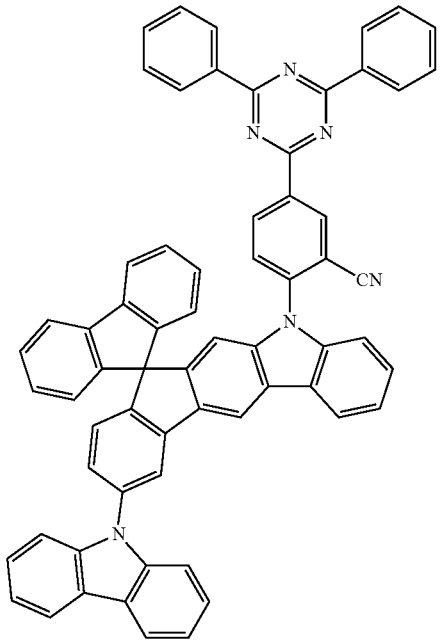
7
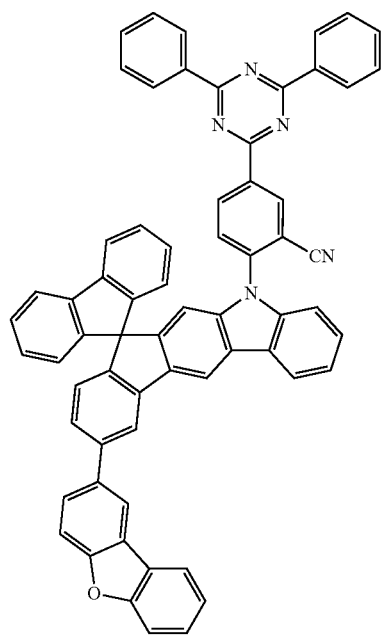

105
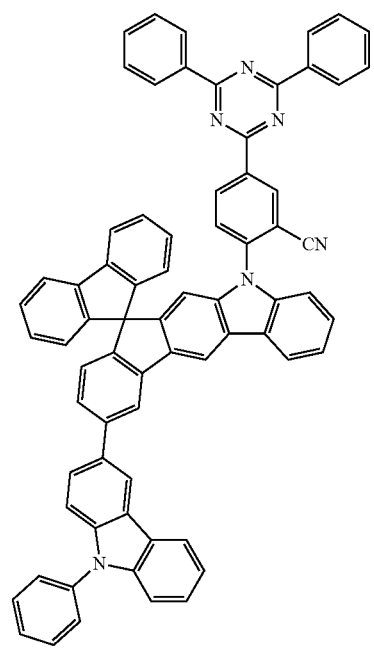
8
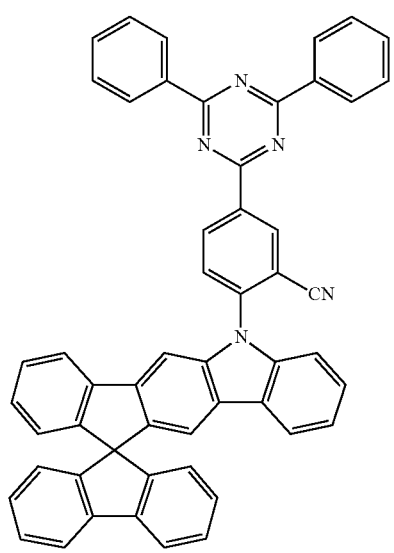
9
106
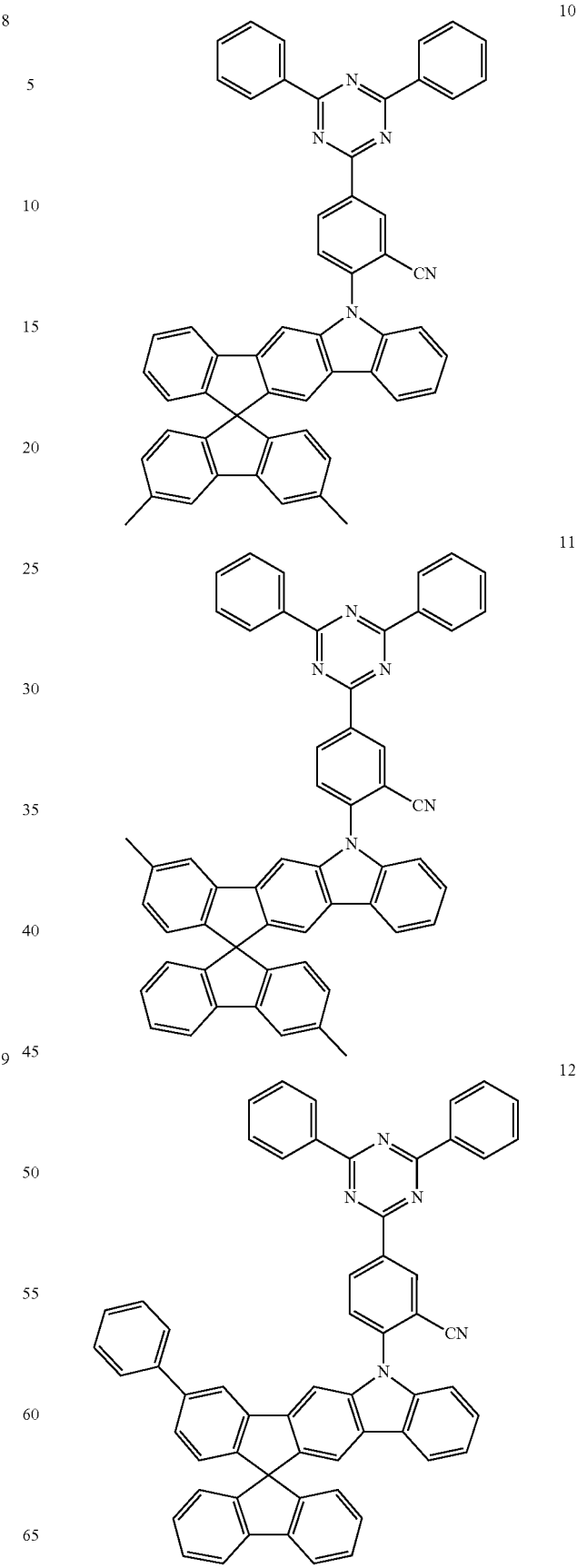
10
11
12

-continued

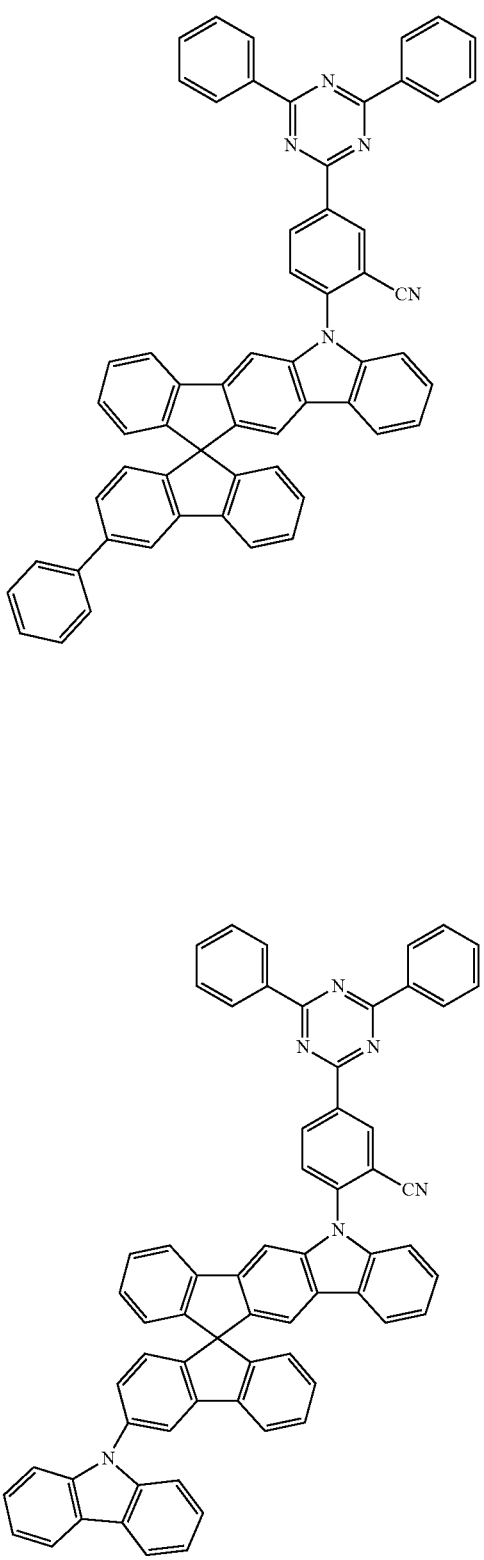

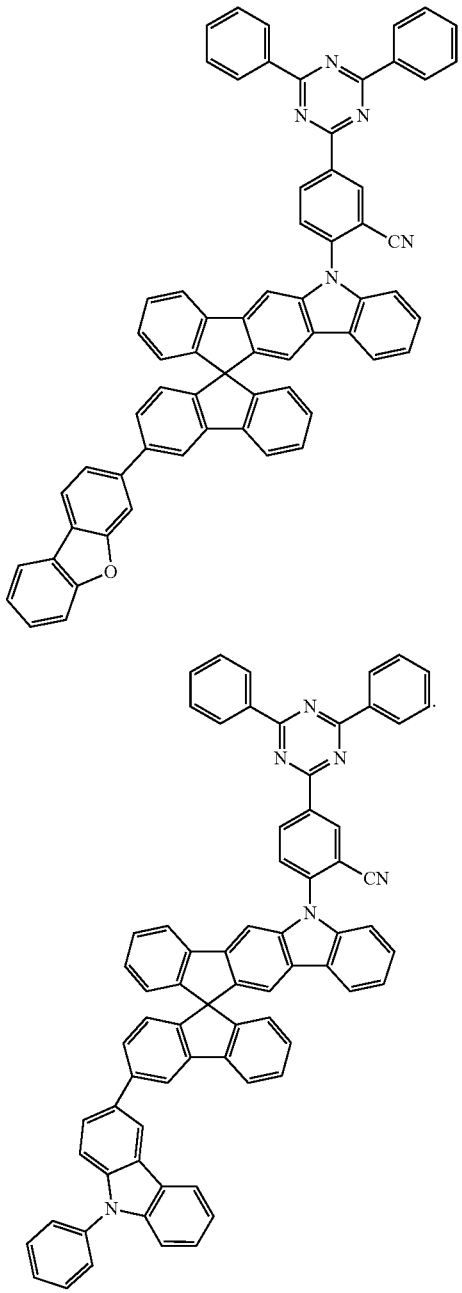

17. The organic light emitting display device of claim 10, wherein a first energy level of a highest occupied molecular orbital (HOMO) of the p-type host is equal to or lower than a second energy level of the HOMO of the n-type host, and a difference between an energy level of a singlet state of the n-type host and an energy level of a triplet state of the n-type host is greater than 0.3 eV and smaller than 0.5 eV.

18. The organic light emitting display device of claim 10, wherein the p-type host is represented by Formula 1-2.

* * * * *